United States Patent
El-Ghoroury et al.

(10) Patent No.: US 8,243,770 B2
(45) Date of Patent: Aug. 14, 2012

(54) QUANTUM PHOTONIC IMAGERS AND METHODS OF FABRICATION THEREOF

(75) Inventors: Hussein S. El-Ghoroury, Carlsbad, CA (US); Robert G. W. Brown, Tustin, CA (US); Dale A. McNeill, Encinitas, CA (US); Huibert DenBoer, Escondido, CA (US); Andrew J. Lanzone, San Marco, CA (US)

(73) Assignee: Ostendo Technologies, Inc., Carlsbad, CA (US)

( * ) Notice: Subject to any disclaimer, the term of this patent is extended or adjusted under 35 U.S.C. 154(b) by 0 days.

(21) Appl. No.: 13/278,533

(22) Filed: Oct. 21, 2011

(65) Prior Publication Data

US 2012/0033113 A1 Feb. 9, 2012

Related U.S. Application Data

(60) Continuation of application No. 12/728,069, filed on Mar. 19, 2010, now Pat. No. 8,049,231, which is a division of application No. 12/486,600, filed on Jun. 17, 2009, now Pat. No. 7,829,902, which is a division of application No. 11/964,642, filed on Dec. 26, 2007, now Pat. No. 7,623,560.

(60) Provisional application No. 60/975,772, filed on Sep. 27, 2007.

(51) Int. Cl.
*H01S 5/00* (2006.01)

(52) U.S. Cl. ........... 372/50.121; 257/9; 257/14; 257/85; 257/90; 257/94; 257/252; 257/253; 257/254; 257/256; 257/257; 257/258; 257/E27.135; 257/E27.138; 345/46; 345/48; 345/83; 353/58; 362/551; 362/552; 362/553; 372/45.01; 372/46.013; 438/22; 438/24; 438/48; 438/223; 438/228

(58) Field of Classification Search ........................ None
See application file for complete search history.

(56) References Cited

U.S. PATENT DOCUMENTS 4,744,088 A 5/1988 Heinen et al.
(Continued)

FOREIGN PATENT DOCUMENTS

EP 1587186 10/2005
(Continued)

OTHER PUBLICATIONS

"International Search Report and Written Opinion of the International Searching Authority Dated Aug. 26, 2009", International Application No. PCT/US2008/076568.
(Continued)

*Primary Examiner* — Charles Garber
*Assistant Examiner* — Yasser Abdelaziez
(74) *Attorney, Agent, or Firm* — Blakely Sokoloff Taylor & Zafman LLP

(57) ABSTRACT

Emissive quantum photonic imagers comprised of a spatial array of digitally addressable multicolor pixels. Each pixel is a vertical stack of multiple semiconductor laser diodes, each of which can generate laser light of a different color. Within each multicolor pixel, the light generated from the stack of diodes is emitted perpendicular to the plane of the imager device via a plurality of vertical waveguides that are coupled to the optical confinement regions of each of the multiple laser diodes comprising the imager device. Each of the laser diodes comprising a single pixel is individually addressable, enabling each pixel to simultaneously emit any combination of the colors associated with the laser diodes at any required on/off duty cycle for each color. Each individual multicolor pixel can simultaneously emit the required colors and brightness values by controlling the on/off duty cycles of their respective laser diodes.

24 Claims, 35 Drawing Sheets

U.S. PATENT DOCUMENTS

| | | | |
|---|---|---|---|
| 4,794,609 | A | 12/1988 | Hara et al. |
| 4,799,229 | A | 1/1989 | Miyazawa et al. |
| 4,817,104 | A | 3/1989 | Taneya et al. |
| 4,947,401 | A | 8/1990 | Hinata et al. |
| 4,976,539 | A | 12/1990 | Carlson et al. |
| 5,323,411 | A | 6/1994 | Shirasaka et al. |
| 5,386,428 | A | 1/1995 | Thornton et al. |
| 5,583,351 | A | 12/1996 | Brown et al. |
| 5,708,674 | A | 1/1998 | Beernink et al. |
| 5,715,264 | A | 2/1998 | Patel et al. |
| 5,809,052 | A | 9/1998 | Seko et al. |
| 5,920,766 | A | 7/1999 | Floyd |
| 6,097,748 | A | 8/2000 | Huang et al. |
| 6,144,685 | A | 11/2000 | Iwasa et al. |
| 6,205,160 | B1 | 3/2001 | Grewell |
| 6,233,265 | B1 | 5/2001 | Bour |
| 6,633,421 | B2 | 10/2003 | Trezza |
| 6,668,003 | B2 | 12/2003 | Ungar |
| 6,741,625 | B2 | 5/2004 | Hirata |
| 6,744,800 | B1 | 6/2004 | Kneissl et al. |
| 6,806,850 | B2 | 10/2004 | Chen |
| 6,853,490 | B2 | 2/2005 | Wang et al. |
| 6,869,185 | B2 | 3/2005 | Kaminsky et al. |
| 6,934,309 | B2 | 8/2005 | Nishikawa et al. |
| 6,939,012 | B2 | 9/2005 | Cok et al. |
| 6,975,366 | B2 | 12/2005 | Flint |
| 7,084,436 | B2 | 8/2006 | DenBaars et al. |
| 7,092,424 | B2 | 8/2006 | Trezza |
| 7,120,182 | B2 | 10/2006 | Chua et al. |
| 7,122,843 | B2 | 10/2006 | Kahen et al. |
| 7,177,335 | B2 | 2/2007 | Kamp et al. |
| 7,359,026 | B2 | 4/2008 | Bullwinkel et al. |
| 7,462,873 | B2 | 12/2008 | Hoshi et al. |
| 7,901,088 | B2 | 3/2011 | Nakamura et al. |
| 2003/0230750 | A1 | 12/2003 | Koyama et al. |
| 2004/0008392 | A1 | 1/2004 | Kappel et al. |
| 2004/0017546 | A1 | 1/2004 | Agostinelli et al. |
| 2004/0105476 | A1 | 6/2004 | Wasserbauer |
| 2004/0207341 | A1 | 10/2004 | Callahan |
| 2004/0207821 | A1 | 10/2004 | Roddy et al. |
| 2004/0212847 | A1 | 10/2004 | Bliley et al. |
| 2005/0046847 | A1 | 3/2005 | Cromwell et al. |
| 2005/0219476 | A1 | 10/2005 | Beeson et al. |
| 2005/0276295 | A1 | 12/2005 | Kahen et al. |
| 2006/0023173 | A1 | 2/2006 | Mooradian et al. |
| 2006/0268241 | A1 | 11/2006 | Watson et al. |
| 2007/0024822 | A1 | 2/2007 | Cortenraad et al. |

FOREIGN PATENT DOCUMENTS

| | | |
|---|---|---|
| JP | 2003-273456 | 9/2003 |

OTHER PUBLICATIONS

"Office Action Dated May 9, 2011, U.S. Appl. No. 12/728,069".

Born, M., et al., "Principles of Optics", *Cambridge University Press*, Chapter 8, pp. 439-443

Goodman, J. W., "Introduction to Fourier Optics", *McGraw-Hill*, Chapter 7, (1996), pp. 172-214.

Jansen, Michael, et al., "Visible Laser and Laser Array Sources for Projection Displays", *Proc. of SPIE* vol. 6135, (2006).

Poynton, Charles, "Digital Video and HDTV: Algorithms and Interfaces", *Morgan Kaufmann Publishers*, (2006), pp. 252-253.

Thelen, A., "Design of Optical Interface Coatings", McGraw-Hill, Chapter 2, pp. 5-26.

250

| Layer | Material | Thickness (nm) | Doping $10^{18}$ cm$^{-3}$ | |
|---|---|---|---|---|
| Contact | GaAs p-doped | 100 | >10 (Mg) | 429 |
| Cladding | $Al_{0.5}In_{0.5}P$ or $(Al_xGa_{1-x})_{0.5}In_{0.5}P$ SL | 120 | 0.5 (Mg) | 428 |
| Electron Blocker | $Ga_{0.5}In_{0.5}P$ or $Al_{0.5}In_{0.5}P$ SL | 25 | >1 (Mg) | 426 |
| Anti-Tunneling | $Al_{0.5}In_{0.5}P$ | 23 | >1 (Mg) | 424 |
| Waveguide | $(Al_{0.65}Ga_{0.35})_{0.5}In_{0.5}P$ | 140 | >1 (Mg) | 422 |
| Barrier | $Al_{0.5}In_{0.5}P$ | 4 | >0.1 (Si or Se) | 418 |
| Quantum Well | $Ga_{0.6}In_{0.4}P$ | 4.8 | >0.01 (Si or Se) | 420 |
| Barrier | $Al_{0.5}In_{0.5}P$ | 4 | >0.1 (Si or Se) | 418 |
| Quantum Well | $Ga_{0.6}In_{0.4}P$ | 4.8 | >0.01 (Si or Se) | 420 |
| Barrier | $Al_{0.5}In_{0.5}P$ | 4 | >0.1 (Si or Se) | 418 |
| Quantum Well | $Ga_{0.6}In_{0.4}P$ | 4.8 | >0.01 (Si or Se) | 420 |
| Barrier | $Al_{0.5}In_{0.5}P$ | 4 | >0.1 (Si or Se) | 418 |
| Waveguide | $(Al_{0.65}Ga_{0.35})_{0.5}In_{0.5}P$ | 100 | >1 (Si or Se) | 416 |
| Cladding | $Al_{0.5}In_{0.5}P$ or $(Al_xGa_{1-x})_{0.5}In_{0.5}P$ SL | 120 | 1.0 (Si or Se) | 414 |
| Etch-Stop | GaAs n-doped | 100 | 8.0 (Si or Se) | 412 |
| Substrate | GaAs n-doped | 2000 | 8.0 (Si or Se) | 410 |

421 (brace grouping barrier/quantum well layers)

| Layer | Material | Thickness (nm) | Doping $10^{18}$ cm$^{-3}$ | |
|---|---|---|---|---|
| Contact | GaN | 100 | 75 (Mg) | 459 |
| Cladding | Al$_{0.08}$Ga$_{0.92}$N/GaN SL | 451 | 75 (Mg) | 458 |
| Waveguide | GaN | 90 | 75 (Mg) | 456 |
| Electron Blocker | Al$_{0.2}$Ga$_{0.8}$N | 20 | 100 (Mg) | 454 |
| Waveguide | GaN | 8.5 | 50 (Mg) | 452 |
| Barrier | In$_{0.04}$Ga$_{0.96}$N | 8.5 | 6.5 (Si) | 438 |
| Quantum Well | In$_{0.535}$Ga$_{0.465}$N | 5.5 | 0.05 (Si) | 450 |
| Barrier | In$_{0.04}$Ga$_{0.96}$N | 8.5 | 6.5 (Si) | 438 |
| Quantum Well | In$_{0.535}$Ga$_{0.465}$N | 5.5 | 0.05 (Si) | 450 |
| Barrier | In$_{0.04}$Ga$_{0.96}$N | 8.5 | 6.5 (Si) | 438 |
| Quantum Well | In$_{0.535}$Ga$_{0.465}$N | 5.5 | 0.05 (Si) | 450 |
| Barrier | In$_{0.04}$Ga$_{0.96}$N | 8.5 | 6.5 (Si) | 438 |
| Waveguide | GaN | 98.5 | 6.5 (Si) | 436 |
| Cladding | Al$_{0.08}$Ga$_{0.92}$N/GaN SL | 451 | 2.0 (Si) | 434 |
| Etch-Stop | In$_{0.05}$Ga$_{0.95}$N | 100 | 6.0 (Si) | 432 |
| Substrate | GaN | 2000 | 6.0 (Si) | 430 |

431 brackets the barrier/quantum well stack

| Layer | Material | Thickness (nm) | Doping $10^{18}$ cm$^{-3}$ | |
|---|---|---|---|---|
| Contact | GaN | 100 | 75 (Mg) | 479 |
| Cladding | Al$_{0.08}$Ga$_{0.92}$N/GaN SL | 451 | 75 (Mg) | 478 |
| Waveguide | GaN | 90 | 75 (Mg) | 476 |
| Electron Blocker | Al$_{0.2}$Ga$_{0.8}$N | 20 | 100 (Mg) | 474 |
| Waveguide | GaN | 8.5 | 50 (Mg) | 472 |
| Barrier | In$_{0.04}$Ga$_{0.96}$N | 8.5 | 6.5 (Si) | 468 |
| Quantum Well | In$_{0.41}$Ga$_{0.59}$N | 5.5 | 0.05 (Si) | 470 |
| Barrier | In$_{0.04}$Ga$_{0.96}$N | 8.5 | 6.5 (Si) | 468 |
| Quantum Well | In$_{0.41}$Ga$_{0.59}$N | 5.5 | 0.05 (Si) | 470 |
| Barrier | In$_{0.04}$Ga$_{0.96}$N | 8.5 | 6.5 (Si) | 468 |
| Quantum Well | In$_{0.41}$Ga$_{0.59}$N | 5.5 | 0.05 (Si) | 470 |
| Barrier | In$_{0.04}$Ga$_{0.96}$N | 8.5 | 6.5 (Si) | 468 |
| Waveguide | GaN | 98.5 | 6.5 (Si) | 466 |
| Cladding | Al$_{0.08}$Ga$_{0.92}$N/GaN SL | 451 | 2.0 (Si) | 464 |
| Etch-Stop | In$_{0.05}$Ga$_{0.95}$N | 100 | 6.0 (Si) | 462 |
| Substrate | GaN | 2000 | 6.0 (Si) | 460 |

461 brackets the Barrier/Quantum Well stack.

| Layer | Material | Thickness (nm) | Doping $10^{18}$ cm$^{-3}$ |
|---|---|---|---|
| Contact | GaN | 100 | 75 (Mg) |
| Cladding | Al$_{0.12}$Ga$_{0.88}$N/GaN SL | 451 | 75 (Mg) |
| Waveguide | GaN | 90 | 75 (Mg) |
| Electron Blocker | Al$_{0.2}$Ga$_{0.8}$N | 20 | 100 (Mg) |
| Waveguide | GaN | 8.5 | 50 (Mg) |
| Barrier | In$_{0.04}$Ga$_{0.96}$N | 8.5 | 6.5 (Si) |
| Quantum Well | In$_{0.08}$Ga$_{0.92}$N | 4.75 | 0.05 (Si) ← 419 |
| Barrier | In$_{0.04}$Ga$_{0.96}$N | 8.5 | 6.5 (Si) |
| Quantum Well | In$_{0.08}$Ga$_{0.92}$N | 4.75 | 0.05 (Si) ← 419 |
| Barrier | In$_{0.04}$Ga$_{0.96}$N | 8.5 | 6.5 (Si) |
| Quantum Well | In$_{0.08}$Ga$_{0.92}$N | 4.75 | 0.05 (Si) ← 419 |
| Barrier | In$_{0.04}$Ga$_{0.96}$N | 8.5 | 6.5 (Si) |
| Waveguide | GaN | 98.5 | 6.5 (Si) |
| Cladding | Al$_{0.12}$Ga$_{0.88}$N/GaN SL | 451 | 2.0 (Si) |
| Etch-Stop | In$_{0.05}$Ga$_{0.95}$N | 100 | 6.0 (Si) |
| Substrate | GaN | 2000 | 6.0 (Si) ← 480 |

421 brackets the MQW region (Barrier through Barrier); 419 marks each Quantum Well.

Fig. 4D

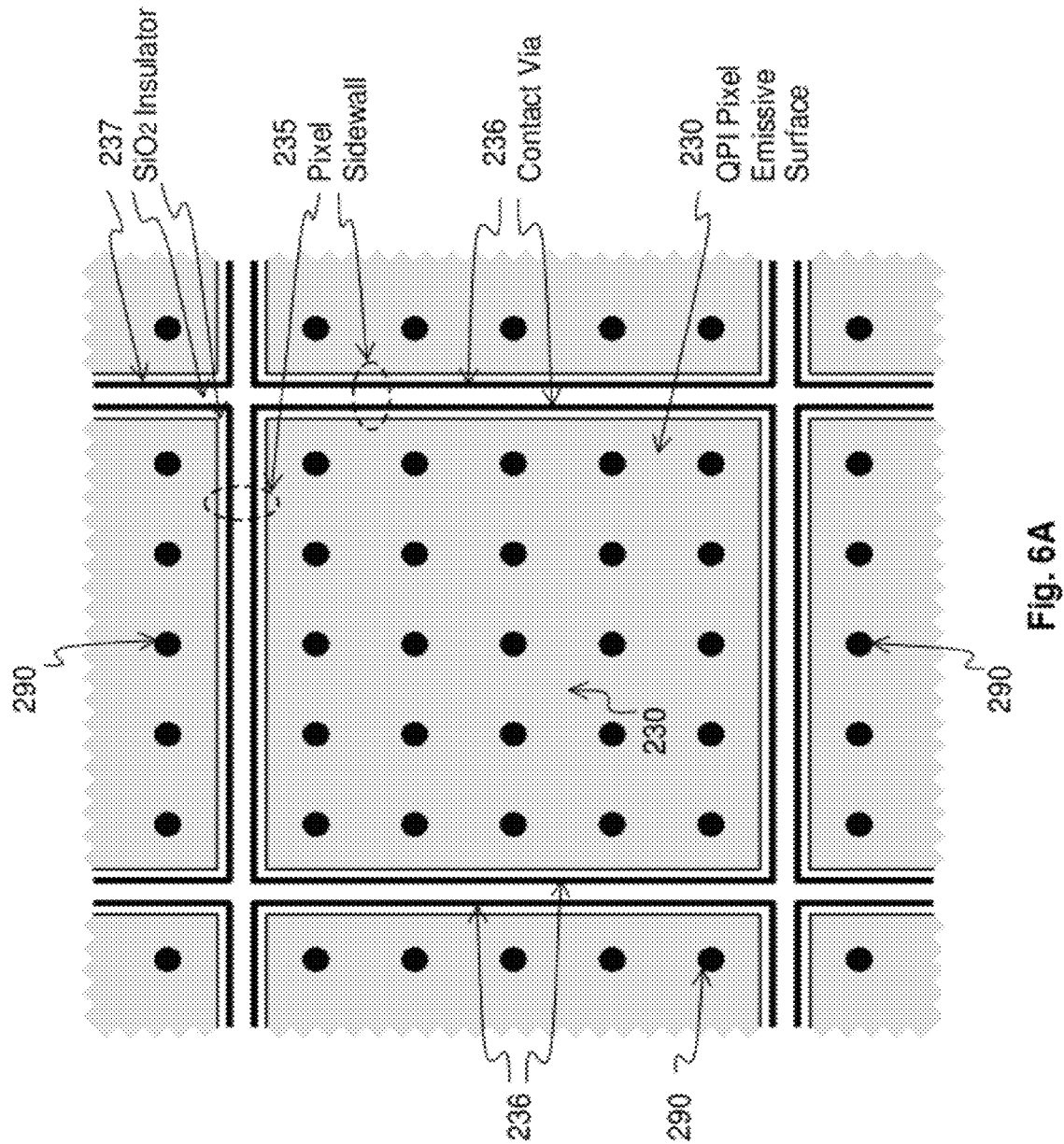

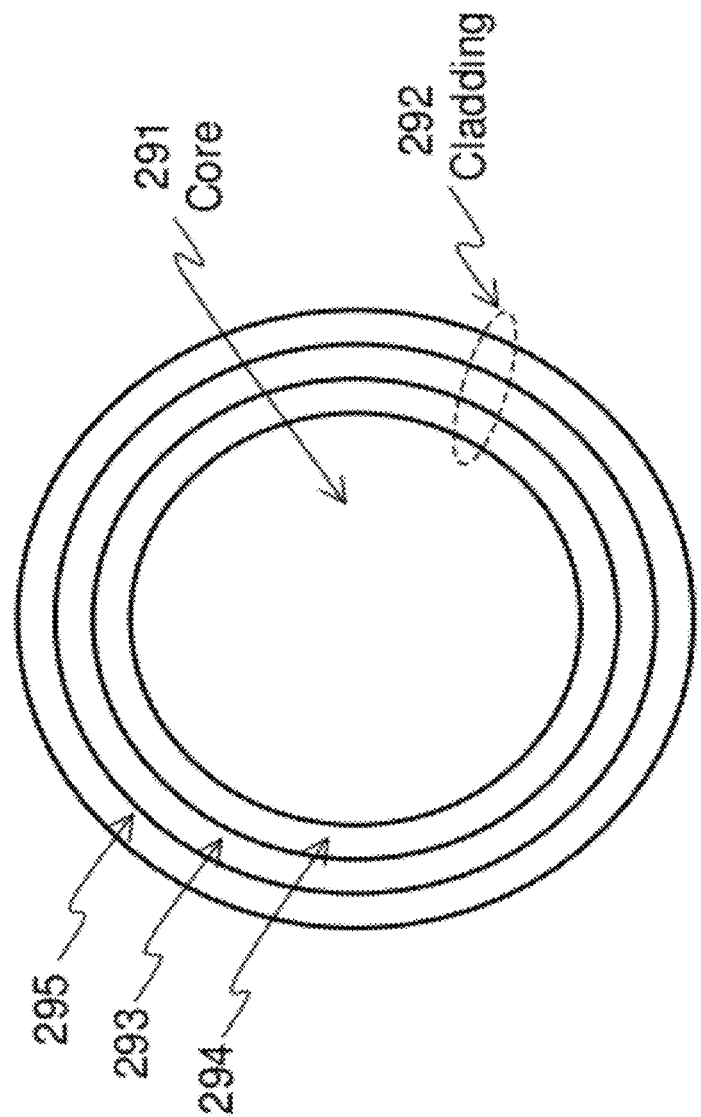

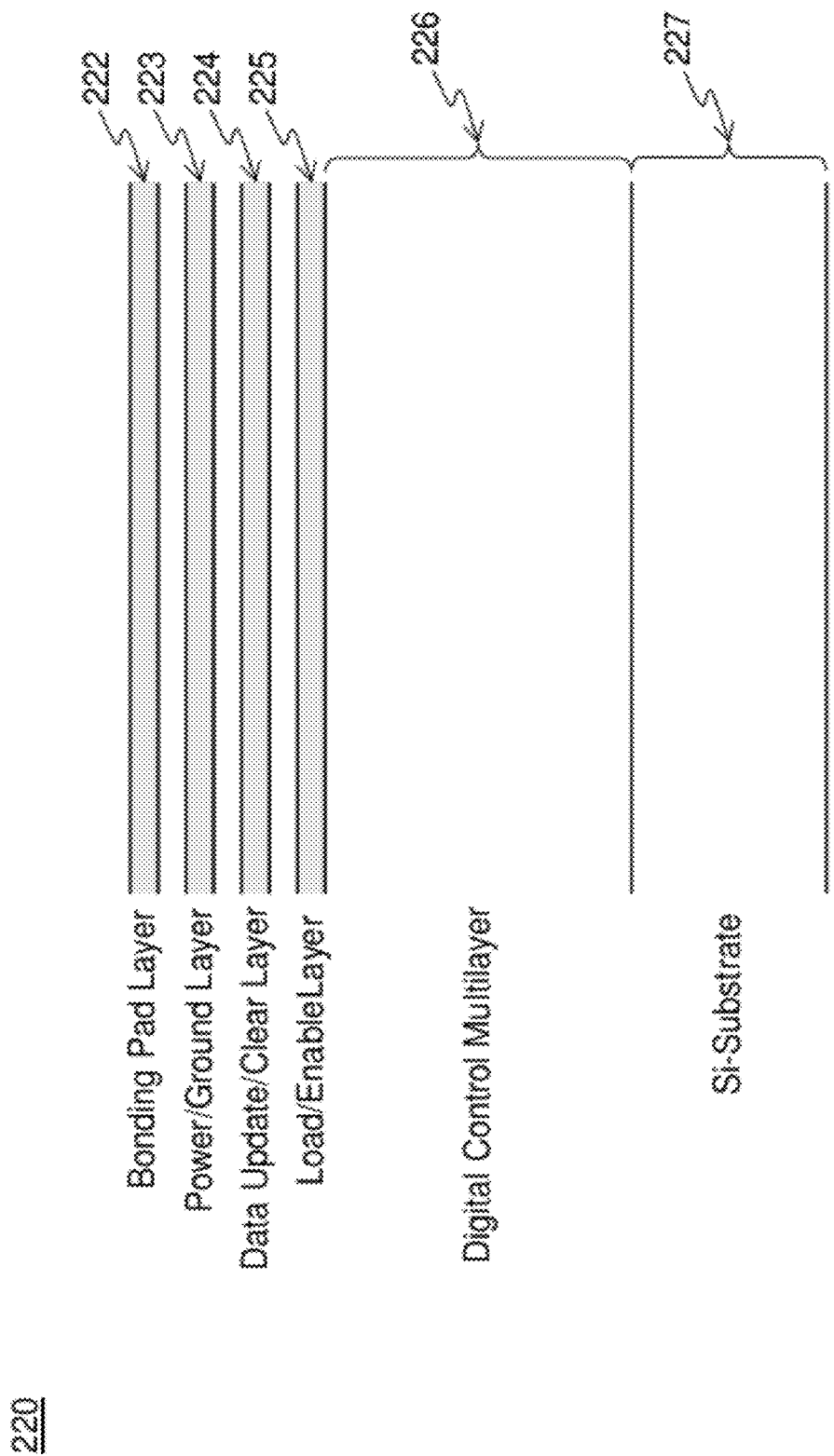

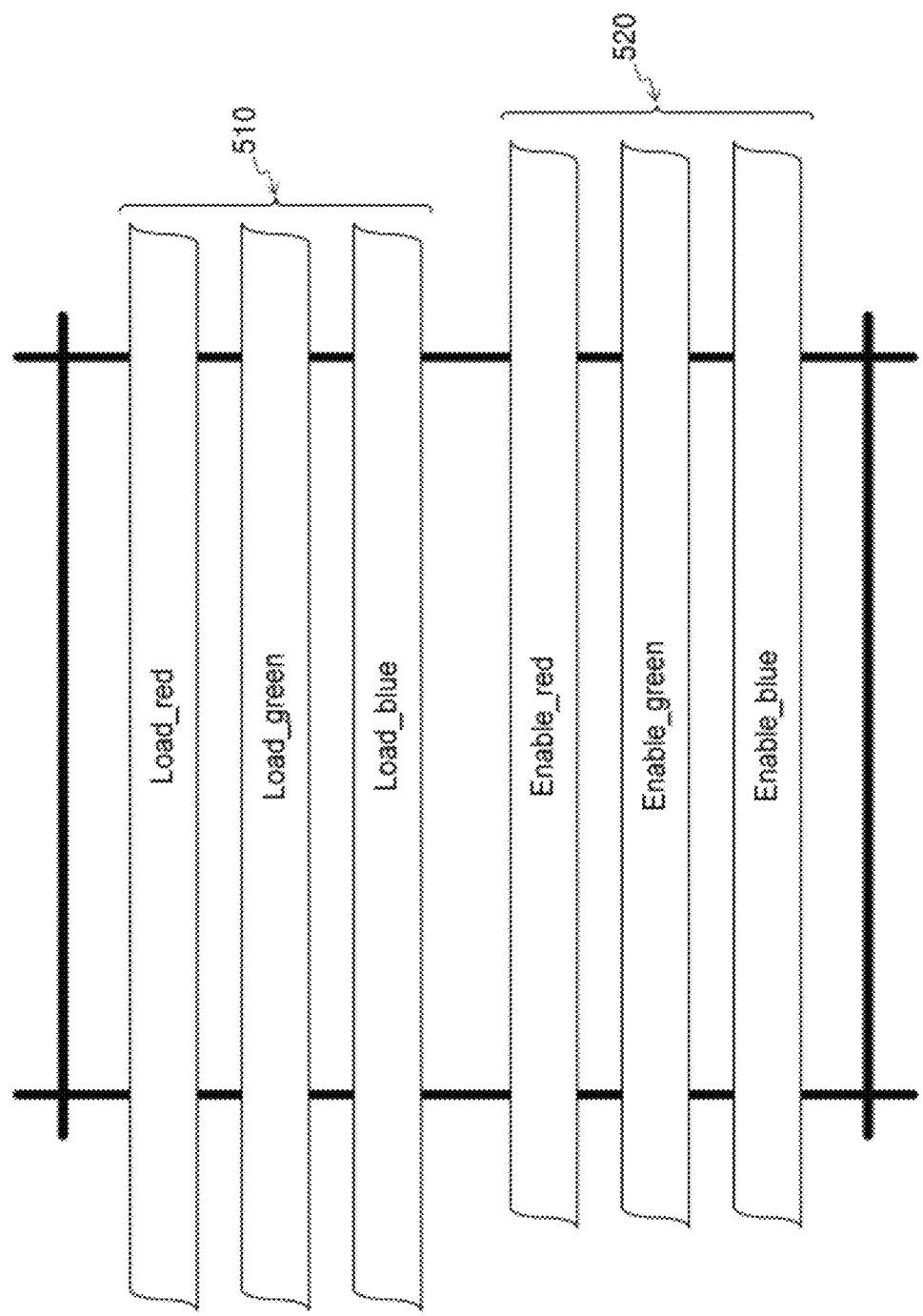

QUANTUM PHOTONIC IMAGERS AND METHODS OF FABRICATION THEREOF

CROSS-REFERENCE TO RELATED APPLICATION

This application is a continuation of U.S. patent application Ser. No. 12/728,069 filed Mar. 19, 2010, which is a divisional of U.S. patent application Ser. No. 12/486,600 filed Jun. 17, 2009, now U.S. Pat. No. 7,829,902, which is a divisional of U.S. patent application Ser. No. 11/964,642 filed Dec. 26, 2007, now U.S. Pat. No. 7,623,560, which claims the benefit of U.S. Provisional Patent Application Ser. No. 60/975,772 filed Sep. 27, 2007.

BACKGROUND OF THE INVENTION

1. Field of the Invention

The present invention relates to emissive imager devices comprising a monolithic semiconductor arrays of multicolor laser emitters that can be used as an image sources in digital projection systems.

2. Prior Art

The advent of digital display technology is causing a phenomenal demand for digital displays. Several display technologies are poised to address this demand; including Plasma Display Panel (PDP), Liquid Crystal Display (LCD), and imager based projection displays that use micro-mirrors, a liquid crystal on silicon (LCOS) device or a high temperature poly-silicon (HTPS) device (Ref. [33]). Of particular interest to the field of this invention are projection based displays that use imager devices, such as those mentioned, as an image forming device. These types of displays are facing strong competition from PDP and LCD displays and as such are in critical need for effective means to improve their performance while significantly reducing their cost. The primary performance and cost driver in these types of displays are the imagers used, such as micro-mirrors, LCOS and HTPS devices. Being passive imagers, such devices require complex illumination optics and end up wasting a significant part of the generated light, which degrades the performance and increases the cost of the display system. The objective of this invention is to overcome the drawbacks of such imager devices by introducing an emissive imager device which comprises an array of multicolor laser emitters that can be used as an image source in digital projection systems.

FIGS. 1A and 1B are block diagram illustrations of typical projector architectures 100 used in projection display systems that use a passive imagers, such as those that use reflective imagers including micro-mirrors or LCOS imager devices (FIG. 1A) and those that use a transmissive imager, such as HTPS imager devices (FIG. 1B); respectively. In general, the projector 100 of a typical projection display system of FIG. 1A is comprised of an imager 110, illuminated by the illumination optics 120 which couples the light generated by the light source 130 onto the surface of the imager 120. The light source 130 can either be a lamp that generates white light or a semiconductor light source, such as light emitting diodes (LED) or laser diodes, that can generate Red (R), Green (G) or Blue (B) light.

In the case of the projector 100 that uses a reflective imager illustrated in FIG. 1A, when a lamp is used as a light source, a color wheel incorporating R, G and B filters is added between the illumination optics and the imager to modulate the required color. When a semiconductor light source is used in conjunction with a reflective imager, the color is modulated by turning on the semiconductor light source device having the required color, being either R, G or B.

In the case of a projector 100 that uses the transmissive imager illustrated in FIG. 1B, when a lamp is used as a light source, the illumination optics 120 includes optical means for splitting the white-light generated by the lamp into R, G and B light patches that illuminate the backsides of three HTPS imager devices and a dichroic prisms assembly is added to combine the modulated R, G and B light and couple it on the projection optics 140.

The projection optics 140 is optically coupled to the surface of the imager 110 and the drive electronics 150 is electrically coupled to the imager 110. The optical engine generates the image to be projected by modulating the intensity of the light generated by the light source 130, using imager 110, with the pixel grayscale input provided as image data to the drive electronics 150. When a reflective imager (FIG. 1A) such as micro-mirror or LCOS imager device is used, the drive electronics provides the pixel grayscale data to the imager 110 and synchronizes its operation either with the sequential order of the R, G and B segments of the color wheel, when a white light lamp is used as a light source, or with the sequential order in which the R, G or B semiconductor light source is turned on. When a transmissive imager such as the HTPS imager device is used, the drive electronics provides the pixel grayscale data to the imager 110 and synchronizes the operation of each of the R, G and B HTPS imager devices in order to modulate the desired color intensity for each pixel.

Typically the losses associated with the coupling of light onto the surface of imager 110 are significant because they include the intrinsic losses associated with the imager 110 itself, such as the device reflectivity or the transmissivity values, plus the losses associated with collecting the light from the light source 130, collimating, filtering and relaying it to the surface of the imager 110. Collectively these losses can add up to nearly 90%; meaning that almost 90% of the light generated by the light source 130 would be lost.

In addition, in the case of a reflective imager 110 such as micro-mirror or LCOS imager devices, the imager 110 being comprised of a spatial array of reflective pixels, sequentially modulates the respective colors of the light coupled onto its pixelated reflective surface by changing the reflective on/off state of each individual pixel during the time period when a specific color is illuminated. In effect, a typical prior art reflective imager can only modulate the intensity of the light coupled onto its pixelated reflective surface, a limitation which causes a great deal of inefficiency in utilizing the luminous flux generated by the light source 130, introduces artifacts on the generated image, adds complexities and cost to the overall display system and introduces yet another source of inefficiency in utilizing the light generated by the light source 130. Furthermore, both the reflective as well as the transmissive type imagers suffer from an effect known as "photonic leakage" which causes light to leak onto the off-state pixels, which significantly limits the contrast and black levels that can be achieved by these types of imagers.

As stated earlier, the objective of this invention is to overcome the drawbacks of prior art imagers by introducing an emissive imager device comprising an array of multicolor laser emitters that can be used as an image source in digital projection systems. Although semiconductor laser diodes have recently become an alternative light source 130 (Ref. [1]-[4]) for use in projectors 100 of FIG. 1A to illuminate reflective imagers 110 such as the micro-mirror imager device, the use of semiconductor laser diodes as a light source does not help in overcoming any of the drawbacks of prior art imagers discussed above. In addition numerous prior art exists that describes projection displays that uses a scanned laser light beam to generate a projection pixel (Ref. [5]-[6]).

Prior art Ref. [7] describes a laser image projector comprising a two dimensional array of individually addressable laser pixels, each being an organic vertical cavity laser pumped by an organic light emitting diode (OLED). The pixel brightness of the laser image projector described in prior art Ref. [7] would be a small fraction of that provided by the pumping light source, which, being an OLED based light source, would not likely to offer an ample amount of light, rendering the brightness generated by the laser projector of prior art Ref. [7] hardly sufficient to be of practical use in most projection display applications.

Although there exist numerous prior art references that describe laser arrays (Ref. [8]-[30]), no prior art was found that teaches the use of multicolor laser emitters as pixels in an imager device. As it will become apparent in the following detailed description, this invention relates a separately addressable array of multicolor laser pixels formed by optically and electrically separating a monolithic layered stack of laser emitting semiconductor structures. With regard to creating an optically and electrically separated (isolated) semiconductor laser emitter array, Ref. [10] teaches methods for forming a single wavelength laser semiconductor structure with isolation regions (i.e. physical barriers) between the light emitting regions formed by either removing material between the light emitting regions or by passivating the regions between the light emitters of the semiconductor structure. However, the methods described in Ref. [10] could only be used to create a one-dimensional linear array of separately addressable single wavelength laser emitters within the range of wavelength from 700 to 800 nm.

With regard to creating an array of separately addressable multicolor laser emitters, Ref [21] describes an edge emitting array of red and blue laser structures. Although Ref. [21] deals with multicolor laser structure, it is only related to a two-color one-dimensional linear array of edge emitting laser structures.

Although Ref. [22] describes a display system that uses an array of vertical cavity surface emitting laser (VCSEL) diodes, because of the inherent size of the VCSEL diodes described in Ref. [22], the approach described would tend to produce substantially large pixels size because of the inherent size of the multiple color of VCSEL diodes it uses which are arranged side-by-side in the same plane to form a pixel array, rendering it not usable as an imager device.

Given the aforementioned drawbacks of currently available imager devices, an imager that overcomes such weaknesses is certain to have a significant commercial value. It is therefore the objective of this invention to provide an emissive imager device comprising a monolithic semiconductor 2-dimensional array of multicolor laser emitters that can be used as an image source in digital projection systems. Additional objectives and advantages of this invention will become apparent from the following detailed description of a preferred embodiments thereof that proceeds with reference to the accompanying drawings.

REFERENCES

U.S. Patent Documents

[1] U.S. Pat. No. 6,975,366 B2, Flint, Dec. 13, 2005
[2] US Patent Application No. 2004/0008392 A1, Kappel et al, Jan. 15, 2004
[3] US Patent Application No. 2006/0268241 A1, Watson et al, Nov. 30, 2006
[4] US Patent Application No. 2006/0023173 A1, Mooradian et al, Feb. 2, 2006
[5] U.S. Pat. No. 6,869,185 B2, Kaminsky et al, Mar. 22, 2005
[6] U.S. Pat. No. 6,853,490 B2, Wang et al, Mar. 8, 2005
[7] U.S. Pat. No. 6,939,012 B2, Cok et al, Sep. 6 2005
[8] U.S. Pat. No. 7,177,335 B2, Kamp et al, Feb. 13, 2007
[9] U.S. Pat. No. 7,122,843 B2, Kahen et al, Oct. 17, 2006
[10] U.S. Pat. No. 7,120,182 B2, Chua et al, Oct. 10, 2006
[11] U.S. Pat. No. 7,092,424 B2, Trezza et al, Aug. 15, 2006
[12] U.S. Pat. No. 6,934,309 B2, Nishikawa et al, Aug. 23, 2005
[13] U.S. Pat. No. 6,853,490 B2, Wang et al, Feb. 8, 2005
[14] U.S. Pat. No. 6,744,800 B2, Kneissl et al, Jun. 1, 2004
[15] U.S. Pat. No. 6,741,625 B2, Hirata et al, May 25, 2004
[16] U.S. Pat. No. 6,668,003 B2, Ungar et al, Dec. 23, 2003
[17] U.S. Pat. No. 6,633,421 B2, Trezza et al, Oct. 14, 2003
[18] U.S. Pat. No. 6,233,265 B1, Bour et al, May 15, 2001
[19] U.S. Pat. No. 6,205,160 B2, Grewell et al, Mar. 20, 2001
[20] U.S. Pat. No. 6,144,685, Iwasa et al, Nov. 7, 2000
[21] U.S. Pat. No. 5,920,766, Floyd, Jul. 6, 1999
[22] U.S. Pat. No. 5,583,351, Brown et al, Dec. 10, 1996
[23] U.S. Pat. No. 5,809,052, Seko et al, Sep. 15, 1998
[24] U.S. Pat. No. 5,715,264, Patel et al, Feb. 3, 1998
[25] U.S. Pat. No. 5,708,674, Beernink et al, Jan. 13, 1998
[26] U.S. Pat. No. 5,386,428, Thornton et al, Jan. 31, 1995
[27] U.S. Pat. No. 5,323,411, Shirasoka et al, Jun. 21, 1994
[28] U.S. Pat. No. 4,976,539, Carlson et al, Dec. 11, 1990
[29] U.S. Pat. No. 4,947,401, Hinata et al, Aug. 7, 1990
[30] U.S. Pat. No. 4,817,104, Yaneya et al, Mar. 28, 1989
[31] U.S. Pat. No. 4,799,229, Miyazawa et al, Jun. 17, 1989
[32] U.S. Pat. No. 4,794,609, Hara et al, Dec. 27, 1988
[33] U.S. Pat. No. 4,744,088, Heinen et al, May 10, 1988

Other Documents

[34] J. W. Goodman, Introduction to Fourier Optics, McGraw-Hill, 1996, Chapter 7, pp. 172-214
[35] Jansen et al, "Visible Laser and Laser Array Sources for Projection Displays", Proc. of SPIE Vol. 6135, 2006
[36] Poynton, Charles, "Digital Video and HDTV: Algorithms and Interfaces", San Francisco: Morgan Kaufmann, 2003. pp. 252-253
[37] Chow et al, "Semiconductor-Laser Physics", Springer 1997
[38] Robert W. Boyd, "Nonlinear Optics—Second Edition", Academic Press 2003
[39] M. Elexe et al, "Wafer Bonding: Application and Technology", Springer 2004
[40] A. Thelen, "Design of Optical Interface Coatings", McGraw-Hill, Chapter 2, pp. 5-24
[41] M. Born et al, "Principles of Optics", Cambridge University Press, Chapter 8, pp. 439-443

BRIEF DESCRIPTION OF THE DRAWINGS

The invention is illustrated by way of example, and not by way of limitation, in the figures of the accompanying drawings in which like reference numerals refer to similar elements.

FIG. 4A illustrates a detailed cross-sectional view of the red laser diode structure of the Quantum Photonic imager device of this invention.

FIG. 4B illustrates a detailed cross-sectional view of the green laser diode structure of the Quantum Photonic imager device of this invention.

FIG. 4C illustrates a detailed cross-sectional view of the blue laser diode structure of the Quantum Photonic imager device of this invention.

FIG. 4D illustrates a detailed cross-sectional view of an alternative red laser diode structure of the Quantum Photonic imager device of this invention.

FIG. 6A illustrates a horizontal cross-sectional view of the multicolor pixel sidewall.

FIG. 8B illustrates a horizontal cross-sectional view of the multicolor pixel output waveguide.

FIG. 10A illustrates the a vertical cross-section of the digital semiconductor structure of the Quantum Photonic Imager device of this invention.

FIG. 10E illustrates the layout of the metal layers used for routing data and control signals within the Quantum Photonic Imager device of this invention.

DETAILED DESCRIPTION OF THE PREFERRED EMBODIMENTS

References in the following detailed description of the present invention to "one embodiment" or "an embodiment" means that a particular feature, structure, or characteristics described in connection with the embodiment is included in at least one embodiment of the invention. The appearances of the phrase "in one embodiment" in various places in this detailed description are not necessarily all referring to the same embodiment.

An emissive imager is described herein. In the following description, for the purpose of explanation, numerous specific details are set forth in order to provide a thorough understanding of the invention. It will be apparent, however, to one skilled in the art that the invention can be practiced with different specific details. In other instance, structures and devices are shown in block diagram form in order to avoid obscuring the invention.

QPI Architecture

The emissive multicolor digital image forming device described herein, referred to as "Quantum Photonic imager" (QPI), is a semiconductor device comprising a monolithic array of multicolor laser emitters. The Quantum Photonic imager of this invention is comprised of a plurality of emissive multicolor pixels whereby in one embodiment, each pixel comprises a stack of red (R), green (G) and blue (B) light emitting laser diodes. The multicolor laser light of each said pixel is emitted perpendicular to the surface of the Quantum Photonic imager device via a plurality of vertical waveguides that are optically coupled to the optical confinement region of each the R, G and B laser diodes comprising each pixel. The plurality of pixels that comprise the Quantum Photonic imager devices are optically and electrically separated by sidewalls of insulating semiconductor material embedded in which are the electrical interconnects (vias) that are used to route electrical current to the constituent laser diodes of each pixel. Each of the plurality of pixels that comprise the Quantum Photonic imager devices is electrically coupled to a control logic circuit that routes (enable) the electric current signal to each of its constituent red (R), green (G) and blue (B) laser diodes. The drive logic circuits associated with the plurality of pixels form a drive logic array that is bonded together with the stack of red (R), green (G) and blue (B) laser diodes to form a monolithic array of multicolor laser pixels and drive circuitry.

Figure 1A:
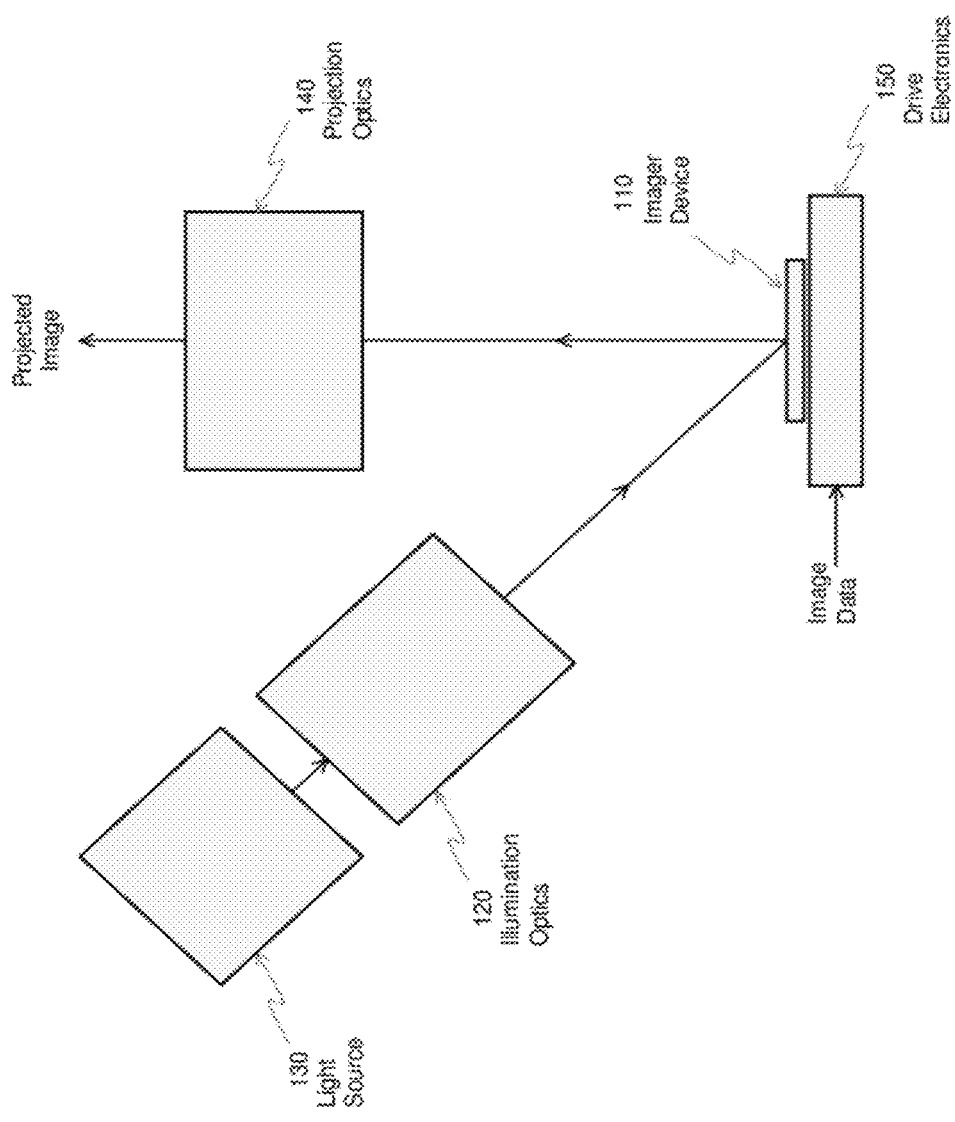
FIGS. 1A and 1B illustrate the projection display architectural context of the prior art imager imagers.
Figure 1B:
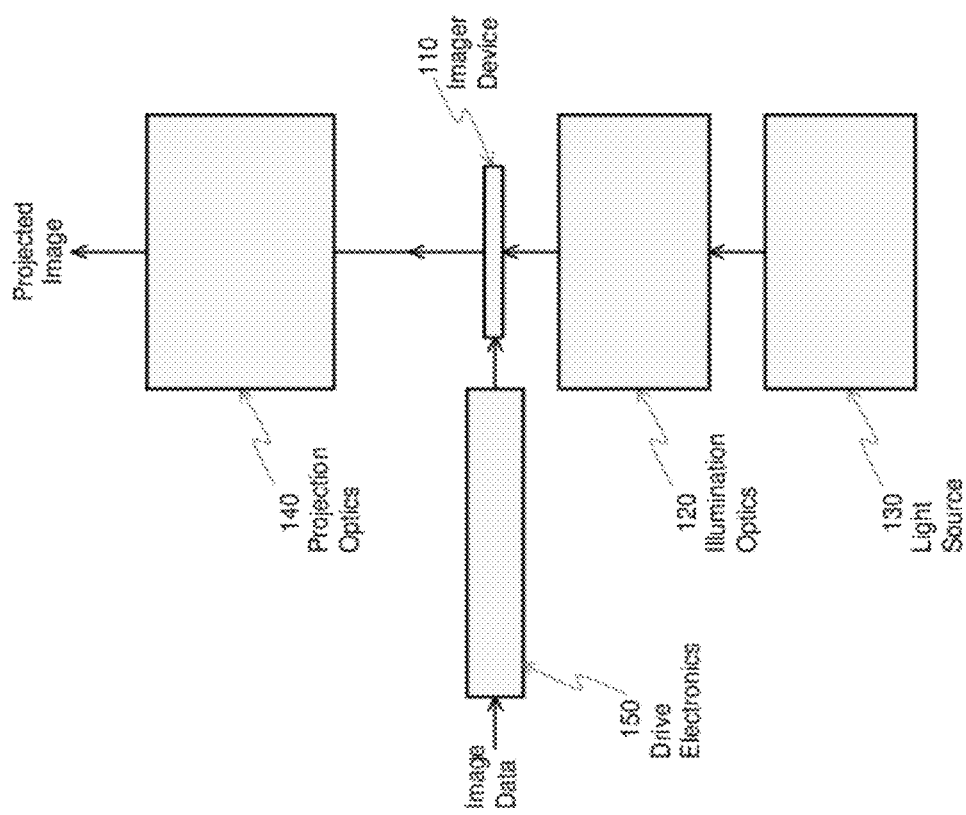
Figure 2A:
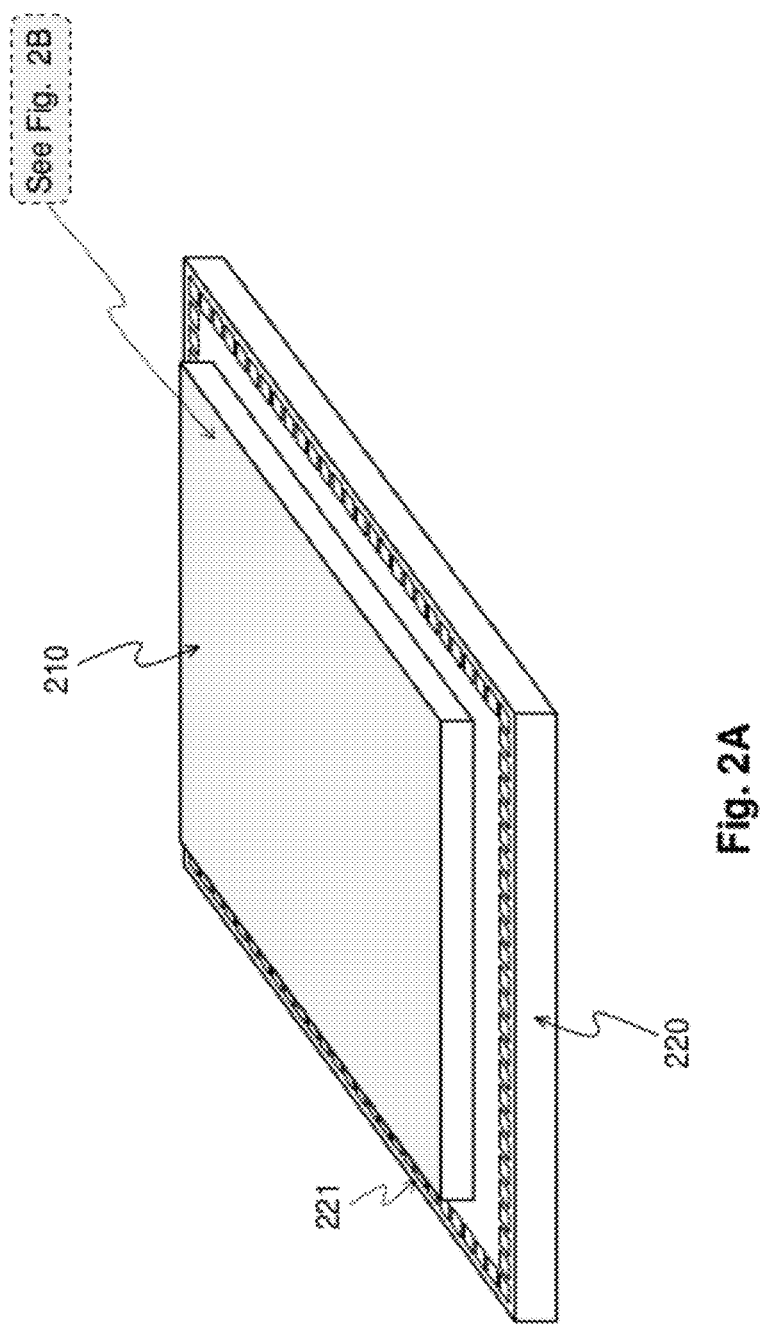
FIG. 2A illustrates an isometric view of the Quantum Photonic imager device of this invention.
Figure 2B:
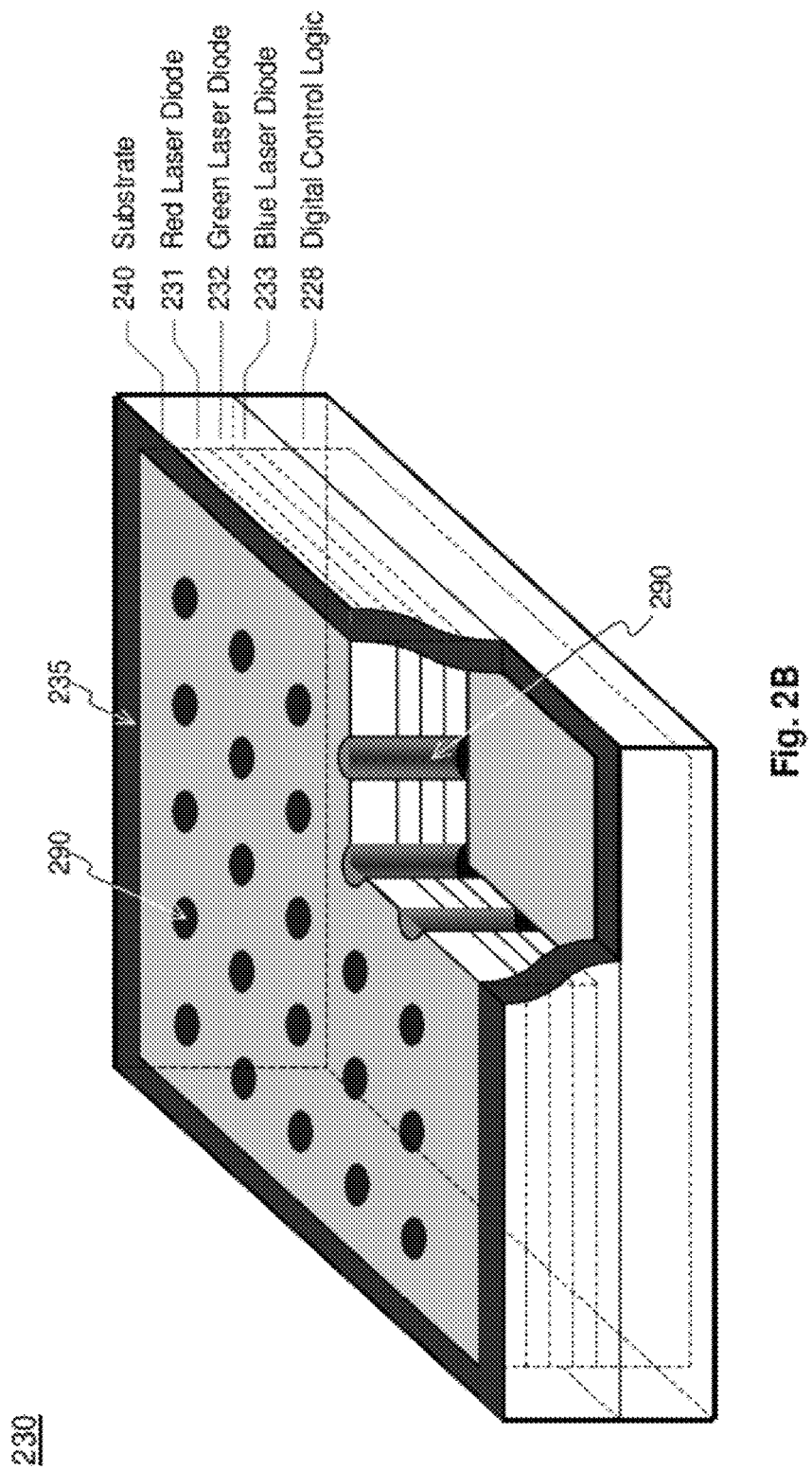
FIG. 2B illustrates an isometric view of the multicolor pixel comprising the emissive surface of the Quantum Photonic imager device of this invention.
Figure 2C:
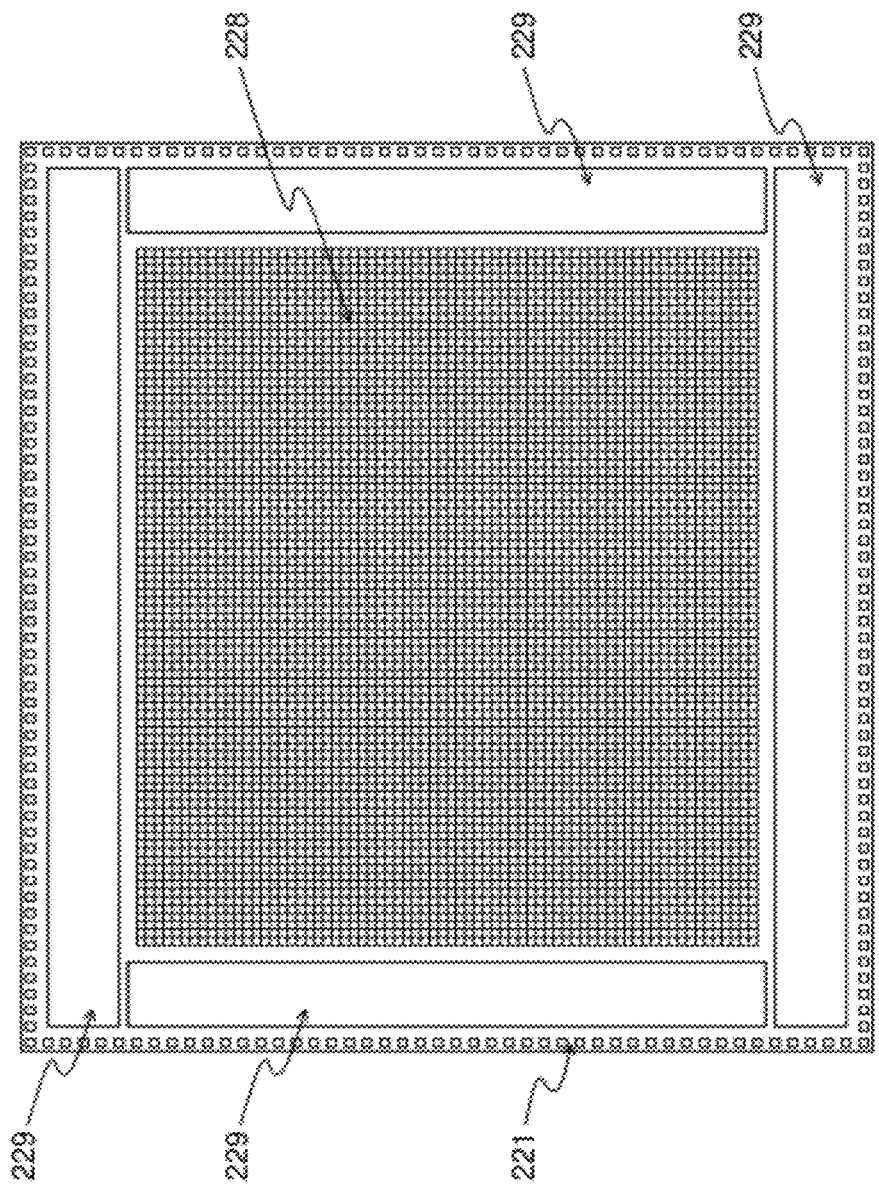
FIG. 2C illustrates a top view of the Quantum Photonic imager device of this invention.

FIGS. 2A, 2B and 2C illustrate a preferred embodiment of the Quantum Photonic Imager device 200 of this invention. FIG. 2A illustrates an isometric view of the Quantum Photonic imager device 200, while FIG. 2B illustrates and isometric view of one of its constituent pixels 230 and FIG. 2C is a top view illustration that shows the array of pixels 230 comprising the Quantum Photonic imager device 200 and the digital control logic 229 positioned at the periphery of the pixel array.

As illustrated in FIG. 2A, the Quantum Photonic imager device 200 would be comprised of two semiconductor structures; namely the photonic semiconductor structure 210 and the digital semiconductor structure 220. The semiconductor structures 210 and 220 are bonded together either through die-level bonding or wafer-level bonding to form the Quantum Photonic imager device 200 illustrated in FIG. 2A. Each of the two semiconductor structures comprising the Quantum Photonic imager device 200 is further comprised of multiple semiconductor layers. As illustrated in FIG. 2A, the digital semiconductor structure 220 of the Quantum Photonic imager device 200 would typically be larger in surface area than the photonic semiconductor structure 210 to allow for the placement of the digital control logic 229 and the bonding pads 221, through which the power and image data signals are provided to the device, to be accessible at the topside of the device. The photonic semiconductor structure 210 is comprised of a plurality of emissive multicolor pixels and digital semiconductor structure 220 is comprised of the digital drive logic circuits that provide power and control signals to the photonic semiconductor structure 210.

FIG. 2B is a cutaway isometric illustration of the semiconductor structure of one of the pixels 230 comprising the Quantum Photonic imager device 200 of one embodiment of this invention. As illustrated in FIG. 2B, each of the pixels 230 would have a sidewall 235 that provides optical and electrical separation between adjacent pixels. As will be explained in more detail in subsequent paragraphs, the electrical interconnects required to supply power signals to the photonic semiconductor structure 210 portion of the pixels 230 would be embedded within the pixel sidewalls 235.

As illustrated in the pixel isometric cutaway view of FIG. 2B, the portion of the photonic semiconductor structure 210 within the interior of the pixels 230 would be comprised of the semiconductor substrate 240, a red (R) laser diode multilayer 231, a green (G) laser diode multilayer 232 and a blue (B) laser diode multilayer 233 stacked vertically. The laser light of each of the pixels 230 comprising the Quantum Photonic imager device 200 would be emitted in a direction that is perpendicular to the plane of the device top surface, hereinafter referred to as the vertical direction, through the plurality of vertical waveguides 290, each of which is optically coupled to the optical resonator (or the optical confinement region) of each of the laser diodes 231, 232 and 233. The plurality of vertical waveguides 290 would form a laser emitter array that would define the laser light emission cross section (or optical characteristics) of each of the pixels 230 comprising the Quantum Photonic imager device 200 of this invention. The novel approach of this invention of vertically stacking the laser diodes 231, 232 and 233 and optically coupling the vertical waveguides 290 to the optical resonator (or the optical confinement region) of each of the stacked laser diodes 231, 232 and 233 would enable multicolor laser light generated by these laser diodes to be emitted through the array of vertical waveguides 290, thus making the pixels 230 comprising the Quantum Photonic imager device 200 of this invention become emissive multicolor laser pixels.

FIG. 2C is a top view illustration of the Quantum Photonic imager device 200 showing the top of the photonic semiconductor structure 210 comprising the 2-dimensional array of multicolor pixels 230 that forms the emissive surface of the device and the top of the digital semiconductor structure 220 extending beyond that of the photonic semiconductor structure 210 to allow for the area required for the device bonding pads 221 and the layout area for the device control logic 229. The typical size of the pixels 230 of the preferred embodiment of the Quantum Photonic Imager 200 of this invention would be in the range of 10×10 micron, making the emissive surface of a Quantum Photonic imager device 200 that provides a VGA resolution (640×480 pixels) be 6.4×4.8 mm. The actual size of the photonic semiconductor structure 210 would extend beyond emissive surface area by few additional pixels on each side, making the typical size of the photonic semiconductor structure 210 be in the range of 6.6×5 mm and the digital semiconductor structure 220 would extend beyond that area to allow for the layout area of the control logic 229 and the device bonding pads 221, making the typical dimensions of a Quantum Photonic imager device 200 that provides a VGA resolution be in the range 7.6×6 mm.

Having described the underlying architecture of the Quantum Photonic Imager devices 200 of this invention, the following paragraphs provide detailed description of its constituent parts and manufacturing methods thereof.

QPI Semiconductor Structure

Figure 3:
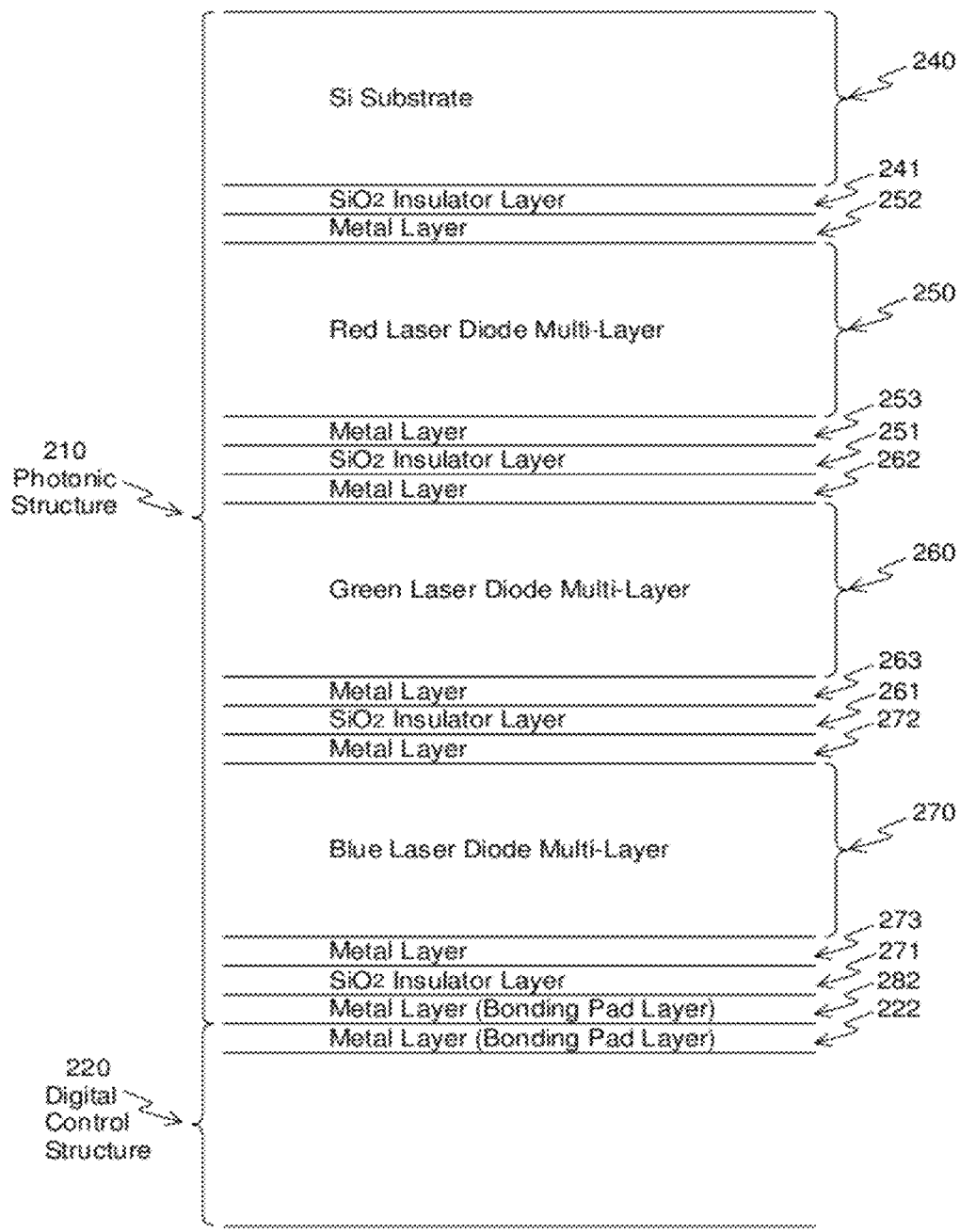
FIG. 3 illustrates a cross-sectional view of the multicolor pixel laser stack.

FIG. 3 is a cross-sectional view illustration of the semiconductor multi structures that form the Quantum Photonic Imager Device 200 of this Invention. The same reference numbers are used for the same items, however the red, green and blue laser diodes semiconductor structures prior to the formation of the pixels 230 would be referred to as the multilayer laser diode structures 250, 260 and 270; respectively.

In accordance with the preferred embodiment of the fabrication method of the Quantum Photonic Imager device 200 of this invention, the multilayer laser diode structures 250, 260 and 270 would be fabricated separately as semiconductor wafers using the appropriate semiconductor processes, then post-processed to create the wafer-size multilayer stack photonic semiconductor structure 210 that incorporates the metal and insulation layers as illustrated in FIG. 3. The wafer-size multilayer stack photonic semiconductor structure 210 would then be further post-processed to create the pixels' sidewalls 235, which form the laser diodes 231, 232 and 233, and the pixels' vertical waveguide 290 as illustrated in FIG. 2B. Furthermore, the digital semiconductor structure 220 would also be fabricated separately as a semiconductor wafer using the appropriate semiconductor processes, then wafer-level or die-level bonded with the multilayer stack photonic semiconductor structure 210 to create the Quantum Photonic Imager device 200 illustrated in FIG. 2A. The following paragraphs describe the detailed design specifications of the multilayer laser diode structures 250, 260 and 270 and the digital semiconductor structure 220 as well as the detailed design specifications of the wafers post-processing and fabrication flow required to create the Quantum Photonic Imager device 200 of this invention.

The illustration of FIG. 3 shows the Quantum Photonic Imager device 200 being comprised of the semiconductor structures 210 and 220 with each of these two semiconductor structures being further comprised of multiple semiconductor layers. As illustrated in FIG. 3, the photonic semiconductor structure 210 is comprised of a silicon (Si) substrate 240 and a stack of three multilayer laser diode structures 250, 260 and 270 separated by layers 241, 251, 261 and 271 of dielectric insulator, such as silicon dioxide ($SiO_2$), each preferably 150 to 200 nm-thick, which provide top and bottom electrical insulation of each between the three multilayer laser diode structures 250, 260 and 270.

Also incorporated within the photonic semiconductor structure 210 are the metal layers 252 and 253, which constitute the p-contact and n-contact metal layers; respectively, of the red multilayer laser diode 250, the metal layers 262 and 263 which constitute the p-contact and n-contact metal layers; respectively, of the green multilayer laser diode 260 and the metal layers 272 and 273 which constitute the p-contact and n-contact metal layers; respectively, of the blue multilayer laser diode 270. Each of the metal layers 252, 253, 262, 263, 272 and 273 is preferably 150 to 200 nm-thick of semiconductor interconnect metallization layer having low electromigration and stress-migration characteristics such as gold-tin (Au—Sn) or gold-titanium (Au—Ti) multilayer metallization. The metallization layers 252, 253, 262, 263, 272 and 273 would also include a diffusion barrier that would prevent excessive diffusion of the metallization layers into the insulation layers 241, 252, 261 and 271.

As illustrated in FIG. 3, the interfaces between the semiconductor structures 210 and 220 are the metal layer 282, at the photonic semiconductor structure 210 side, and the metal layer 222 at the digital control structure 220 side. Both of the metal layers 282 and 222 would be etched to incorporate the electrical interconnect bonding pads between the two semiconductor structures 210 and 220. The metal layer 222 would also incorporate the device bonding pads 221.

The insulation layers 241, 251, 261 and 271 and metallization layers 252, 253, 262, 263, 272 and 273 would be deposited using typical semiconductor vapor deposition process such as chemical vapor deposition (CVD). The two layers 241 and 252 would be deposited directly on the Si substrate layer 240, and the resultant multilayer stack 240-241-252 is then wafer-level bonded to the p-layer of the red laser diode structure 250 using either direct wafer bonding, diffusion bonding or anodic bonding techniques or the like.

The resultant semiconductor multilayer structure is then used as a substrate upon which the layers 253, 251, and 262 would be deposited using vapor deposition techniques such as CVD or the like and the resultant multilayer stack 240-241-252-250-253-251-262 is then wafer-level bonded to the p-layer of the green laser diode structures 260 using either direct wafer bonding, diffusion bonding or anodic bonding techniques or the like, and the substrate on which the green laser diode was formed is removed.

The resultant semiconductor multilayer structure is then used as a substrate upon which the layers 263, 261, and 272 would be deposited using vapor deposition techniques such as CVD or the like and the resultant multilayer stack 240-241-252-250-253-251-262-260-263-261-272 is then wafer-level bonded to the p-layer of the blue laser diode structures 270 using either direct wafer bonding, diffusion bonding anodic bonding techniques or the like, and the substrate on which the blue laser diode was formed is removed.

The resultant semiconductor multilayer structure is then used as a substrate upon which the layers 273, 271, and 282 would be deposited using vapor deposition techniques such as CVD or the like. The metal layer 282 is then etched to create the bonding pad pattern using semiconductor lithography process and the etched areas are refilled with insulator material, preferably $SiO_2$, and the surface is then polished and cleaned. The resultant photonic semiconductor structure 210 is then wafer-level bonded to the corresponding bonding pad surface of the digital semiconductor structure 220 using flip-chip bonding techniques.

Laser Diode Multilayer Structure

Each of the multilayer semiconductor structures 250, 260 and 270 would be a multiple quantum well (MQW) double heterostructure semiconductor laser diode grown as separate wafers each on its own substrate using well-known epitaxial deposition process commonly referred to as metal-organic chemical vapor deposition (MOCVD). Other deposition processes such as liquid phase epitaxy (LPE), molecular beam epitaxy (MBE), metal organic vapor phase epitaxy (MOVPE), hydride vapor phase epitaxy (HVPE), hydride metal organic vapor phase epitaxy (H-MOVPE) or other known crystal growth processes can also be used.

Red Laser Diode

FIG. 4A illustrates an exemplary embodiment of the multilayer cross section of the red laser diode structure 250 of the Quantum Photonic imager device 200 of this invention. The multilayer semiconductor structure of FIG. 4A is phosphide based with its parameters selected such that the laser light generated by the red laser diode structure 250 would have a dominant wavelength of 615-nm. As shown in FIG. 4A, a substrate removal etch-stop layer 412 of n-doped GaAs of thickness 100-nm is grown on a thick (approximately 2000 nm) GaAs substrate 410 which will be etched off after the red laser diode structure 250 is wafer-level bonded to the multilayer stack 240-241-252 as explained earlier. The n-doped GaAs etch-stop layer 412 would have either silicon (Si) or selenium (Se) doping of approximately $8 \times 10^{18}$ cm$^{-3}$. A thick GaAs substrate is used to assure the growth of a high quality epi layer thereon.

Upon the substrate removal etch-stop layer 412 is deposited the cladding layer 414 of n-type of either $Al_{0.5}In_{0.5}P$ or $(Al_{0.7}Ga_{0.3})_{0.5}In_{0.5}$ superlattice (SL) which would typically be 120-nm thick and have either Si or Se doping of $1 \times 10^{18}$ cm$^{-3}$. Upon the cladding layer 414 is deposited a 100-nm thick n-type $(Al_{0.55}Ga_{0.45})_{0.5}In_{0.5}P$ waveguide layer 416 which would typically be either silicon (Si) or selenium (Se) doped to at least $1 \times 10^{18}$ cm$^{-3}$. Upon the waveguide layer 416 is deposited the active region 421 of the red laser diode 250 comprised of multiple $Ga_{0.6}In_{0.4}P$ quantum well layers 420 which are enclosed within the $Al_{0.5}In_{0.5}P$ barrier layers 418, typically either silicon (Si) or selenium (Se) doped at levels of least $0.01 \times 10^{18}$ cm$^{-3}$ and $0.1 \times 10^{18}$ cm$^{-3}$, respectively. As shown in FIG. 4A, the thickness of the quantum well layers 420 and barrier layers 418 are selected to be 4.8-nm and 4-nm; respectively, however the thickness of these layers could be increased or decreased in order to fine tune the emission characteristics of the red laser diode 250.

Although FIG. 4A shows the active region 421 of the red laser diode 250 being comprised of three quantum wells, the number of quantum wells used could be increased or decreased in order to fine tune the emission characteristics of the red laser diode 250. Furthermore, the active region 421 of the red laser diode 250 could also be comprised of multiplicity of quantum wires or quantum dots instead of quantum wells.

Above the active region 421 is deposited a 140-nm thick p-type $(Al_{0.55}Ga_{0.45})_{0.5}In_{0.5}P$ waveguide layer 422 which would typically be magnesium (Mg) doped at a level of at least $1 \times 10^{18}$ cm$^{-3}$. Upon waveguide layer 422 is deposited a 23-nm thick $Al_{0.5}In_{0.5}P$ anti-tunneling layer 424 having a magnesium doping level of at least $1 \times 10^{18}$ cm$^{-3}$. Upon anti-tunneling layer 424 is deposited an electron blocker layer 426 of thickness 25-nm which is comprised alternating layers of $Ga_{0.5}In_{0.5}P$ quantum wells and $Al_{0.5}In_{0.5}P$ barriers each being magnesium doped at a level of at least $1 \times 10^{18}$ cm$^{-3}$. The electron blocker layer 426 is incorporated in order to reduce the electron leakage current, which would reduce the threshold current and the operating temperature of the red laser diode structure 250.

Above the electron blocker layer 426 is deposited a 120-nm thick p-type of either $Al_{0.5}In_{0.5}P$ or $(Al_{0.7}Ga_{0.3})_{0.5}In_{0.5}$ SL cladding layer 428 which would typically be magnesium doped at a level of $0.5 \times 10^{18}$ cm$^{-3}$. Upon the cladding layer 428 is deposited a 100-nm thick p-type GaAs contact layer 429 which would heavily magnesium doped at a level of at least $1 \times 10^{18}$ cm$^{-3}$. As explained earlier, the contact layer 429 would be the interface layer for the wafer-level bonding of the red laser diode structure 250 and the multilayer stack 240-241-252.

The multilayer 416-421-422 is known to a person skilled in the art as the optical resonator or optical confinement region of the red laser diode 250 within which the red laser light generated by the MQW active region 421 would be confined. As will be explained in the subsequent paragraphs, the light generated by the red laser diode 250 will be emitted vertically from the surface of the Quantum Photonic imager device 200 through vertical waveguides 290 that are optically coupled to the optical confinement multilayer 416-421-422 of the red laser diode 250.

Green Laser Diode

FIG. 4B illustrates an exemplary embodiment of the multilayer cross section of the green laser diode structure 260 of the Quantum Photonic imager device 200 of this invention. The multilayer semiconductor structure of FIG. 4B is nitride based with its parameters are selected such that the laser light generated by the green laser diode structure 260 would have a dominant wavelength of 520-nm. As shown in FIG. 4B, a substrate removal etch-stop layer 432 of n-doped $In_{0.05}Ga_{0.95}N$ of thickness 100-nm and Si-doped at a level $6 \times 10^{18}$ $cm^{-3}$ is grown on a thick GaN substrate 430 which will be etched off after the green laser diode structure 260 is wafer-level bonded to the multilayer stack 240-241-252-250-53-251-262 as explained earlier. The n-doped $In_{0.05}Ga_{0.95}N$ etch-stop layer 432 would have silicon (Si) doping of $6 \times 10^{18}$ $cm^{-3}$. Although FIG. 4B shows the substrate 430 being GaN, InGaN material alloy could also be used for the substrate 430.

Upon the substrate removal etch-stop layer 432 is deposited the cladding layer 434 of n-type of $Al_{0.18}Ga_{0.82}N/GaN$ SL which would typically be 451-nm thick and have Si doping of $2 \times 10^{18}$ $cm^{-3}$. Upon the cladding layer 434 is deposited a 98.5-nm thick n-type GaN waveguide layer 436 which would typically be Si-doped at a level of $6.5 \times 10^{18}$ $cm^{-3}$. Upon the waveguide layer 436 is deposited the active region of the green laser diode 260 which is comprised of multiple $In_{0.535}Ga_{0.465}N$ quantum well layers 450 each being Si-doped at a level of $0.05 \times 10^{18}$ $cm^{-3}$ and enclosed within the $In_{0.04}Ga_{0.96}N$ barrier layers 438 each being Si-doped at a level of $6.5 \times 10^{18}$ $cm^{-3}$. As shown in FIG. 4B, the thickness of the quantum well layers 450 and barrier layers 438 are selected to be 5.5-nm and 8.5-nm; respectively, however the thickness of these layers could be increased o decreased in order to fine tune the emission characteristics of the green laser diode 260.

Although FIG. 4B shows the active region 431 of the green laser diode 260 being comprised of three quantum wells, the number of quantum wells used could be increased or decreased to in order to fine tune the emission characteristics of the green laser diode 260. Furthermore, the active region 431 of the green laser diode 260 could also be comprised of multiplicity of quantum wires or quantum dots instead of quantum wells.

Above the active region 431 is deposited a 8.5-nm thick p-type GaN waveguide layer 452 which would typically be magnesium (Mg) doped at a level of $50 \times 10^{18}$ $cm^{-3}$. Upon waveguide layer 452 is deposited a 20-nm thick $Al_{0.2}Ga_{0.8}N$ electron blocker layer 454 having a magnesium (Mg) doping level of approximately $100 \times 10^{18}$ $cm^{-3}$. The electron blocker layer 454 is incorporated in order to reduce the electron leakage current, which would reduce the threshold current and the operating temperature of the green laser diode structure 260.

Above the electron blocker layer 454 is deposited a 90-nm thick p-type GaN waveguide layer 456 which would typically be magnesium (Mg) doped at a level of $75 \times 10^{18}$ $cm^{-3}$. Upon the waveguide layer 456 is deposited a 451-nm thick p-type $Al_{0.18}Ga_{0.82}N/GaN$ SL cladding layer 458 which would typically be magnesium doped at a level of $75 \times 10^{18}$ $cm^{-3}$. Upon the cladding layer 458 is deposited a 100-nm thick p-type GaN contact layer 459 which is magnesium (Mg) doped at a level of $75 \times 10^{18}$ $cm^{-3}$. As explained earlier, the contact layer 459 would be the interface layer for the wafer-level bonding of the green laser diode structure 260 and the multilayer stack 240-241-252-253-251-262.

The multilayer 436-431-452 is known to a person skilled in the art as the optical resonator or optical confinement region of the green laser diode 260 within which the green laser light generated by the MQW active region 431 would be confined. As will be explained in the subsequent paragraphs, the light generated by the green laser diode 260 will be emitted vertically from the surface of the Quantum Photonic imager device 200 through vertical waveguides 290 that are optically coupled to the optical confinement multilayer 436-431-452 of the green laser diode 260.

Blue Laser Diode

FIG. 4C illustrates an exemplary embodiment of the multilayer cross section of the blue laser diode structure 260 of the Quantum Photonic imager device 200 of this invention. The multilayer semiconductor structure of FIG. 4C is nitride based with its parameters selected such that the laser light generated by the blue laser diode structure 260 would have a dominant wavelength of 460-nm. As shown in FIG. 4C, a substrate removal etch-stop layer 462 of n-doped $In_{0.5}Ga_{0.95}N$ of thickness 100-nm Si doped at a level $6 \times 10^{18} cm^{-3}$ is grown on a thick GaN substrate 460 which will be etched off after the blue laser diode structure 270 is wafer-level bonded to the multilayer stack 240-241-252-250-53-251-262-260-263-261-272 as explained earlier. The n-doped $In_{0.5}Ga_{0.95}N$ etch-stop layer 462 would have silicon (Si) doping of $6 \times 10^{18}$ $cm^{-3}$. Although FIG. 4C shows the substrate 460 being GaN, InGaN material alloy could also be used for the substrate 460.

Upon the substrate removal etch-stop layer 462 is deposited the cladding layer 464 of n-type of $Al_{0.18}Ga_{0.82}N/GaN$ SL which would typically be 451-nm thick and have Si doping of $2 \times 10^{18}$ $cm^{-3}$. Upon the cladding layer 464 is deposited a 98.5-nm thick n-type GaN waveguide layer 466 which would typically be Si doped at a level of $6.5 \times 10^{18}$ $cm^{-3}$. Upon the waveguide layer 466 is deposited the active region of the blue laser diode 270 which is comprised of multiple $In_{0.41}Ga_{0.59}N$ quantum well layers 470 each being Si-doped at a level of $0.05 \times 10^{18} cm^{-3}$ and enclosed within the $In_{0.04}Ga_{0.96}N$ barrier layers 468 each being Si-doped at a level of $6.5 \times 10^{18}$ $cm^{-3}$. As shown in FIG. 4C, the thickness of the quantum well layers 470 and barrier layers 468 are selected to be 5.5-nm and 8.5-nm; respectively, however the thickness of these layers could be increased or decreased in order to fine tune the emission characteristics of the blue laser diode 270.

Although FIG. 4C shows the active region 431 of the green laser diode 260 being comprised of three quantum wells, the number of quantum wells used could be increased or decreased in order to fine tune the emission characteristics of the green laser diode 260. Furthermore, the active region 431 of the blue laser diode 260 could also be comprised of multiplicity of quantum wires or quantum dots instead of quantum wells.

Above the active region 431 is deposited a 8.5-nm thick p-type GaN waveguide layer 472 which would typically be magnesium (Mg) doped at a level of $50 \times 10^{18}$ $cm^{-3}$. Upon waveguide layer 472 is deposited a 20-nm thick $Al_{0.2}Ga_{0.8}N$ electron blocker layer 474 having a magnesium (Mg) doping level of approximately $100 \times 10^{18}$ $cm^{-3}$. The electron blocker layer 474 is incorporated in order to reduce the electron leakage current, which would reduce the threshold current and the operating temperature of the blue laser diode structure 270.

Above the electron blocker layer 474 is deposited a 90-nm thick p-type GaN waveguide layer 476 which would typically be magnesium (Mg) doped at a level of $75 \times 10^{18}$ cm$^{-3}$. Upon the waveguide layer 476 is deposited a 451-nm thick p-type Al$_{0.18}$Ga$_{0.82}$N/GaN SL cladding layer 478 which would typically be magnesium (Mg) doped at a level of $75 \times 10^{18}$ cm$^{-3}$.

Upon the cladding layer 478 is deposited a 100-nm thick p-type GaN contact layer 479 which is magnesium doped at a level of $75 \times 10^{18}$ cm$^{-3}$. As explained earlier, the contact layer 479 would be the layer for the wafer-level bonding of the blue laser diode structure 270 and the multilayer stack 240-241-252-253-251-262-260-263-261-272.

The multilayer 466-461-472 is known to a person skilled in the art as the optical resonator or optical confinement region of the blue laser diode 270 within which the blue laser light generated by the MQW active region 461 would be confined. As will be explained in the subsequent paragraphs, the light generated by the blue laser diode 270 will be emitted vertically from the surface of the Quantum Photonic imager device 200 through vertical waveguides 290 that are optically coupled to the optical confinement multilayer 466-461-472 of the blue laser diode 270.

An alternative exemplary embodiment of the multilayer red laser diode structure 250 of the Quantum Photonic imager device 200 that is nitride-based is illustrated in FIG. 4D. Being nitride-based, the alternative exemplary embodiment of the multilayer red laser diode structure 250 of FIG. 4D would have comparable design prescription as the nitride-based green laser diode structure 260 of FIG. 4B and the blue laser diode structure 270 of FIG. 4C, with the exception that its layer parameters would be selected such that the generated laser light would have a dominant wavelength of 615-nm. The alternative nitride-based multilayer red laser diode structure 250 of FIG. 4D would be enabled by the increase in the indium content of the multiple quantum wells 419 to 0.68. Although FIG. 4D shows its active region being comprised of three quantum wells, the number of quantum wells used could be increased or decreased in order to fine tune the emission characteristics of the red laser diode 250. Furthermore, the active region of the alternative exemplary embodiment of the red laser diode structure 250 illustrated in FIG. 4D could also be comprised of multiplicity of quantum wires or quantum dots instead of quantum wells. Although FIG. 4D shows the substrate 480 being GaN, InGaN material alloy could also be used for the substrate 480.

QPI Color Gamut

As will be subsequently explained, the color gamut defined by the three colors specified for the laser diodes 250, 260 and 270 in the aforementioned exemplary embodiment of the Quantum Photonic Imager device 200 would achieve an extended gamut (Wide Gamut) relative to the defined standards of color image displays such HDTV and NTSC. Specifically, the three colors specified for the laser diodes 250, 260 and 270 in the aforementioned exemplary embodiment of the Quantum Photonic Imager device 200 would achieve a color gamut that is nearly 200% of the color gamut defined by the NTSC standard.

The color gamut achieved by the Quantum Photonic Imager device 200 of this invention can be further extended to include more than 90% of the visible color gamut to achieve an Ultra-Wide Gamut capability by increasing the number of laser diodes incorporated within the photonic semiconductor structure 210 beyond the three colors specified for the laser diodes 250, 260 and 270 in the aforementioned exemplary embodiment. Specifically the color gamut of the light emitted by the Quantum Photonic Imager device 200 could be extended further to achieve an Ultra-Wide Gamut when the number of stacked laser diodes comprising the Quantum Photonic Imager device 200 is increased to include yellow (572-nm) laser diode semiconductor structure positioned in between the red and the green laser diodes structure 250 and 260 and a cyan (488-nm) laser diode semiconductor structure positioned in between the green laser diode structure 260 and the blue laser diode structure 270, thus making the Quantum Photonic Imager device 200 be comprised of a stack of five laser diode structures covering the wavelengths of red (615-nm), yellow (572-nm), green (520-nm), cyan (488-nm) and blue (460-nm). With this stack of five laser diode semiconductor structures 210 of the Quantum Photonic Imager device 200 of this invention would be able to generate an Ultra-Wide color gamut that covers more than 90% of the visible color gamut.

Although in the aforementioned exemplary embodiments of the photonic semiconductor structure 210 of the Quantum Photonic Imager device 200, the wavelengths of the laser diode structures 250, 260, and 270 were selected to be 615-nm, 520-nm and 460-nm; respectively, a person skilled in the art would know how to follow the teachings of this invention using other values of wavelengths than those selected for the laser diode structures 250, 260, and 270 of the aforementioned exemplary embodiments. Furthermore, although in the aforementioned exemplary embodiments of the Quantum Photonic Imager device 200, the photonic semiconductor structure 210 is comprised of the three laser diode structures 250, 260, and 270, a person skilled in the art would know how to follow the teachings of this invention using more than three laser diode structures. Furthermore, although in the aforementioned exemplary embodiments of the Quantum Photonic Imager device 200, the photonic semiconductor structure 210 is comprised of the three laser diode structures 250, 260, and 270 stacked in the order illustrated in FIG. 3, a person skilled in the art would know how to follow the teachings of this invention with the laser diode structures stacked in a different order.

Laser Diodes Energy Bands

Figure 5A:
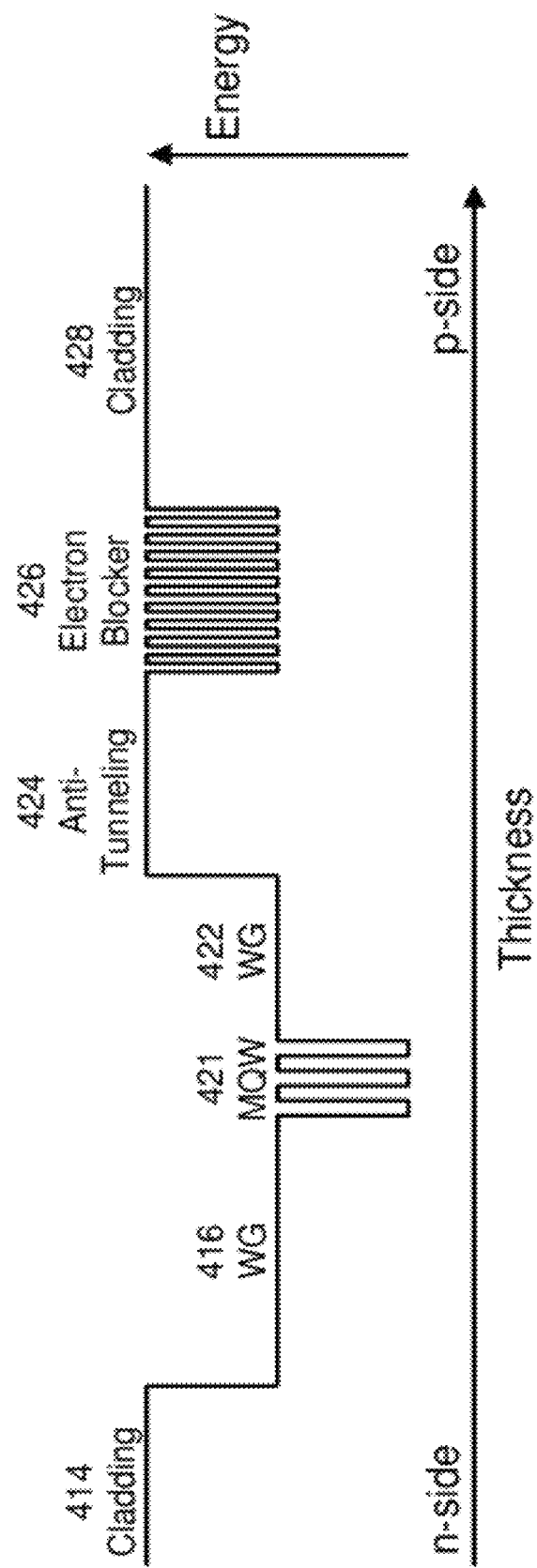
FIG. 5A illustrates the energy band diagram of the red laser diode structure of the Quantum Photonic imager device of this invention.
Figure 5B:
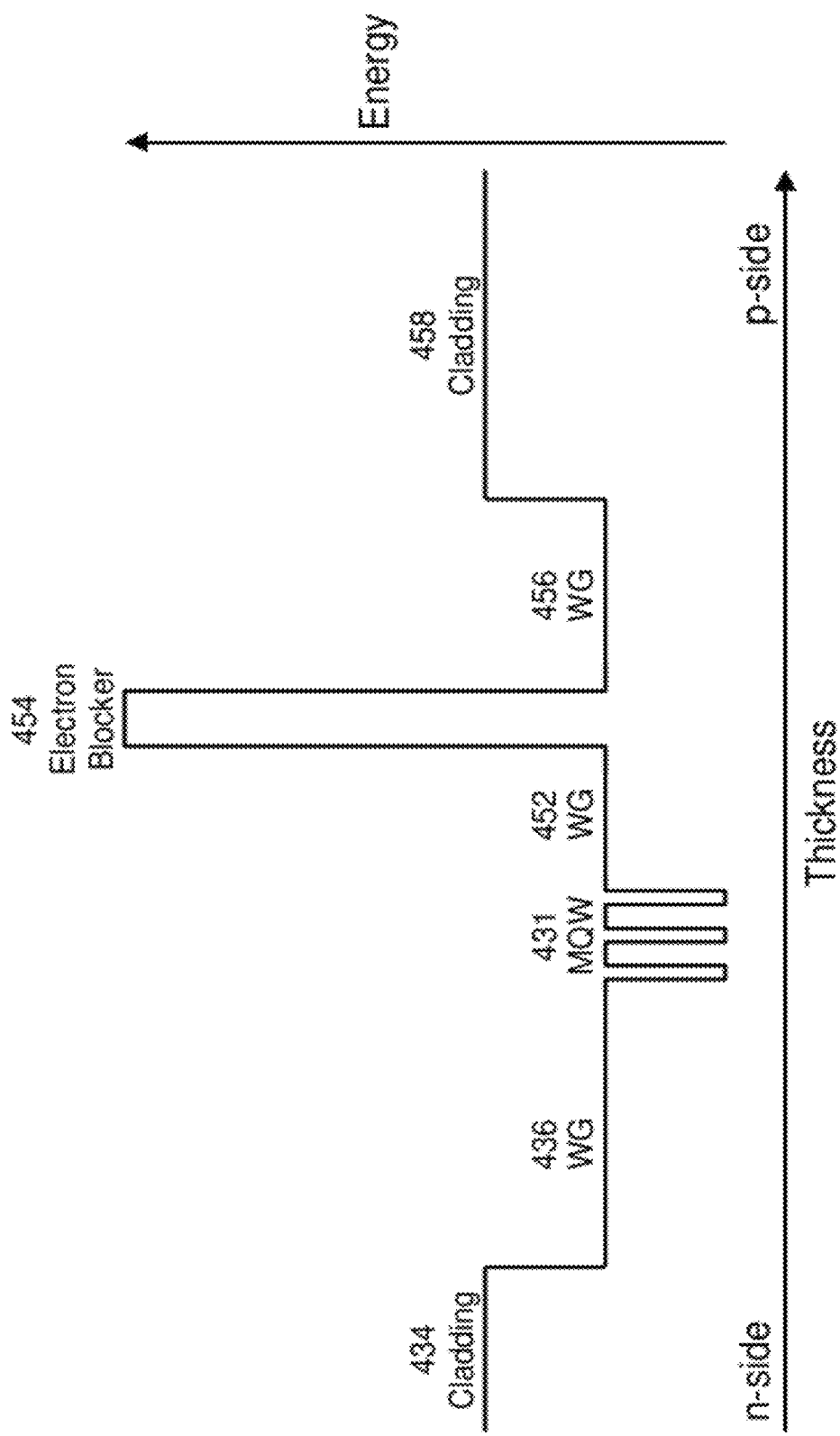
FIG. 5B illustrates the energy band diagram of the green laser diode structure of the Quantum Photonic imager device of this invention.
Figure 5C:
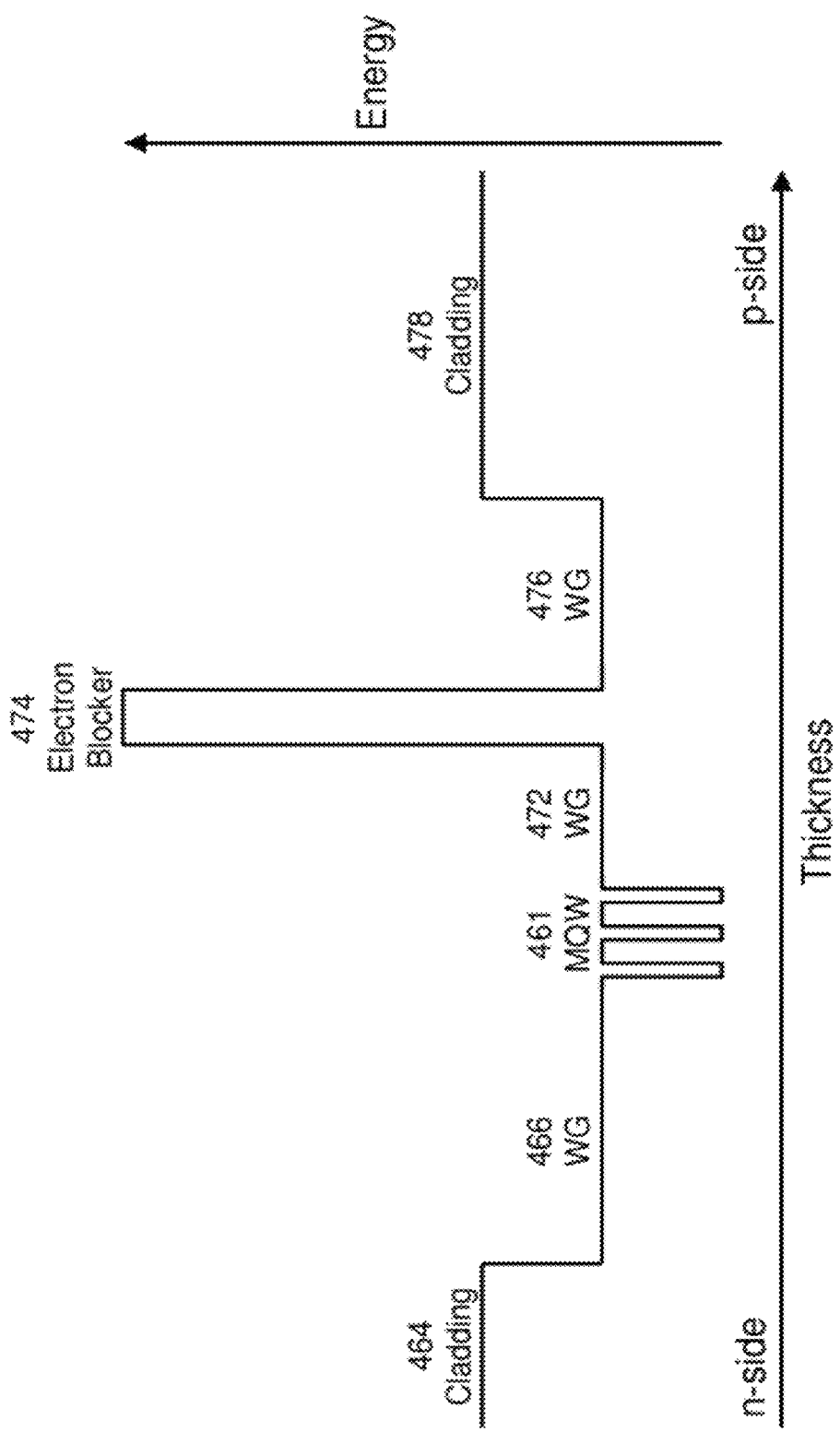
FIG. 5C illustrates the energy band diagram of the blue laser diode structure of the Quantum Photonic imager device of this invention.

FIG. 5A, FIG. 5B and FIG. 5C illustrate the energy bands of the aforementioned exemplary embodiments of the phosphide based red laser diode structure 250 and the nitride based green laser diode 260 and blue laser diode 270; respectively. The energy bands shown in FIG. 5A, FIG. 5B and FIG. 5C illustrate the thickness of each layer from left to right and the energy from bottom to top. The thickness and energy levels are meant to show qualitative values rather than a quantitative measure of the exact thicknesses and energy levels. Nevertheless, the reference numbers in FIG. 5A, FIG. 5B and FIG. 5C correspond with the reference numbers of the layers in FIG. 4A, FIG. 4B and FIG. 4C; respectively. As these figures illustrate, the energy levels of the p-type and n-type cladding layers energetically confine the p-type and n-type waveguide layers as well as the multiple quantum well levels. Because the energy levels of the multiple quantum wells represent a local low energy level, as illustrated in figures FIG. 5A, FIG. 5B and FIG. 5C, electrons will be confined within the quantum wells to be efficiently recombined with the corresponding holes to generate light.

In reference to FIG. 5A, the thickness of the anti-tunneling layer 424 is selected such that it is large enough to prevent electrons tunneling yet small enough to retain electron coherence within the superlattice structure of the electron blocker layer 426. In order to lower the lasing threshold, the electron blocker layers 426, 454 and 474 are used in the exemplary embodiments of the laser diode structure 250, 260, and 270; respectively. As illustrated in FIG. 5A, the electron blocker 426 used in the red laser structure 250 is comprised of multiple quantum barriers (MQB) implemented in the p-doped region and having energy level alternating between that of the waveguide layer 422 and the cladding layer 428. The inclusion of the MQB electron blocker 426 substantially improves the electron confinement due to the quantum interference of the electrons in the MQB, creating a large increase of the barrier height at the waveguide-cladding layers interface, which substantially suppresses the electron leakage current. As illustrated in FIG. 5B and FIG. 5C, the electron blocker used in the green laser structure 260 and the blue laser structure 270 is placed in between two segments of the p-type waveguide layers and has energy level that is substantially higher than both the waveguide layers as well as the cladding layers in order to substantially improve the electron confinement and subsequently suppresses the electron leakage current.

Pixel Sidewalls

The plurality of pixels 230 that comprises the Quantum Photonic imager device 200 are optically and electrically separated by the pixel sidewalls 235 comprised of insulating semiconductor material and embedded within which are the vertical electrical interconnects (contact vias) that are used to route electrical current to the constituent laser diodes of each pixel. FIG. 6A is a horizontal cross sectional view of one of the plurality multicolor pixels 230 comprising the Quantum Photonic Imager device 200 that illustrates the inner structure of the pixel sidewall 235. As illustrated in FIG. 6A, the pixel sidewall 235 defines the boundaries of the multicolor pixel 230 and is comprised of the metal contact vias 236 embedded within a sidewall interior 237 of dielectric material such as $SiO_2$.

Figure 6B:
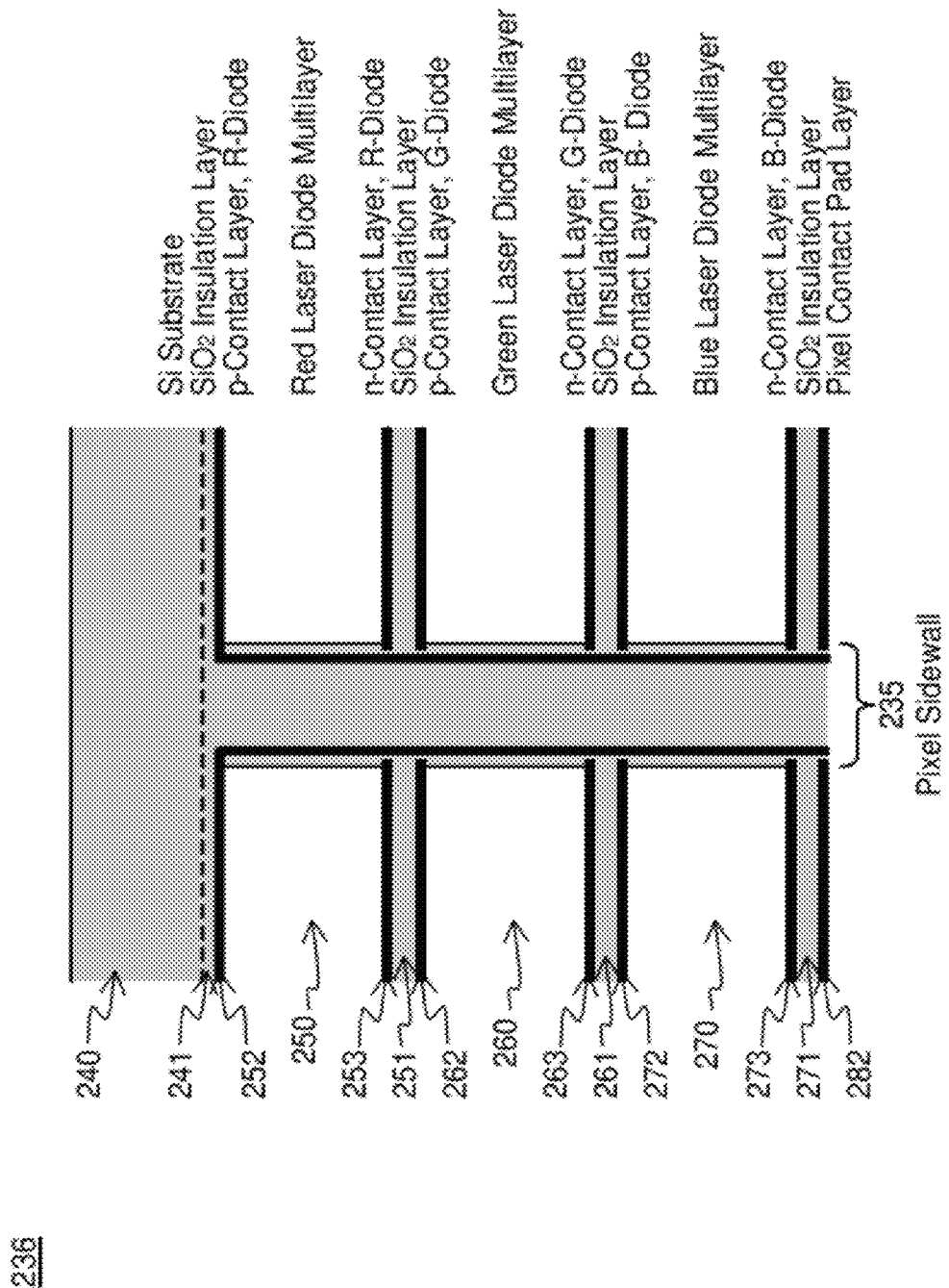
FIG. 6B illustrates a vertical cross-sectional view of the multicolor pixel sidewall.

FIG. 6B is a vertical cross-sectional view of one of the pixel sidewalls 235 that illustrates the interface between the multilayer photonic structure 210 and the sidewall 235. The pixel sidewalls 235 illustrated in FIG. 6A and FIG. 6B would be formed by etching an orthogonal square grid of 1-micron wide trenches into the multilayer photonic structure 210. The trenches would be etched at a pitch that equals the pixel width, which in this exemplary embodiment of the Quantum Photonic Imager device 200 is selected to be 10-micron, and at a depth starting from the bonding pad layer 282 and ending at the $SiO_2$ insulation layer 241. The etched trenches are then refilled with low dielectric constant (low-k) insulating material such as $SiO_2$ or silicon carbon-doped silicon oxide (SiOC) then re-etched to form 150-nm wide trenches for the contact vias 236. The re-etched trenches for the contact vias 236 are then refilled using vapor deposition techniques, such as CVD or the like, with metal such as gold-tin (Au—Sn) or gold-titanium (Au—Ti) to achieve contact with the metallization layers 252, 253, 262, 263, 272 and 273.

The trenches etched for the pixel sidewalls 235 may have parallel sides as illustrated in FIG. 6B or the may be slightly sloped as dictated by the etching process used. Although any appropriate semiconductor etching technique may be used for etching the trenches for the sidewalls 235 and the contact via 236, one exemplary etching technique is a dry etching technique, such as chlorine-based, chemically-assisted ion beam etching (Cl-based CAIBE). However, other etching techniques, such as reactive ion etching (RIE) or the like may be used.

Figure 6C:
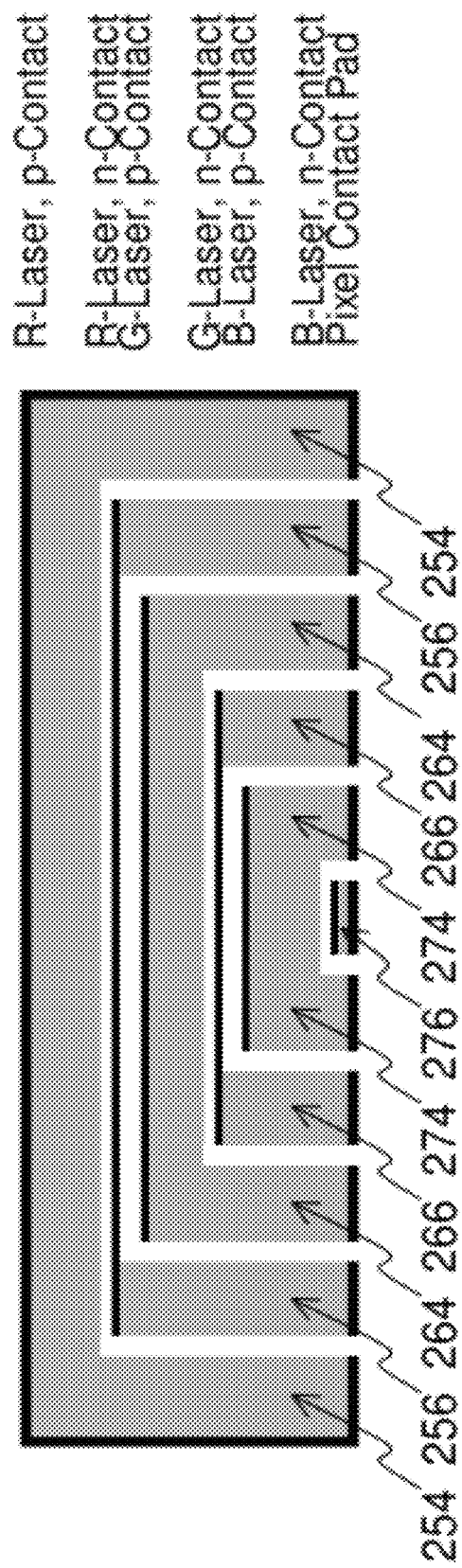
FIG. 6C illustrates the multicolor pixel sidewall contact vias layout.

The formation of the pixel sidewalls 235 as described above is performed in multiple intermediate stages during the formation of the multilayer photonic structure 210. FIG. 6C is a vertical cross-sectional view of the contact vias 236 embedded within the pixel sidewalls 235. As illustrated in FIG. 6C, each of the contact vias 236 would be comprised of the six segments 254 and 256 for the red laser diode structure 250 p-contact and n-contact; respectively, 264 and 266 for the green laser diode structure 260 p-contact and n-contact; respectively, and 274 and 276 for the blue laser diode laser 270 p-contact and n-contact; respectively.

After the multilayer structure 240-241-252-250 is formed as explained earlier, the trench for the pixel sidewall 235 is double-etched into the multilayer structure from the side of the red laser diode multilayer 250 with the first and second stop-etch being below and above the metal layer 252. The etched trench is then refilled with insulating material such as $SiO_2$ then retched with the stop-etch being the metal layer 252 and refilled with contact metal material to form the base segment of the contact via 254 as illustrated in FIG. 6C.

After the contact layer 253 and the insulation layer 251 are deposited, the trench for the pixel sidewall 235 is double-etched into the deposited layers with the first and second stop etch being below and above the metal layer 253, refilled with insulating material, re-etched with the stop-etch being the metal layer 253 and refilled with contact metal material to form the base of the contact via 256 and to extend the contact via 254 as illustrated in FIG. 6C.

After the contact layer 262 is deposited and the green laser diode structure 260 is bonded with the multilayer structure, the trench for the pixel sidewall 235 is double-etched into the formed multilayer structure from the side of the green laser diode multilayer 250 with the first and second stop-etch being below and above the metal layer 262. The etched trench is then refilled with insulating material such as $SiO_2$ then retched with the stop-etch being the metal layer 262 and refilled with contact metal material to form the base segment of the contact via 264 and extend the contact vias 254 and 256 as illustrated in FIG. 6C.

After the contact layer 263 and the insulation layer 261 are deposited, the trench for the pixel sidewall 235 is double-etched into the deposited layers with the first and second stop-etch being below and above the metal layer 263, refilled with insulating material, re-etched with the stop-etch being the metal layer 263 and refilled with contact metal material to form the base segment of the contact via 266 and to extend the contact vias 254, 256 and 264 as illustrated in FIG. 6C.

After the contact layer 272 is deposited and the blue laser diode structure 270 is bonded with the multilayer structure, the trench for the pixel sidewall 235 is double-etched into the formed multilayer structure from the side of the green laser diode multilayer 250 with the first and second stop-etch being below and above the metal layer 272. The etched trench is then refilled with insulating material such as $SiO_2$ then retched with the stop-etch being the metal layer 272 and refilled with contact metal material to form the base segment of the contact via 274 and extend the contact vias 254, 256, 264, and 266 as illustrated in FIG. 6C.

After the contact layer 273 and the insulation layer 271 are deposited, the trench for the pixel sidewall 235 is double-etched into the deposited layers with the first and second stop-etch being below and above the metal layer 273, refilled with insulating material, re-etched with the stop-etch being the metal layer 263 and refilled with contact metal material to form the base segment of the contact via 276 and to extend the contact vias 254, 256, 264, 266 and 274 as illustrated in FIG. 6C.

Figure 7:
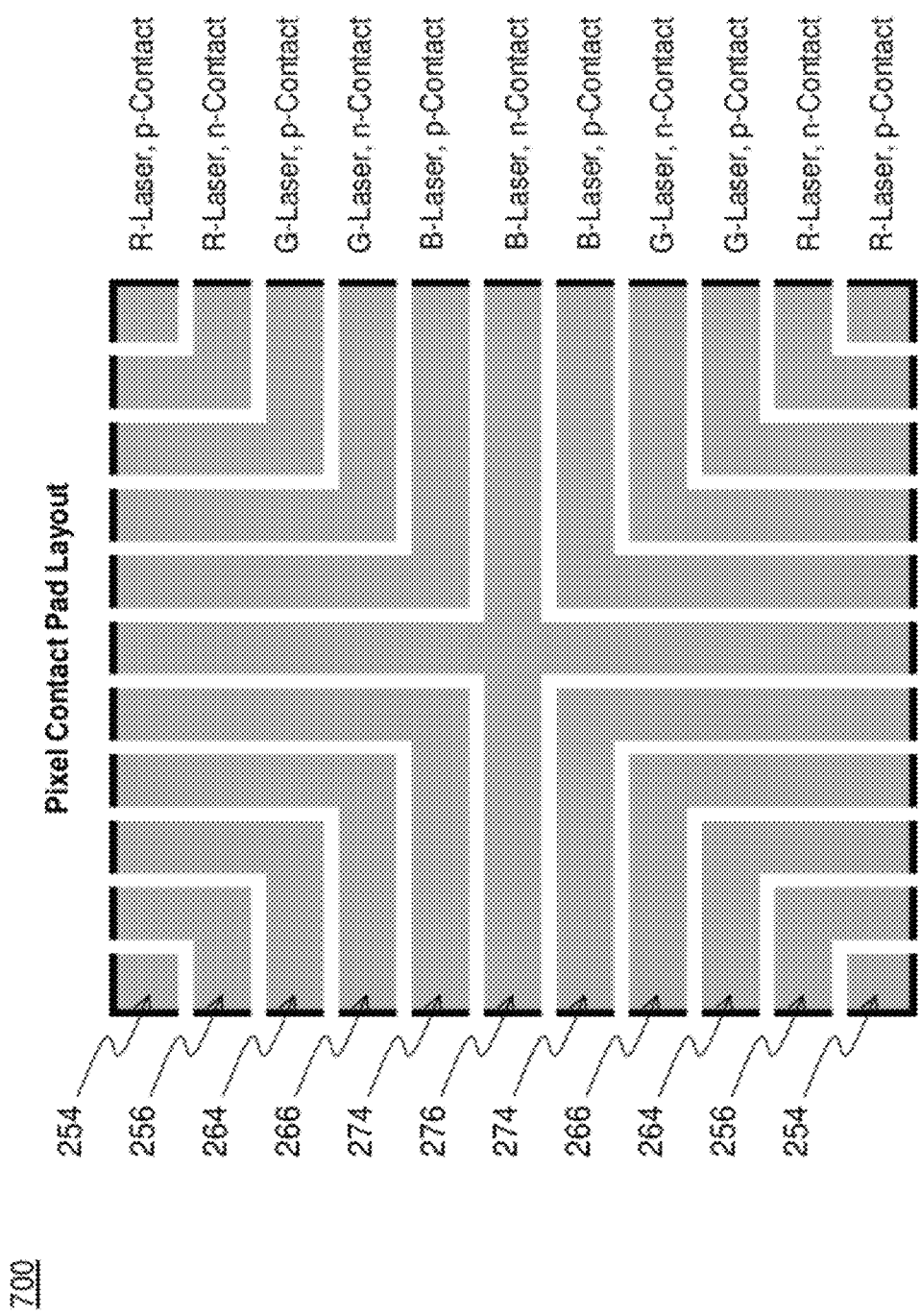
FIG. 7 illustrates the multicolor pixel contact pad layout.

After the pixel sidewalls 235 are formed, the metal layer 282 would be deposited then etched to create separation trenches between metal contacts established with contact vias 254, 256, 264, 266, 274 and 276 and the etched trenches are then refilled with insulating material such as SiO$_2$ then polished to create the pixel contact pad 700 which is illustrated in FIG. 7. The pixel contact pad 700 would form the contact interface between the photonic semiconductor structure 210 and the digital semiconductor structure 220.

Vertical Waveguides

After the formation of the pixel sidewalls 235 as explained above, the photonic semiconductor structure 210 would be partitioned by the formed sidewalls 235 into electrically and optically separated square regions that define the individual pixels 230 of the photonic semiconductor structure. The formed photonic semiconductor structure of each of the pixels 230 would then be comprised of a portion of the laser diode semiconductor structures 250, 260 and 270 and will be designated 231, 232 and 233; respectively.

In addition to electrically and optically separating the multicolor pixels 230 of the Quantum Photonic Imager device 200, the pixel sidewalls 235, being comprised of a dielectric material such as SiO$_2$ with the metal vias 236 illustrated in FIG. 6C embedded within its interior, would also form optical barriers which would optically seal the vertical edges of each of the portions of the optical confinement regions of the laser diode structure 250, 260 and 270 comprising each multicolor pixel 230. In other words, the insulation and metal contact layers in between the laser diode structures 250, 260 and 270 together with the insulation and contact vias within the pixels sidewalls 235 would form an array of vertically stacked multicolor laser diode resonators that are optically and electrically separated in the horizontal as well as the vertical planes. Such an electrical and optical separation would minimize any possible electrical or optical crosstalk between the pixels 230 and allows each pixel within the array as well as each laser diode within each pixel to be separately addressable. The laser light output from each of the pixels 230 would be emitted vertically through the array of the vertical waveguides 290 which are optically coupled to the optical confinement regions of each of the vertically stacked laser diodes 231, 232, and 233 that form each of the pixels 230.

Figure 8A:
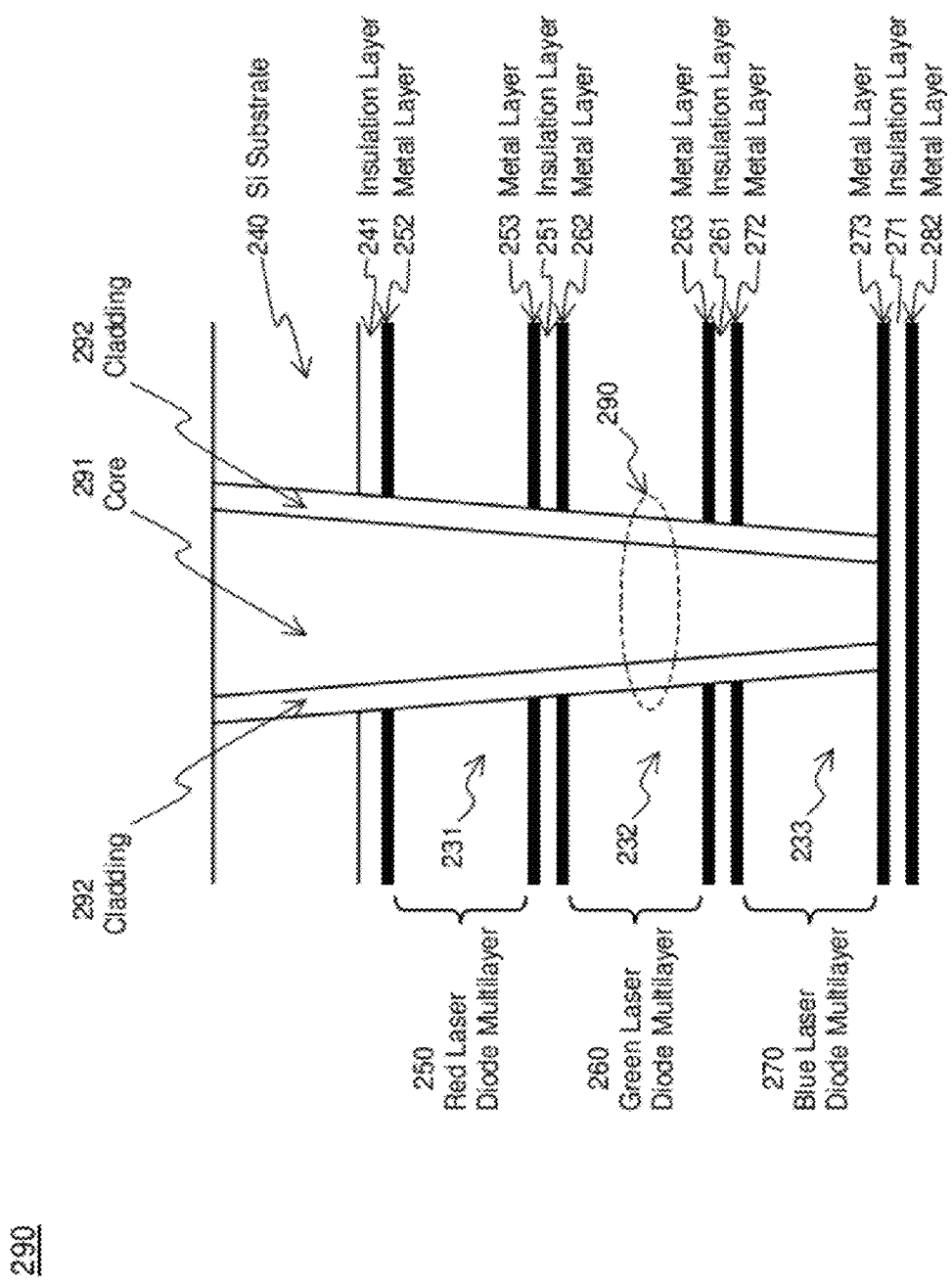
FIG. 8A illustrates a vertical cross-sectional view of the multicolor pixel output waveguide.

FIG. 8A and FIG. 8B illustrate vertical and horizontal cross-sectional views; respectively, of one of the vertical waveguides 290 comprising the array of vertical waveguides of one of the pixels 230 of the Quantum Photonic Imager device 200 of this invention. As illustrated in FIG. 8A and FIG. 8B, each of the vertical waveguides 290 would be optically coupled along its vertical height with optical confinement regions of the three vertically stacked laser diodes 231, 232, and 233 comprising the pixel 230. As illustrated in FIG. 8A and FIG. 8B, each of the vertical waveguides 290 would be comprised of a waveguide core 291 which would be enclosed within a multilayer cladding 292. The array of pixel's waveguides 290 would typically be etched through the Si-substrate 240 side of the photonic multilayer structure 210, their interior would then be coated with the multilayer cladding 292 and the waveguides would then be refilled with the dielectric material to form the vertical waveguide core 291. Although any appropriate semiconductor etching technique may be used for etching the vertical waveguides 290, one exemplary etching technique is a dry etching technique, such as chlorine-based, chemically-assisted ion beam etching (Cl-based CAIBE). However, other etching techniques, such as reactive ion etching (RIE) or the like may be used. Although any appropriate semiconductor coating technique may be used for forming the core 291 and the multilayer cladding 292 of the vertical waveguides 290, one exemplary layer deposition technique is plasma-assisted chemical vapor deposition (PE-CVD). The trenches etched for the vertical waveguides 290 preferably will have slightly sloped sides as illustrated in FIG. 8A in accordance with the increasing wavelength of the respective laser diodes in the laser diode stack.

As illustrated in FIG. 8A and FIG. 8B, each of the vertical waveguides 290 would typically have a circular cross-section and its vertical height would extend the thickness of the Si-substrate 240 plus the combined thicknesses of the three vertically stacked laser diodes 231, 232, and 233 comprising the pixel 230. Preferably the diameter (index guiding diameter) of the pixel's vertical waveguides 290 at the center of the coupling region with each of the laser diodes 231, 232, and 233 would equal to the wavelength of the respective laser diode.

First Embodiment of the Vertical Waveguides

In one embodiment of the Quantum Photonic Imager device 200 of this invention the cores 291 of the pixel's vertical waveguides 290 would be "evanescence field coupled" to the optical confinement regions of stacked laser diodes 231, 232, and 233 that form a single pixel 230. In this embodiment the vertical waveguide cladding 292 would be comprised of an outer layer 293 of 50-nm to 100-nm thick of insulating material, such as SiO$_2$, and an inner layer 294 of highly reflective metal such as aluminum (Al), silver (Ag) or gold (Au). The core 291 of the vertical waveguides 290 could either be air-filled or filled with a dielectric material such as SiO$_2$, silicon nitride (Si$_3$N$_4$) or tantalum pentoxide (TaO$_5$). Through the evanescence field coupling of this embodiment, a fraction of the laser light confined within the optical confinement region of each of the laser diodes 231, 232, and 233 would be coupled into the dielectric core 291 of the vertical waveguides 290 where it would be guided vertically through reflections on the highly reflective metallic inner cladding layer 294 of the waveguide cladding 292.

In this embodiment of the Quantum Photonic Imager device 200 of this invention the coupling between the optical confinement regions of stacked laser diodes 231, 232, and 233 comprising each of the pixels 230 and its constituent vertical waveguide 290 would occur due to photon tunneling across the metallic inner cladding layer 294. Such photon tunneling would occur when the thickness of the reflective metallic inner cladding layer 294 of the waveguide cladding 292 is selected to be sufficiently smaller than the penetration depth of evanescence field into the reflective metallic inner cladding layer 294 of the waveguide cladding 292. In other words, the energy associated with the light confined within the optical confinement regions of stacked laser diodes 231, 232, and 233 would be transmitted into metallic inner cladding layer 294 a short distance before it returned into the optical confinement regions of stacked laser diodes 231, 232, and 233 and when the thickness of the reflective metallic layer 294 is sufficiently small, a portion of this energy would be coupled into the vertical waveguide core 291 and would be guided vertically through reflections on the highly reflective metallic inner cladding layer 294 of the waveguide cladding 292 and emitted perpendicular to the surface of the Quantum Photonic Imager device 200.

The evanescence field transmitted from the optical confinement regions of stacked laser diodes 231, 232, and 233 into the reflective metallic layer 294 would decay exponentially and would have mean penetration depth "d" that is given by;

$$d = \lambda/2\pi \sqrt{n_0^2 \sin^2\theta_i - n_1^2} \quad (1)$$

Where $\lambda$ is the wavelength of the coupled light, $n_0$ and $n_1$ are the refractive index of the outer cladding layer 293 and the inner cladding layer 294; respectively, and $\theta_i$ is the light angle of incidence from optical confinement regions of the laser diodes 231, 232 and 233 onto the inner cladding layer 294.

As indicated by equation (1), for a given $n_0$, $n_1$ and $\theta_i$ the evanescence field penetration depth decreases with the decrease in the light wavelength $\lambda$. In order to use one thickness value for the inner cladding layer 294 that would effectively couple the three different wavelengths generated by the laser diodes 231, 232, and 233, the thickness of the inner cladding layer 294 would be selected using Equation (1) with the value of $\lambda$ being the wavelength associated with shortest wavelength generated by stacked laser diodes 231, 232, and 233, being in the case of the aforementioned embodiment the wavelength associated with the blue laser diode 233. When the thickness of the inner cladding layer 294 is selected based on this criterion, the light generated by the stacked laser diodes 231, 232, and 233 would be coupled into the vertical waveguide 290 would be 0.492, 0.416 and 0.368; respectively, of the intensity of the light reflected by the interface between optical confinement region of stacked laser diodes 231, 232, and 233 and the vertical waveguide 290. When the thickness of inner cladding layer 294 is increased, the amount of light coupled into the vertical waveguide 290 will decrease proportionally. The reflectivity of the inner cladding layer 294 toward the optical confinement regions of the laser diodes 231, 232, and 233 and toward the vertical waveguide core 291 would be given; respectively, by:

$$R_{01}=[(n_1-n_0)^2+k_1^2]/[(n_1-n_0)^2+k_1^2] \quad (2.a)$$

$$R_{12}=[(n_2-n_1)^2+k_1^2]/[(n_2-n_1)^2+k_1^2] \quad (2.b)$$

Where $n_2$ is the refractive index of the vertical waveguide core 291 and $k_1$ is the absorption coefficient of the inner cladding layer 294.

In the above exemplary embodiment of the evanescence field coupled vertical waveguides 290 of this invention in which $SiO_2$ is used as an outer cladding layer 293 and $Si_3N_4$ is used as the waveguide core 291 material, a 50-nm thick silver (Ag) inner cladding 294 would couple approximately 36% of the laser light incident on the interface between the optical confinement regions of the laser diodes 231, 232, and 233 and the vertical waveguide 290 while achieving approximately 62% reflectivity within the interior of the vertical waveguides 290. It should be noted that the part of the light which is not coupled into the vertical waveguides 290 would either be absorbed by inner cladding 294 (approximately 0.025) or would be recycled back into the optical confinement regions of the laser diodes 231, 232, and 233 where it would be amplified by the active regions of laser diodes 231, 232, and 233 and then re-coupled into the vertical waveguides 290.

Second Embodiment of the Vertical Waveguides

In another embodiment of the Quantum Photonic Imager device 200 of this invention the cores 291 of the pixel's vertical waveguides 290 would be coupled to the optical confinement regions of stacked laser diodes 231, 232, and 233 that form a single pixel 230 through the use of anisotropic multilayer thin cladding. What is meant by "anisotropic" in this context is that the reflectance/transmittance characteristics would be asymmetric at either side of the interface between the vertical waveguide 290 and the optical confinement regions of the stacked laser diodes 231, 232, and 233. The simplest realization of this embodiment would be to use a single thin cladding layer 293 having a refractive index value between that of the waveguide core 291 and the optical confinement regions of laser diodes 231, 232, and 233 and having the waveguide core 291 preferably filled with a dielectric material preferably having a refractive index that is at least equal to that of the optical confinement regions of the stacked laser diodes 231, 232, and 233.

The reflectance and transmittance characteristics of thin dielectric multilayer coatings are described in detail in Ref. [39]. At a normal angle of incidence, the reflectivity at the interface between the optical confinement regions of laser diodes 231, 232, and 233 and the cladding layer 293 would be given by:

$$R=[(n_1^2-n_0 n_1)/(n_1^2+n_0 n_1)]^2 \quad (3)$$

Where $n_0$, $n_1$ and $n_2$ are the refractive index of the optical confinement regions of stacked laser diodes 231, 232, and 233, of the cladding layer 293 and the waveguide core 291; respectively. As the angle of incidence at the interface between the optical confinement regions of laser diodes 231, 232, and 233 and the cladding layer 293 increases, the reflectivity increases until all the light is totally reflected when the critical angle is reached. Since, the critical angle depends on the ratio of the refractive index across the interface, when this ratio is selected such that the critical angle of the interface between the optical confinement regions of laser diodes 231, 232, and 233 and the cladding layer 293 is larger than the critical angle between the waveguide core 291 and the cladding layer 293, a portion of the light would be coupled into the waveguide core 291 and would be index guided through total internal reflection (TIR) by the pixel's vertical waveguides 290 to be emitted perpendicular to the surface of the Quantum Photonic Imager device 200.

In the above exemplary embodiment of coupling of the vertical waveguides 290 through the use of multilayer thin cladding in which an approximately 100-nm thick of $SiO_2$ is used as a cladding layer 293 and titanium dioxide ($TiO_2$) is used as the waveguide core 291 material, approximately 8.26% of the laser light incident on the interface between the optical confinement regions of the laser diodes 231, 232, and 233 and the vertical waveguide 290 would be coupled into the waveguide core 291 and index guided through total internal reflection by the pixel's vertical waveguides 290 to be emitted perpendicular to the surface of the Quantum Photonic Imager device 200.

In comparison to the evanescence field coupling of the preceding embodiment, coupling of vertical waveguides 290 through the use of multilayer thin cladding would couple a lesser amount of the light from the optical confinement regions of stacked laser diodes 231, 232, and 233 into the waveguide core 291, but the coupled light would not experience any losses as it traverses the length of the vertical waveguide 290 because the light is TIR-guided, hence approximately the same amount of the light would be outputted through the vertical waveguide 290 perpendicular to the surface of the Quantum Photonic Imager device 200. It should be noted that the part of the light which is not coupled into the vertical waveguides 290 by inner cladding 293 (which in the case of this example would be 91.74%) would be recycled back into the optical confinement regions of the laser diodes 231, 232, and 233 where it would be amplified by the active regions of laser diodes 231, 232, and 233 and then re-coupled into the vertical waveguides 290.

Although in the above exemplary embodiment of coupling of the vertical waveguides 290 through the use of multilayer thin cladding only a single layer was exemplified, multiple thin cladding layers could be used to alter the ratio of the light intensity coupled into the vertical waveguide 290 to that recycled back in the optical confinement regions of the laser diodes 231, 232, and 233. For example when two thin cladding layers are used with the outer cladding being 150-nm thick $Si_3N_4$ and the inner cladding being 100-nm thick $SiO_2$ in conjunction a $TiO_2$ waveguide core 291, approximately 7.9% of the laser light incident on the interface between the optical confinement regions of the laser diodes 231, 232, and 233 and the vertical waveguide 290 would be coupled into the waveguide core 291 and TIR-guided by the pixel's vertical waveguides 290 to be emitted perpendicular to the surface of the Quantum Photonic Imager device 200. The selection of the number of thin cladding layers used, their refractive index and thickness are design parameters that could be utilized to fine tune the coupling characteristics of the pixel's vertical waveguides 290, and subsequently the overall performance characteristics the Quantum Photonic Imager device 200.

Third embodiment of the Vertical Waveguides 290

In another embodiment of the Quantum Photonic Imager device 200 of this invention the core 291 of the pixel's vertical waveguides 290 would be coupled to the optical confinement regions of stacked laser diodes 231, 232, and 233 that form a single pixel 230 through the use of nonlinear optical (NLO) cladding. The primary advantage of this embodiment is that it would enable the Quantum Photonic Imager device 200 of this invention to operate as a mode-locked laser emissive device (mode-locking enables laser devices to emit ultra-short pluses of light). As a consequence of the mode-locked operation the Quantum Photonic Imager device 200 enabled by this embodiment, the Quantum Photonic Imager device 200 would achieve improved power consumption efficiency and a higher peak-to-average emitted light intensity. The mode-locked operation of this embodiment would be incorporated within the cladding 292 of the pixel's vertical waveguides 290 in conjunction with the vertical waveguide coupling method of the preceding embodiment.

This embodiment would be realized by adding a thin outer cladding layer 295, herein after will be referred to as the gate cladding layer, between the optical confinement regions of stacked laser diodes 231, 232, and 233 and the outer cladding layer 293 as illustrated in FIG. 8B. The gate cladding layer 295 would be a thin layer of an NLO material such as single crystal poly PTS polydiacetylene (PTS-PDA) or polydithieno thiophene (PDTT) or the like. The refractive index n of such NLO materials is not a constant, independent of the incident light, but rather its refractive index changes with increasing the intensity I of the incident light. For such NLO materials, the refractive index n obeys the following relationship to the incident light intensity:

$$n = n_0 + \chi^{(3)} I \quad (4)$$

In Equation (4) $\chi^{(3)}$ is the third order nonlinear susceptibility of the NLO material and $n_0$ is the linear refractive index value that the NLO material exhibits for low values of the incident light intensity I. In this embodiment the linear refractive index $n_0$ and thickness of the NLO material comprising the gate cladding layer 295 are selected such that at low incident light intensity I, substantially all of the light incident on the multilayer cladding 292 from the optical confinement regions of stacked laser diodes 231, 232, and 233 would be reflected back and recycled into the optical confinement regions of the laser diodes 231, 232, and 233 where it would be amplified by the active regions of laser diodes 231, 232, and 233.

As the light intensity within the optical confinement regions of the laser diodes 231, 232, and 233 increases due to the integration light flux, the refractive index n of the gate cladding layer 295 would change in accordance with Equation (4), causing the ratio of the light intensity that is recycled back into the optical confinement regions of the laser diodes 231, 232, and 233 to that coupled into the vertical waveguide 290 to decrease, thus causing a portion of the light flux integrated within the optical confinement regions of the laser diodes 231, 232, and 233 to be coupled into the vertical waveguide 290 and emitted perpendicular to the surface of the Quantum Photonic Imager device 200.

As the light is coupled into the waveguide 290, the integrated light flux within the optical confinement regions of the laser diodes 231, 232, and 233 would decrease, causing the intensity I of the light incident on the gate cladding layer 295 to decrease, which in turn would cause the refractive index n to change in accordance with Equation (4) causing the ratio of the light intensity that is recycled back into the optical confinement regions of the laser diodes 231, 232, and 233 to that that is coupled into the vertical waveguide 290 to increase, thus causing the cycle of light flux integration within the optical confinement regions of the laser diodes 231, 232, and 233 to be repeated.

In effect the use of the multilayer cladding that incorporates an NLO of this embodiment would cause the optical confinement regions of the pixel's laser diodes 231, 232, and 233 to operate as photonic capacitors which would periodically integrate the light flux generated by the pixel's laser diodes 231, 232, and 233 between periods during which the integrated light flux is coupled into the vertical waveguide 290 and emitted at the surface of the pixel 230 of the Quantum Photonic imager device 200.

When NLO gate cladding layer 295 is used in conjunction with the multilayer thin cladding of the vertical waveguide 290 coupling examples of the preceding embodiment, the coupling performance would be comparable except that the light coupled into the vertical waveguide 290 and emitted at the surface of the pixel 230 would occur as a train of pluses. When an NLO gate cladding layer 295 of PTS-PDA having a thickness of approximately 100-nm is used in conjunction with an approximately 100-nm thick of $SiO_2$ inner cladding 293 and titanium dioxide ($TiO_2$) is used as the waveguide core 291 material, the light pulses emitted from the surface of the pixel 230 would typically have a duration in the range of approximately 20-ps to 30-ps with an inter-pulse period in the range of approximately 50-ps to 100-ps. The selection of the number of thin cladding layers used in conjunction with NLO gate cladding layer 295, their refractive index and thicknesses are design parameters that could be utilized to fine tune the coupling characteristics of the pixel's vertical waveguides 290 as well as the pulsing characteristics of the multicolor laser light emitted from the pixel 230 and subsequently the overall performance characteristics the Quantum Photonic Imager device 200.

Fourth embodiment of the Vertical Waveguides 290

Figure 2D:
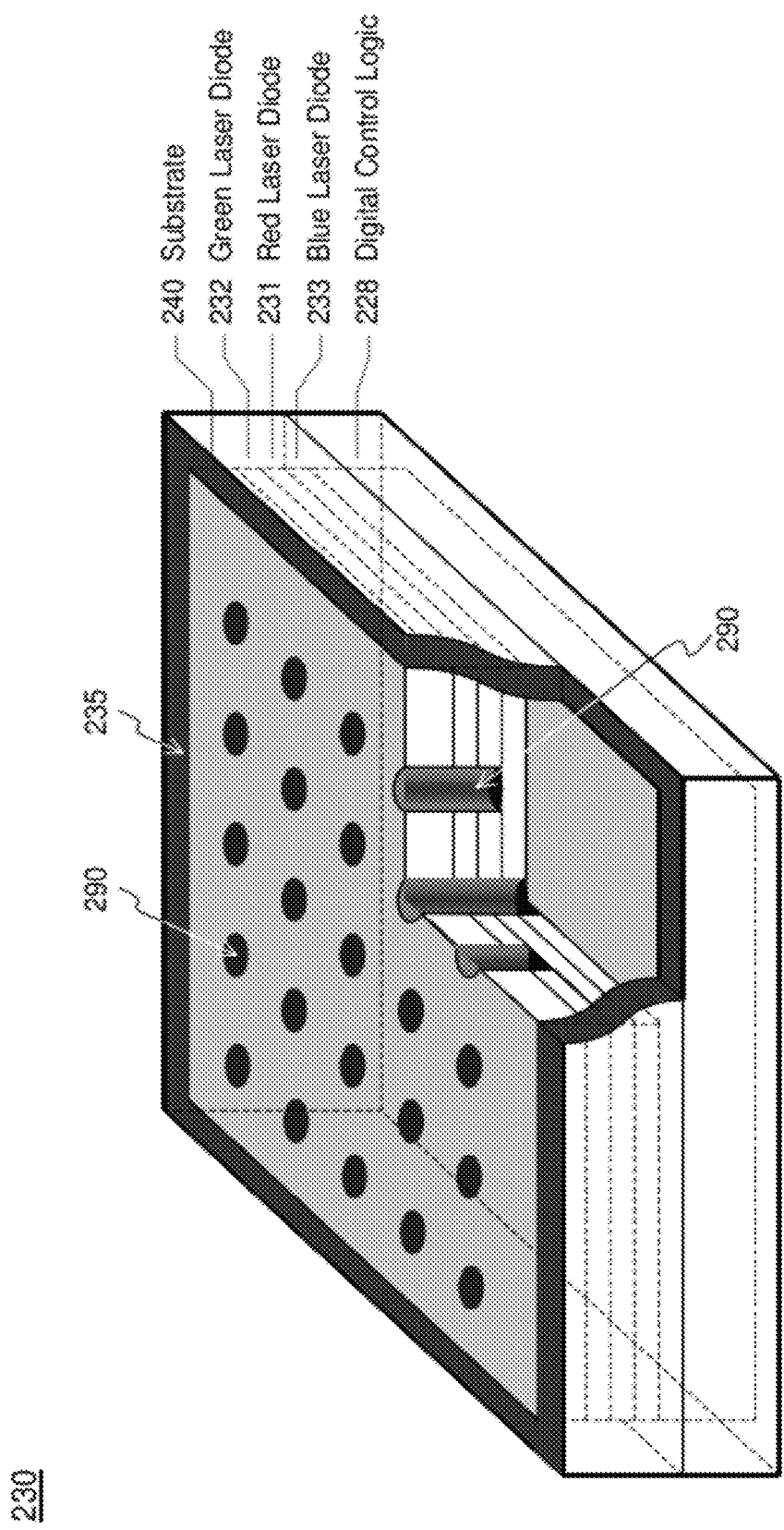
FIG. 2D illustrates an isometric view of an alternate Quantum Photonic imager device of this invention.

A fourth embodiment of vertical waveguides 290 may be seen in FIG. 2D. In this embodiment, waveguides terminate at the end of the optical confinement region of each laser diode, so that the waveguides terminating at the laser diode positioned at the top of the stack would couple light only from that laser diode and the waveguides terminating at the second from the top laser diode in the stack would couple light from first and second laser diodes and the waveguides terminating at the third laser diode from the top of the stack would couple light from the first, second and third laser diodes in the stack. Preferably these waveguides would be straight, not tapered. These waveguides may also be air filled or filled with a suitable dielectric, such as $SiO_2$. Using these differing height waveguides the amount of light coupled from the first laser diode in the stack would be higher than that coupled from the second laser diode in the stack and the amount of light coupled from the second laser diode in the stack would be higher than that coupled from the third laser diode in the stack. Since a satisfactory color gamut would include more green than red, and more red than blue, one might place the green diode on top, the red in the middle and the blue on the bottom of the stack.

Pixel Waveguide Array

As explained in the preceding discussion, each of the pixels 230 comprising the Quantum Photonic Imager device 200 would comprise a plurality of vertical waveguides 290 through which the laser light generated by the pixel's laser diodes 231, 232, and 233 would be emitted in a direction that is perpendicular to the surface of the Quantum Photonic Imager device 200. The plurality of pixel's vertical waveguides 290 would form an array of emitters through which the light generated the pixel's laser diodes 231, 232, and 233 would be emitted. Given the vertical waveguides 290 light coupling methods of the preceding first three embodiments, the light emitted from each of the pixel's vertical waveguides 290 would have a Gaussian cross-section having an angular width of approximately ±20 degrees at half its maximum intensity. In the preferred embodiment of the Quantum Photonic Imager device 200, the plurality of the pixel's vertical waveguides 290 would be arranged in a number and a pattern that is selected to reduce the maximum divergence angle (collimation angle) of the light emitted from surface of the pixel 230, to provide a uniform brightness across the area of the pixel, and to maximize pixel brightness.

In using well known theories of phased emitter arrays Ref. [41], the angular intensity of the light emitted by the pixels 230 within the meridian plane comprising N of the pixel's vertical waveguides 290 would be given by;

$$I(\theta)=E(\theta)\{J_1[aX(\theta)]/aX(\theta)\}^2\{\text{Sin }[NdX(\theta)]/\text{Sin }[dX(\theta)]\}^2 \quad (5.a)$$

Where;

$$X(\theta)=(\pi \text{ Sin }\theta)/\lambda \quad (5.b)$$

$J_1$ (.) the Bessel function, $\lambda$ is the wavelength of the light emitted by the pixel's vertical waveguides 290, a is the diameter of the vertical waveguides 290, d is the center-to-center distance between the pixel's vertical waveguides 290 and $E(\theta)$ is the intensity profile of the light emitted from each the pixel's vertical waveguides 290, which as stated earlier would typically be a Gaussian profile having an angular width of approximately ±20 degrees at half its maximum intensity. Preferably the parameter a, the diameter (index guiding diameter) of the pixel's vertical waveguides 290 at the center of the coupling region with each of the laser diodes 231, 232, and 233 would equal to the wavelength of the respective laser diode. The typical value of the parameter d, the center-to-center distance between the pixel's vertical waveguides 290, would be at least 1.2a and its specific value would be selected to fine tune emission characteristics of the pixel 230.

Figure 9A:
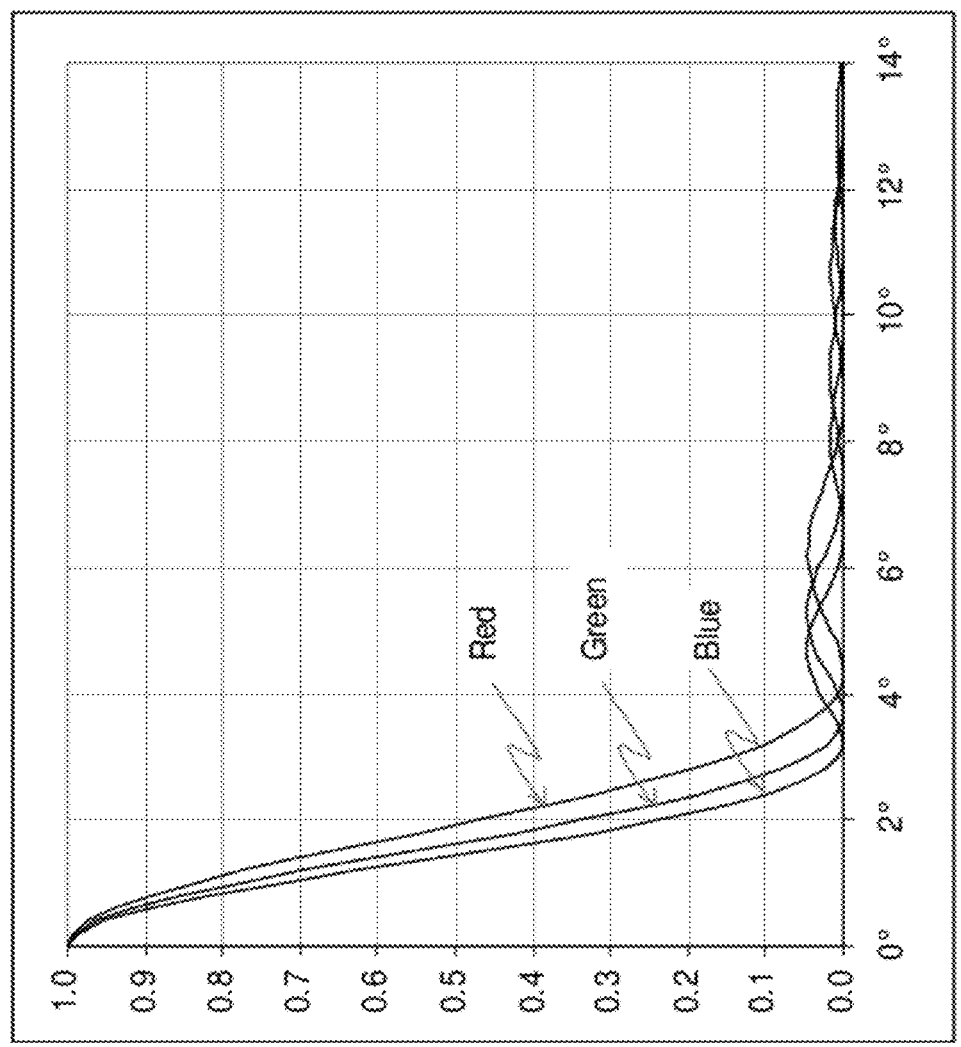
FIG. 9A illustrates the intensity profile of the light emitted by the multicolor laser imager of this invention.

FIG. 9A illustrates the angular intensity of the light emitted by 10×10 micron pixels 230 comprising an array of 9×9 uniformly spaced vertical waveguides 290, having a diameter a as specified above and center-to-center d=2a, within the meridian plane containing the diagonal of the pixel at the multiple values of wavelength emitted by the pixels 230. Specifically, in FIG. 9A the profiles 910, 920 and 930 illustrate the angular intensity of the light emitted by the pixels 230 at the red wavelength (615-nm), the green wavelength (520-nm), and the blue wavelength (460-nm). As illustrated in FIG. 9A, the multicolor laser light emitted by the pixel 230, and subsequently the Quantum Photonic image 200, would have a tightly collimated emission pattern with collimation angle well within ±5°, thus making the Quantum Photonic Imager device 200 to have an optical f/# of approximately 4.8.

Figure 9B:
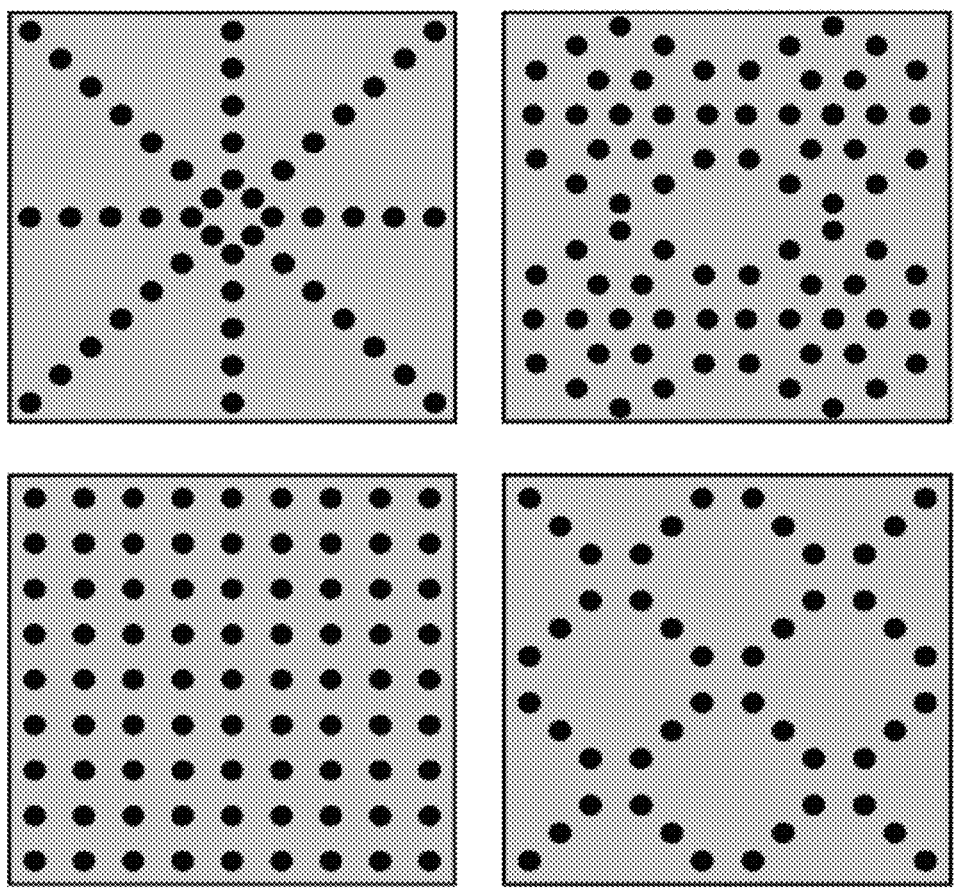
FIG. 9B illustrates the multiplicity of patterns in which the vertical waveguides of the multicolor laser imager of this invention can be arranged.

The pattern of the vertical waveguides 290 within the pixel 230 surface could be tailored to achieve the required emission characteristics in terms of the optical f/# for the Quantum Photonic Imager device 200. The important design criterion in creating the pattern of the vertical waveguides 290 is to generate a uniform emission at the required optical f/# while retaining sufficient area for the pixel's light generating laser diodes 231, 232, and 233 after the array of vertical waveguides 290 are etched. FIG. 9B illustrates several possible patterns of the vertical waveguides 290 within the pixel 230 surface that could be used in conjunction with the Quantum Photonic Imager device 200 of this invention. Based on the teachings of this invention, a person skilled in the art would know how to select the pattern of the vertical waveguides 290 within the pixel 230 surface that would generate the light emission optical f/# that is best suited for the intended application of the Quantum Photonic Imager device 200 of this invention.

Digital Structure

FIG. 10A illustrates a vertical cross-section of the digital semiconductor structure 220 of the Quantum Photonic Imager device 200. The digital semiconductor structure 220 would be fabricated with conventional CMOS digital semiconductor techniques, and as illustrated in FIG. 10A, would be comprised of the multiple metal layers 222, 223, 224 and 225, separated by thin layers of insulating semiconductor material such as $SiO_2$, and digital control logic 226 deposited using conventional CMOS digital semiconductor techniques on the Si-substrate 227.

Figure 10B:
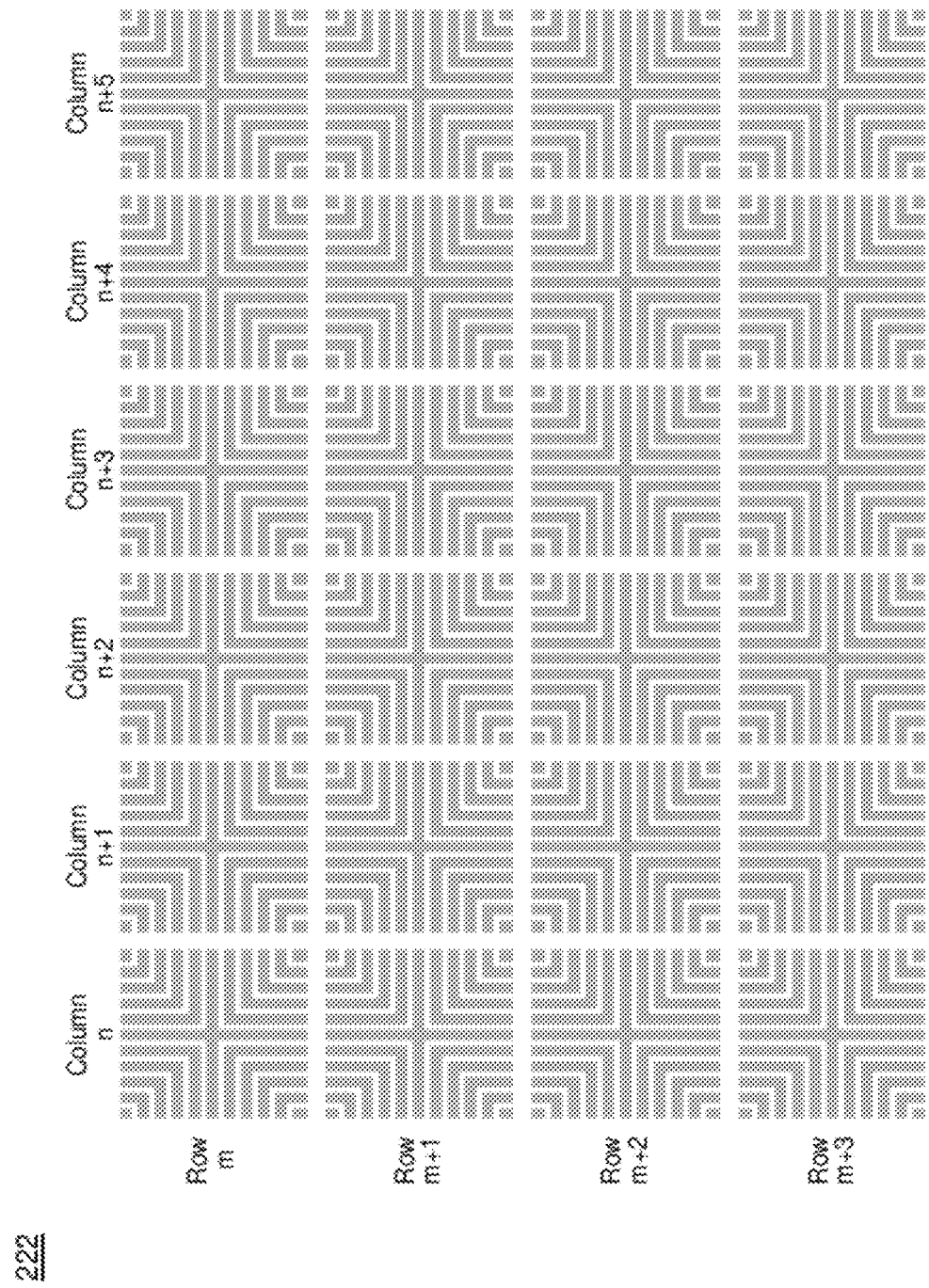
FIG. 10B illustrates the layout of contact metal layer interfacing the photonic and digital semiconductor structures of the Quantum Photonic Imager device of this invention.

As illustrated in FIG. 10B, the metal layer 222 would incorporate a plurality of pixel's contact pad patterns whereby each contact pad pattern would be substantially identical to that of the pixel contact pad pattern of the photonic semiconductor structure 210 illustrated in FIG. 7. The plurality of pixel contact pad patterns of the metal layer 222 would constitute the bonding interface between the photonic semiconductor structure 210 and the digital semiconductor structure 220 as explained earlier. The metal layer 222 would also incorporate at its periphery the device contact bonding pads 221 of the entire Quantum Photonic Imager device 200 as illustrated in FIG. 2C.

Figure 10C:
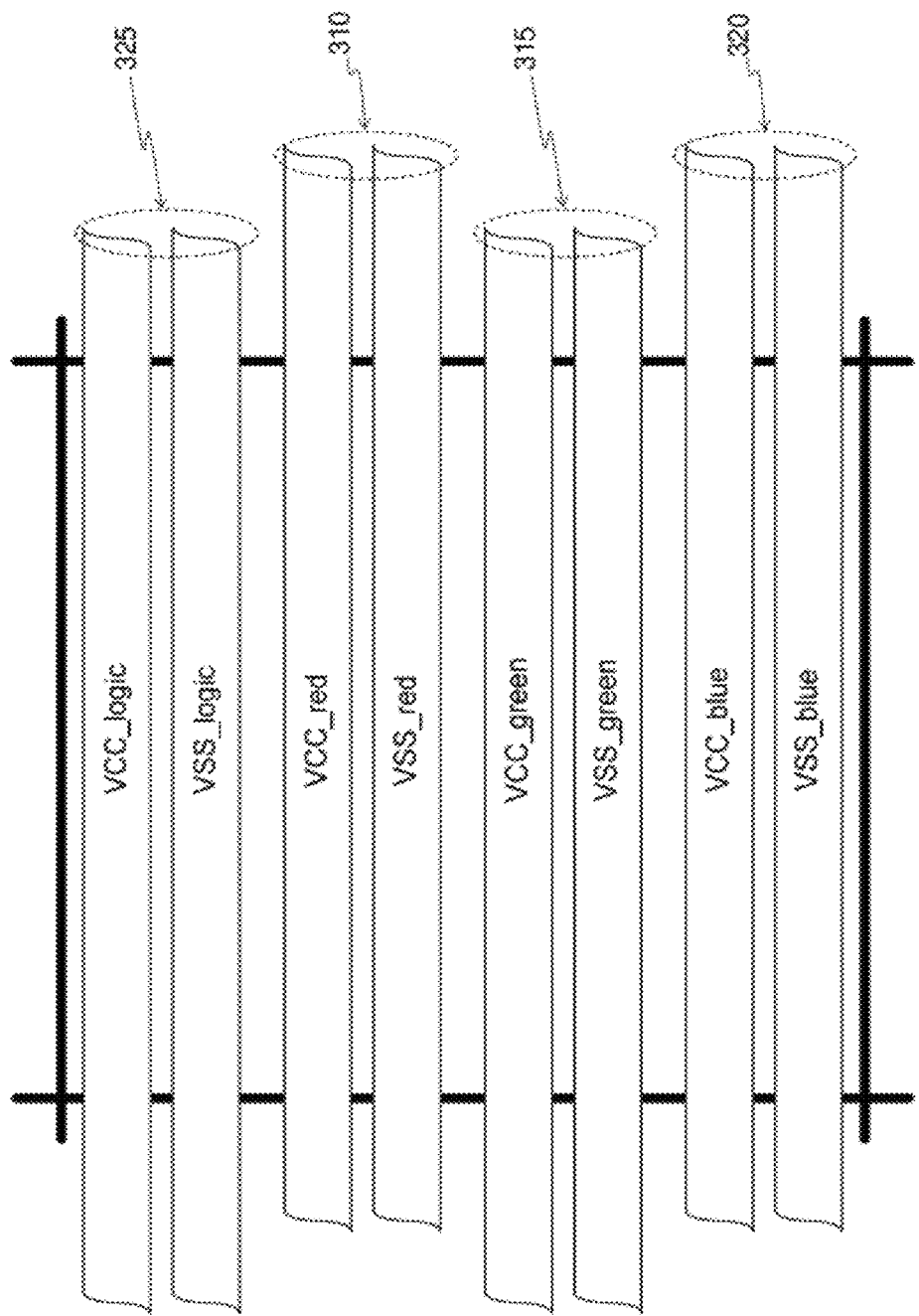
FIG. 10C illustrates the layout of the metal layers used for power signals within the Quantum Photonic Imager device of this invention.
Figure 10D:
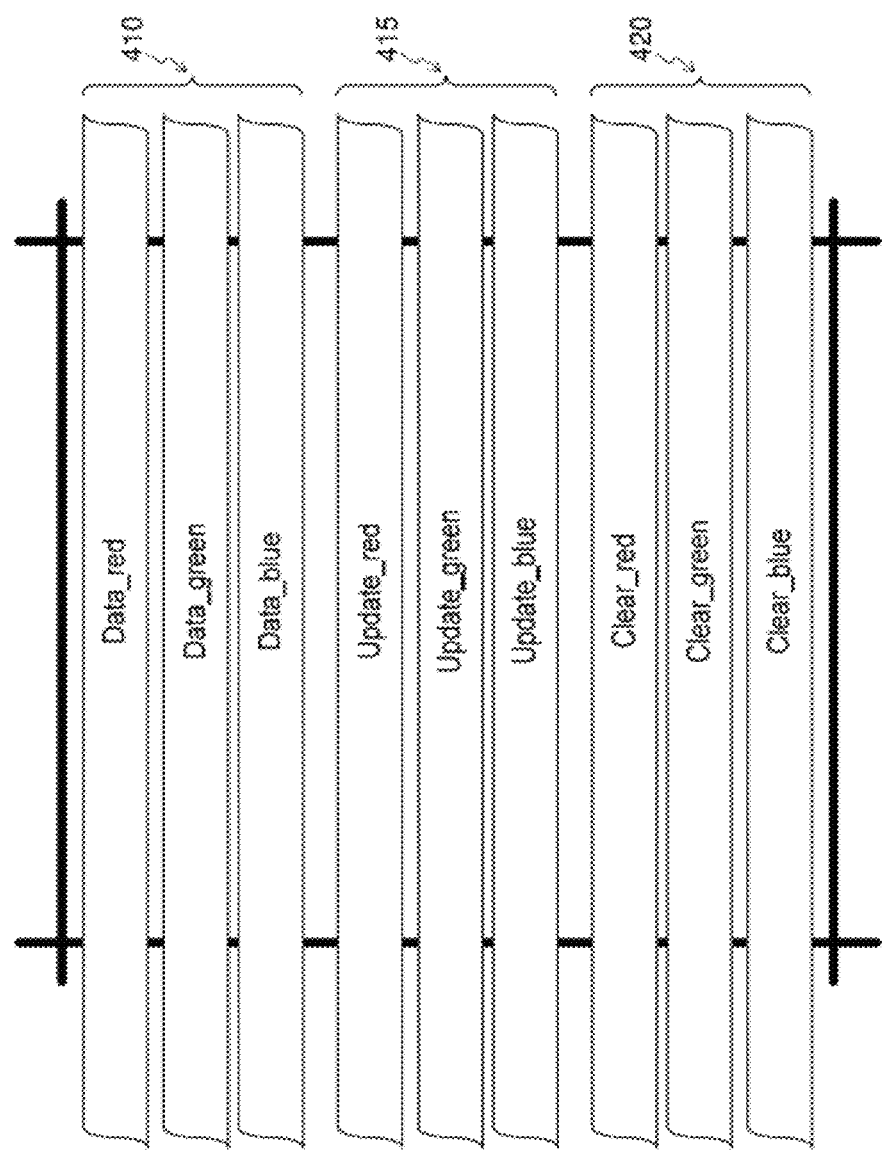
FIG. 10D illustrates the layout of the metal layers used for routing load and enable signals within the Quantum Photonic Imager device of this invention.

FIG. 10C illustrates the layout of the metal layer 223 which incorporate separate power and ground metal rails 310, 315 and 320 designated for distributing power and ground to the pixel's red, green and blue laser diodes 231, 232, and 233; respectively, and the metal rails 325 which are designated for routing power and ground to the digital logic portion of the digital semiconductor structure 220. FIG. 10D illustrates the layout of the metal layer 224 which incorporates separate metal traces designated for distributing data 410, update 415 and clear 420 signals to the digital control logic semiconductor structure 226 section designated for controlling the on-off states of the pixels' red, green and blue laser diodes 231, 232, and 233, respectively. FIG. 10E illustrates the layout of the metal layer 225 which incorporates separate metal traces designated for distributing the load 510 and enable 520 signals to the digital control logic semiconductor structure 226 section designated for controlling the on-off states of the pixel's red, green and blue laser diodes 231, 232, and 233, respectively.

Figure 11A:
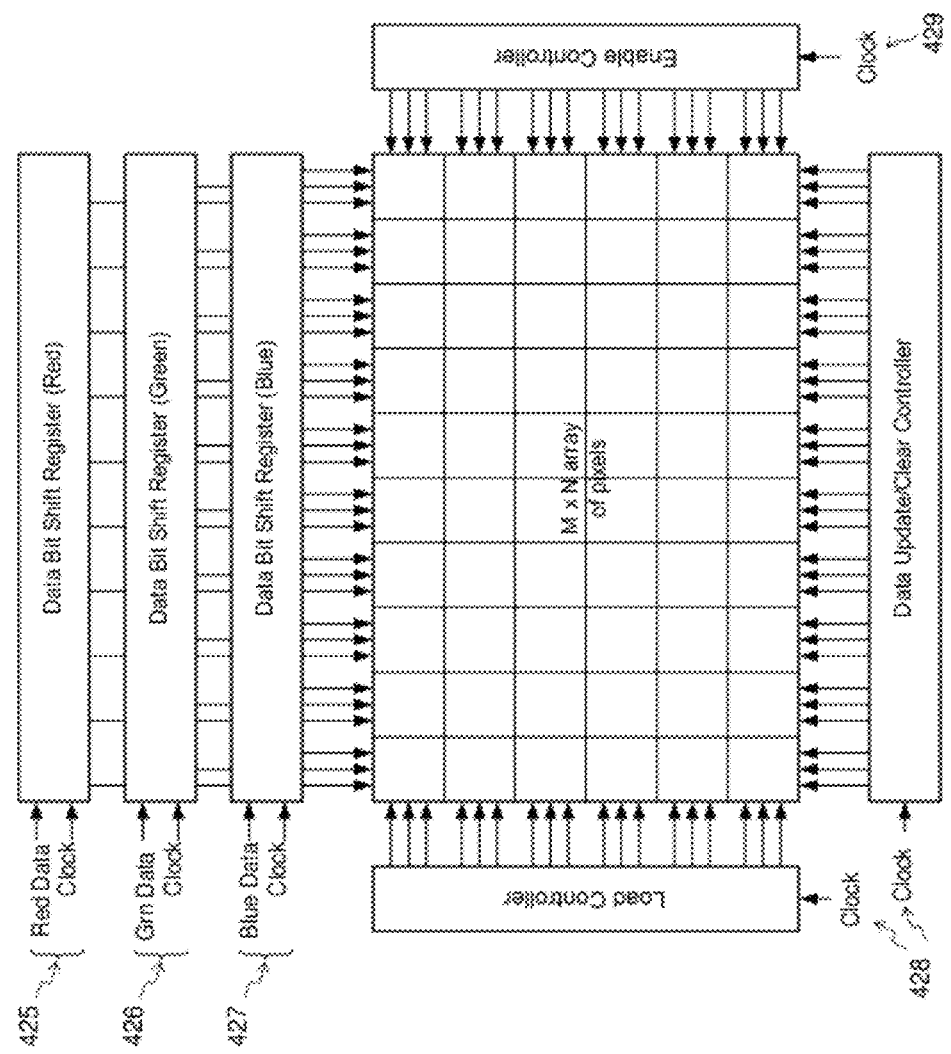
FIG. 11A illustrates the digital control logic of the Quantum Photonic Imager device of this invention.

The digital control logic semiconductor structure 226 would be comprised of the pixels' digital logic section 228, which is positioned directly under the photonic semiconductor structure 210 (FIG. 2B), and the control logic region 229 which is positioned at the periphery of the digital logic region 228 as illustrated in FIG. 2C. FIG. 11A illustrates an exemplary embodiment of the control logic section 229 of the digital control logic semiconductor structure 226, which is designed to accept red, green and blue PWM serial bit stream input data and clock signals 425, 426, and 427, respectively, which are generated external to the Quantum Photonic Imager device 200, plus the control clock signals 428 and 429, and covert the accepted data and clock signals into the control and data signals 410, 415, 420, 510 and 520 which are routed to the digital logic section 228 via the interconnect metal layers 224 and 225.

Figure 11B:
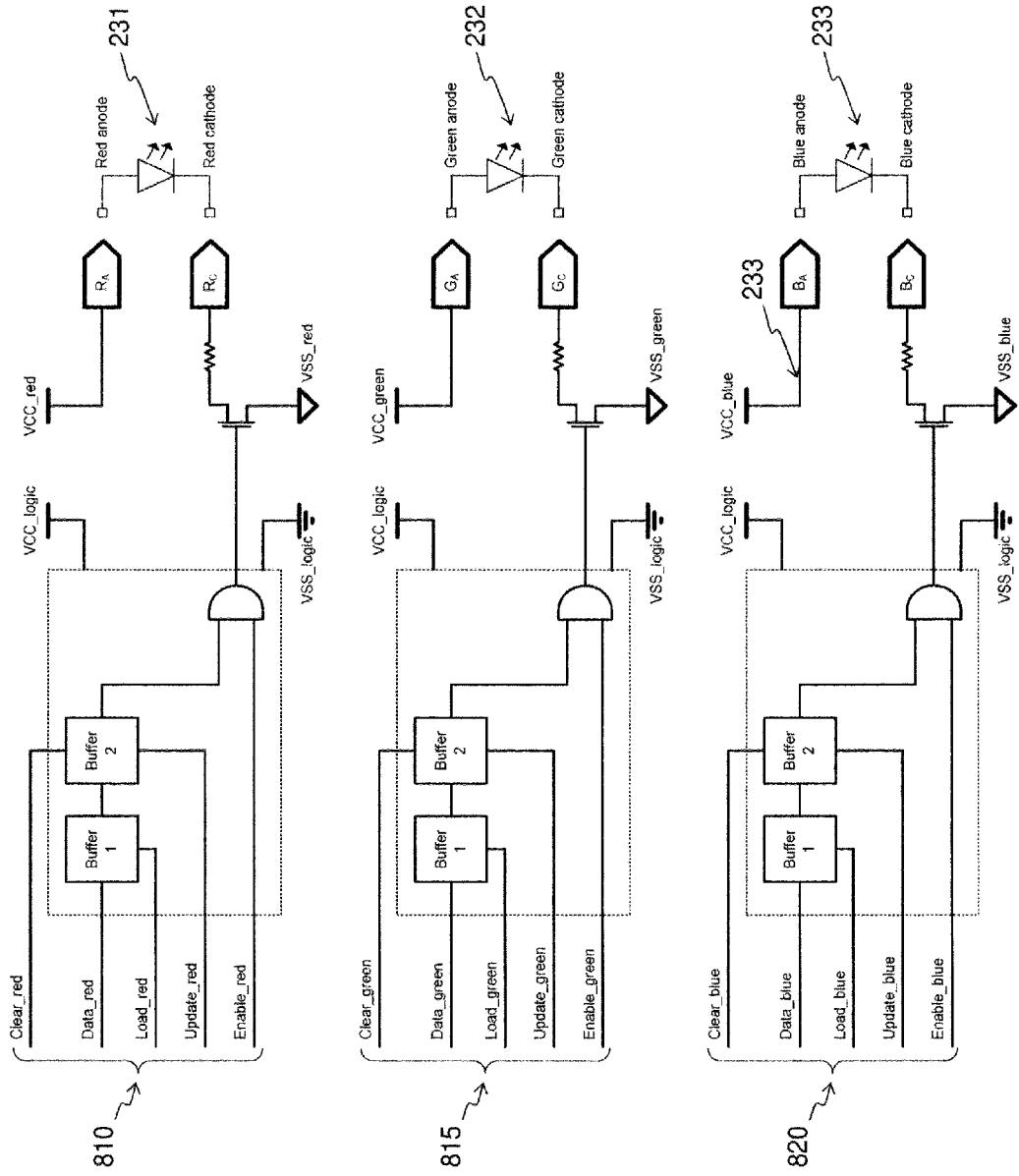
FIG. 11B illustrates the digital logic cell associated with each of the pixels comprising the Quantum Photonic Imager device of this invention.

The digital logic section 228 of the digital control logic semiconductor structure 226 would be comprised of two dimensional arrays of pixels logic cells 300 whereby each such logic cell would be positioned directly under one of the pixels 230 comprising the Quantum Photonic Imager device 200. FIG. 11B illustrates an exemplary embodiment of the digital logic cell 300 comprising the digital logic section 228 of the digital control logic semiconductor structure 226. As illustrated in FIG. 11B, the pixel logic cell 300 associated with each of the pixels comprising the Quantum Photonic Imager device 200 would be comprised of the digital logic circuits 810, 815 and 820 corresponding with the red, green and blue pixel's laser diodes 231, 232, and 233, respectively. As illustrated in FIG. 11B, the digital logic circuits 810, 815 and 820 would accept the control and data signals 410, 415, 420, 510 and 520 and based on the accepted data and control signals would enable connectivity of the power and ground signals 310, 315 and 320 to the red, green and blue pixel's laser diodes 231, 232, and 233, respectively.

The digital semiconductor structure 220 would be fabricated as a monolithic CMOS wafer that would incorporate a multiplicity of digital semiconductor structures 220 (FIG. 2A). As explained earlier, the digital semiconductor structure 220 would be bonded with the photonic semiconductor structure 220 using wafer-level direct bonding techniques or the like to form an integrated multi wafer structure which would then be etched at the periphery of each single Quantum Photonic Imager device 200 die area in order to expose the device contact bonding pads 221, then would be cut into individual Quantum Photonic Imager device 200 dies illustrated in FIG. 2A and FIG. 2C. Alternatively, the digital semiconductor 210 wafer would be cut into dies and separately the photonic semiconductor structure 210 wafer would also be cut into dies, each having an area that contains the required number of pixel's laser diodes 231, 232, and 233, and then each the photonic semiconductor structure 210 die would be die-level bonded using flip-chip techniques or the like to the digital semiconductor 210 die to form a single Quantum Photonic Imager device 200 illustrated in FIG. 2A and FIG. 2C.

QPI Fabrication Flow

Figure 12:
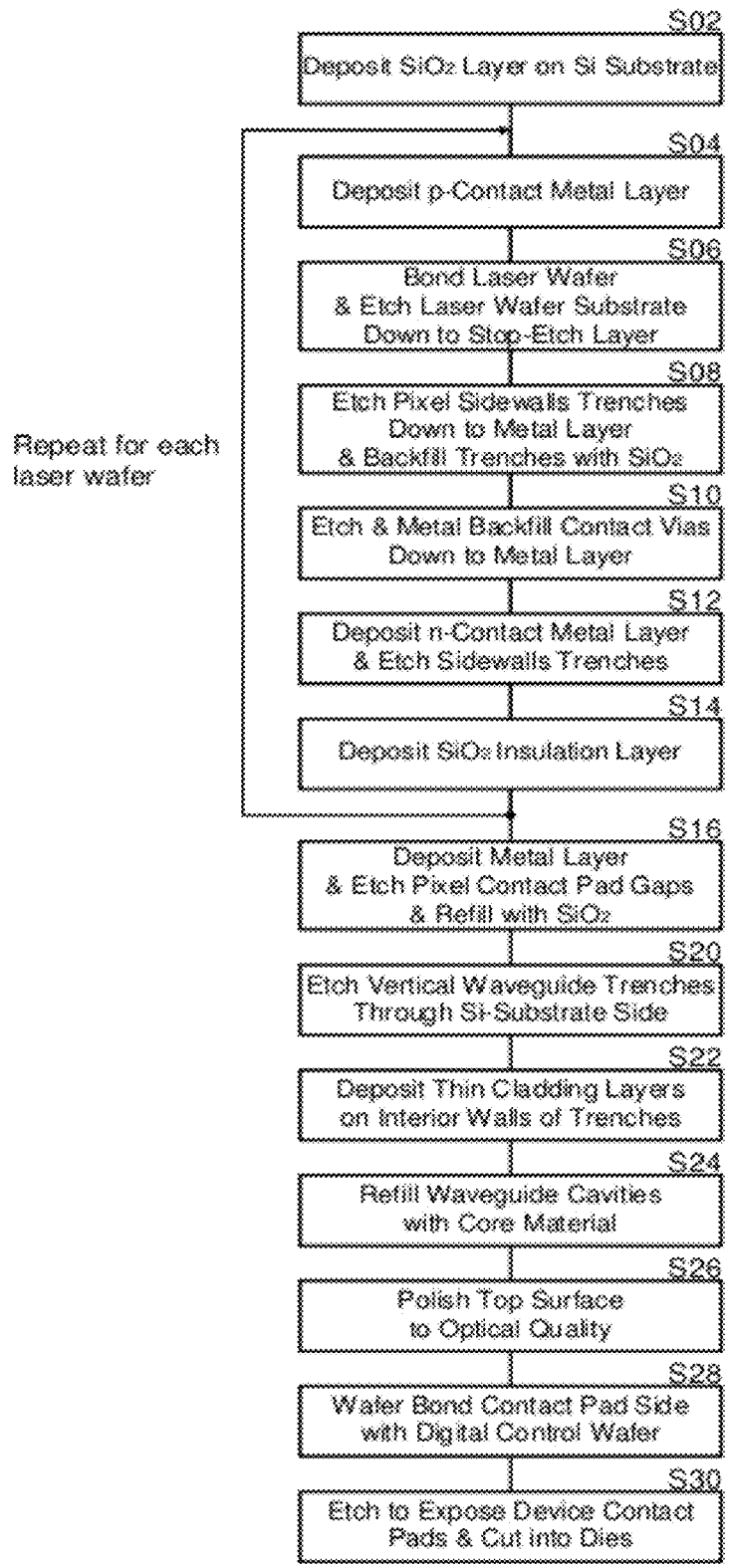
FIG. 12 illustrates a semiconductor process flow used to fabricate the Quantum Photonic imager device of this invention.

FIG. 12 is a flow chart that illustrates the semiconductor process flow that would be used to fabricate the Quantum Photonic Imager device 200 in accordance with the exemplary embodiment described in the preceding paragraphs. As illustrated in FIG. 12, the process starts with step S02 and continues to step S30, during which various wafers are bonded, and insulation and metal layers are deposited, interconnect vias, sidewalls and vertical waveguides are formed. It should be noted that the semiconductor fabrication flow of the laser diode multilayer semiconductor structures 250, 260 and 270 as well as the digital semiconductor structure 220 would be performed separately and external to the fabrication process flow illustrated in FIG. 12, which is meant to illustrate an exemplary embodiment of the semiconductor process flow of bonding these wafers and forming the pixel structures 230 and interconnects.

In step S02 the SiO$_2$ insulation layer 241 would be deposited on the base Si-substrate 240 wafer. In step S04 the p-contact metal layer would be deposited and in step S06 the formed stack would be bonded with laser diode multilayer semiconductor wafer and the laser diode wafer is etched down to the stop-etch layer. In step S08 the pixel sidewalls trenches are double etched first down to the insulation layer preceding the metal layers deposited in step S04 then down to the metal layer deposited in step S04 and the etched trenches are then refilled with SiO$_2$. In step S10 the trenches for the pixels vertical contact vias are etched down to the metal layer deposited in step S04 then a thin insulation layer is deposited and etched to expose the deposited vias. In step S12 the n-contact metal layer would be deposited then etched to extend the height of the pixels' sidewall trenches. In step S14 an insulation layer of SiO$_2$ is deposited then the process flow of steps S04 through S14 is repeated for each of the laser diode multilayer semiconductor wafers that would be incorporated into the Quantum Photonic Imager device 200.

In step S16 the metal layer required for forming the bonding contact pad 700 is deposited then etched to form the contact pad pattern illustrated in FIG. 7. In step S20 the vertical waveguides 290 are etched through the Si-substrate side of the formed multilayer structure to form the pixels' 230 waveguide pattern such as those illustrated in FIG. 9B. In step S22 the waveguide cladding layers 292 are deposited and then the waveguide cavities are refilled with the waveguide core 291 material in step S24. In step S26 the Si-substrate side of the formed multi-layer laser diode structure is polished to optical quality and coated as required to form the emissive surface of the Quantum Photonic Imager device 200. Steps S02 through S28 would result in a wafer-size photonic semiconductor structure 210 which would be wafer-level pad-side bonded with the digital semiconductor structure 220 wafer in step S28.

In step S30 the resultant multi-wafer stack is etched to expose the contact pads 221 of the individual dies Quantum Photonic Imager device 200 and the multi-wafer stack is cut into individual dies of the Quantum Photonic Imager device 200.

An alternative approach to the process of step S30 would be to cut the photonic semiconductor structure 210 formed by the process steps S02 through S26 into the die size required for the Quantum Photonic imager device 200 and separately cut the digital semiconductor structure 220 wafer into dies then pad-side bond the two dies using flip-chip technique to form the individual dies of the Quantum Photonic Imager device 200.

QPI Projector

Figure 13:
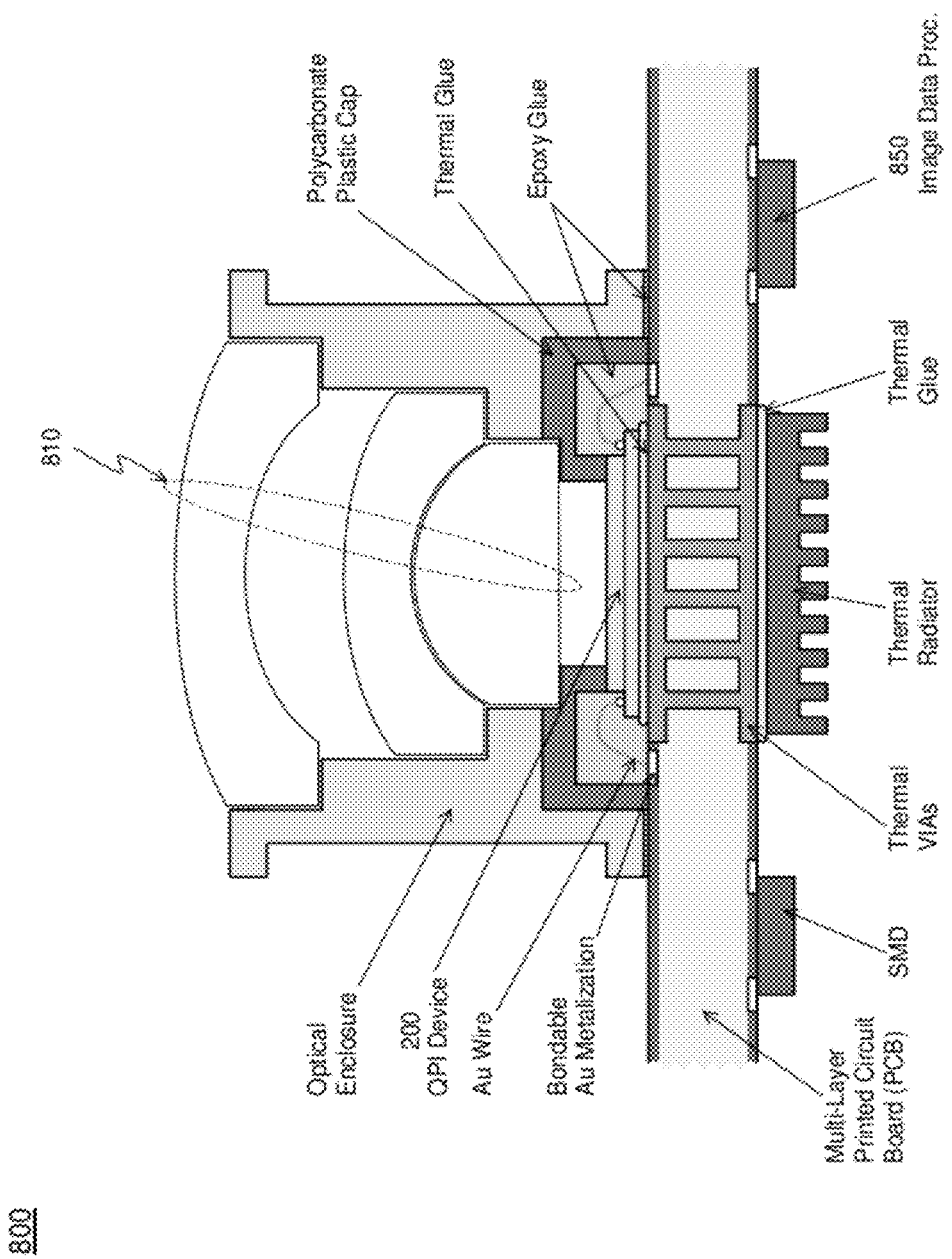
FIG. 13 illustrates a cross-sectional view of an exemplary projector that uses the Quantum Photonic imager device of this invention as digital image source.

The Quantum Photonic Imager device 200 would typically be used as a digital image source in digital image projectors used in front or rear projection display systems. FIG. 13 illustrates an exemplary embodiment of a typical digital image projector 800 that incorporates the Quantum Photonic Imager device 200 of this invention as a digital image source. The Quantum Photonic Imager device 200 would be integrated on a printed circuit board together with a companion digital device 850 (which will be referred to as the image data processor and will be functionally described in subsequent paragraphs) that would be used convert the digital image input into the PWM formatted input to the Quantum Photonic Imager device 200. As illustrated in FIG. 13, the emissive optical aperture of the Quantum Photonic Imager device 200 would be coupled with a projection optics lens group 810 which would magnify the image generated by the Quantum Photonic Imager device 200 to the required projection image size.

As explained earlier, the light emitted from Quantum Photonic Imager device 200 would typically be contained within an optical f/# of approximately 4.8, which makes it possible to use few lenses (typically 2 or 3 lenses) of moderate complexity to achieve source image magnification in the range between 20 to 50. Typical digital projectors that use existing digital imagers such as micro-mirror, LCOS or HTPS imager devices having an optical f/# of approximately 2.4, would typically requires as many as 8 lenses to achieve a comparable level of source image magnification. Furthermore, typical digital projectors that use passive (meaning reflective or transmissive type) digital imagers such as micro-mirror, LCOS or HTPS imager devices would require a complex optical assembly to illuminate the imager. In comparison, since the Quantum Photonic Imager device 200 is an emissive imager, the digital image projector 800 which uses the Quantum Photonic Imager device 200 would not require any complex optical illumination assembly. The reduced number of lenses required for magnification plus the elimination of the illumination optics would make the digital image projector 800 which uses the Quantum Photonic Imager device 200 substantially less complex and subsequently more compact and less costly than digital projectors that use existing digital imagers such as micro-mirror, LCOS or HTPS imager devices.

OPI Device Efficiency

An important aspect of the Quantum Photonic Imager device 200 of this invention is its luminance (brightness) performance and its corresponding power consumption. A single 10×10 micron pixel 230 having the laser diode structures 231, 232, and 233 of the preceding exemplary embodiment as specified in FIG. 4A, FIG. 4B and FIG. 4C, respectively, would consume approximately 4.5 µW, 7.4 µW and 11.2 µW to generate a radiant flux of approximately 0.68 µW, 1.1 µW and 1.68 µW of red (615-nm), green (520-nm) and blue (460-nm); respectively, which equates to 1 milli lumen of luminous flux at color temperature of 8,000 K°. In other words, the single 10×10 micron pixel 230 of the Quantum Photonic Imager device 200 would consume approximately 23 µW to generate approximately 1 milli lumen of luminous flux at color temperature of 8,000 K°, which would be sufficient to provide a brightness of more than 1,200 candela/meter$^2$ when the pixel is magnified to 0.5×0.5 millimeter. At the brightness provided by most existing commercial displays, which typically ranges between 350 candela/meter$^2$ to 500 candela/meter$^2$, the single 10×10 micron pixel 230 of the Quantum Photonic Imager device 200 when magnified in size to 0.5×0.5 millimeter would consume less than 10 µW, which is nearly one and a half orders of magnitude less than the power consumption required by existing commercial displays such as PDP, LCD or projection displays that use a micro-mirrors, LCOS or HTPS devices.

As a direct result of the elimination of the inefficiencies associated with illumination optics and the imager optical coupling required in all projectors that use existing digital imagers such as micro-mirror, LCOS or HTPS imager devices, the Quantum Photonic Imager device 200 of this invention would achieve substantially higher efficiency when compared to existing digital imagers. Specifically, the losses associated with the digital projector 800 illustrated in FIG. 13 that uses the Quantum Photonic Imager 200 of this invention would be limited to the losses due to projection optics lens group 810, which would approximately be about 4%. Meaning that the efficiency of the digital projector 800 illustrated in FIG. 13 that uses the Quantum Photonic Imager 200 in terms of the ratio of projected luminous flux to the generated luminous flux would be approximately 96%, which is substantially higher than the efficiency of less than 10% achieved by projectors that use existing digital imagers such as micro-mirror, LCOS or HTPS imager devices.

For example, the digital projector 800 illustrated in FIG. 13 that uses the Quantum Photonic Imager 200 of this invention having one million pixels would consume approximately 25.4 watts to generate approximately 1,081 lumens of luminous flux at color temperature of 8,000 K°, which would be sufficient to project an image having 60" diagonal at a brightness of approximately 1,000 candela/meter$^2$ on a front projection screen. When the efficiency of a typical projection screen is taking into account, the cited example of the digital projector 800 would project an image with brightness of approximately 560 candela/meter$^2$ on a rear projection screen. For comparison purposes the power consumption of a typical existing rear projection displays that achieve brightness in the range of 350 candela/meter$^2$ would be in excess of 250 watts, which indicates that the digital projector 800 that uses the Quantum Photonic Imager 200 as an image source would achieve a much higher projected image brightness than existing front and rear projection displays, yet at a substantially lower power consumption.

OPI Advantages & Applications

The compactness and low cost characteristics of the digital image projector 800 which uses the Quantum Photonic Imager device 200 when combined with the low power consumption of the Quantum Photonic Imager device 200 would make it possible to design and fabricate digital image projectors that can be effectively embedded in mobile platforms such as cell phones, laptop PC or comparable mobile devices. In particular, the digital projector 800 that uses the Quantum Photonic Imager 200 of this invention such as that illustrated in FIG. 13 having 640×480 pixels and designed to achieve ±25 degrees projection field of view would achieve approximately 15×15 mm volume and would consume less than 1.75 watts to project 18" projected image diagonal with brightness of approximately 200 candela/meter$^2$ (for reference purposes, the typical brightness of a laptop PC is approximately 200 candela/meter$^2$).

Because of its compactness and low power consumption, the Quantum Photonic Imager 200 of the invention would also be suitable for near-eye applications such as helmet-mounted displays and visor displays. Furthermore, because of its ultra-wide gamut capabilities, the Quantum Photonic Imager 200 of the invention would also suitable for applications requiring realistic image color rendition such as simulator displays and gamming displays.

QPI Operation

With its pixel-based laser light generating capabilities described in the preceding paragraphs, the Quantum Photonic Imager device 200 will be able to convert the digital source image data received from an external input into an optical image which would be coupled into the projection optics of the projector 800 as illustrated in FIG. 13. In using the Quantum Photonic Imager device 200 of this invention to synthesize the source image, the luma (brightness) and chroma (color) components of each of the image pixels would be simultaneously synthesized through apportioned setting of the on/off duty cycle of the corresponding pixel's red, green and blue laser diodes 231, 232, and 233. Specifically, for each of the source image pixels, the chroma component of the pixel would be synthesized by setting the corresponding pixel's red, green and blue laser diodes 231, 232, and 233 on/off duty cycle relative ratios that reflect the required color coordinates for the pixel. Similarly, for each of the source image pixels, the luma component of the pixel would be synthesized by setting the on/off duty cycle of the corresponding pixel's light generating red, green and blue laser diodes 231, 232, and 233 collective on/off duty cycle values that reflect the required brightness for the pixel. In other words, the pixel's luma and chroma components of each of the source image pixels would be synthesized by controlling the on/off duty cycle and the simultaneity of the corresponding pixel's light generating red, green and blue laser diodes 231, 232, and 233 of the Quantum Photonic Imager device 200.

Figure 14A:
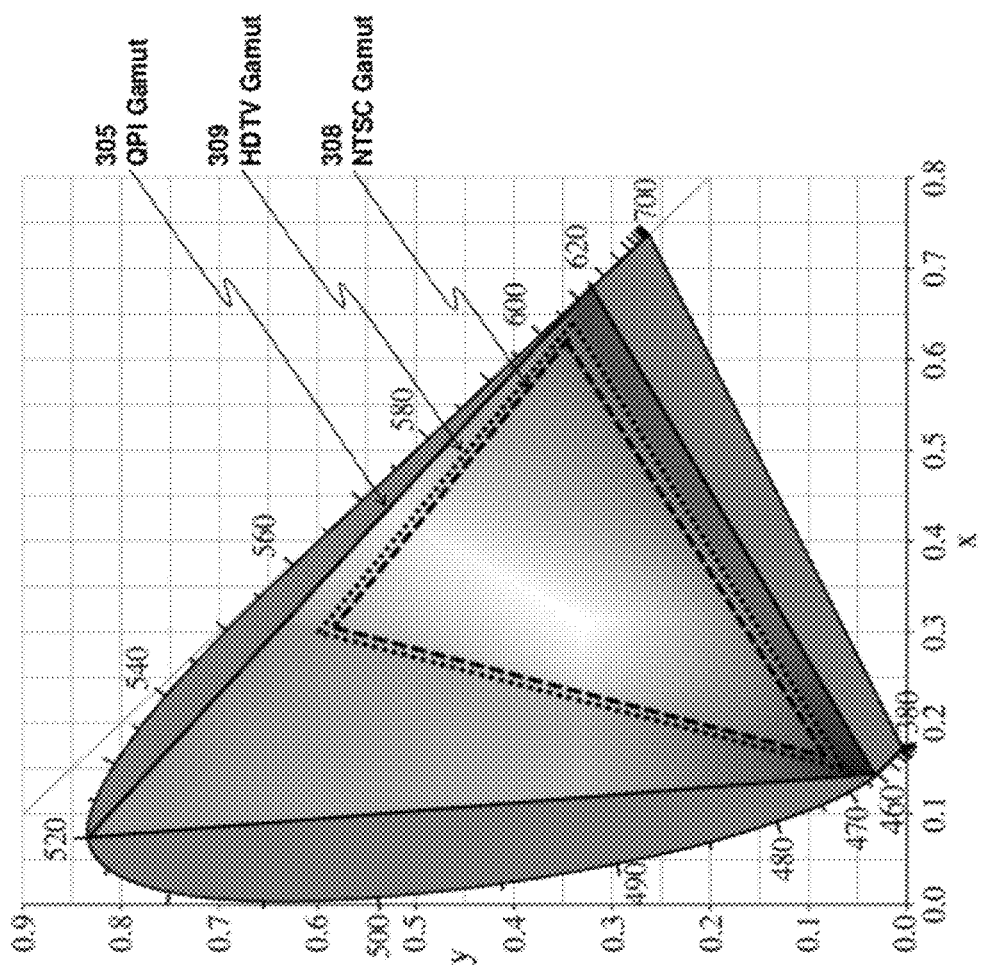
FIG. 14A illustrates the color gamut of the Quantum Photonic imager device of this invention.

By controlling the on/off duty cycle and simultaneity of the pixel's laser diodes 231, 232, and 233 having the selected wavelengths of the exemplary embodiment of the Quantum Photonic Imager device 200 described in the preceding paragraphs of 615-nm for the pixel's red laser diodes 231, 520-nm for the pixel's green laser diode 232, and 460-nm for the pixel's blue laser diode 233, the Quantum Photonic Imager device 200 of this invention would be able to synthesize any pixel's color coordinate within its native color gamut 905 illustrated in FIG. 14A in reference to the CIE XYZ color space. Specifically, the aforementioned operational wavelengths of the exemplary embodiment of the Quantum Photonic Imager device 200 pixel's laser diodes 231, 232, and 233 would define the vertices 902, 903 and 904; respectively, of its native color gamut 905 as illustrated in FIG. 14A in reference to the CIE XYZ color space.

The specific color gamut of the source image would typically be based on image color standards such as NTSC and HDTV standards. For comparison purposes, the display color gamut standards of NTSC 308 and HDTV 309 are also shown on FIG. 14A as a reference to illustrate that the native color gamut 305 of the exemplary embodiment the Quantum Photonic Imager device 200 defined by the color primaries wavelengths for red at 615-nm, green at 520-nm and blue at 460-nm would include the NTSC 308 and HDTV 309 color gamut standards and would extend beyond these color gamut standards by a significant amount.

Given the extended native color gamut 305 of the Quantum Photonic Imager device 200 illustrated in FIG. 14A, the source image data would have to be mapped (converted) from its reference color gamut (such as that illustrated in FIG. 14A for the NTSC 308 and the HDTV 309 color gamut) to the native color gamut 305 of the Quantum Photonic Imager device 200. Such a color gamut conversion would be accomplished by applying the following matrix transformation on the [ft G, and B] components of each of the source image pixels:

$$\begin{bmatrix} R_{QPI} \\ G_{QPI} \\ B_{QPI} \end{bmatrix} = M \cdot \begin{bmatrix} R \\ G \\ B \end{bmatrix} \quad (6)$$

Where the 3×3 transformation matrix M would be computed from the chromaticity values of the coordinates of the white point and color primaries of the source image color gamut and the coordinates of the white point and color primaries 902, 903 and 904 (FIG. 14B) of the Quantum Photonic Imager device 200 within a given the reference color space, such as CIE XYZ color space for example. The result of the matrix transformation defined by Equation (6) would define the components of the source image pixel $[R_{QPI}, G_{QPI}, B_{QPI}]$ with respect to the native color gamut 305 of the Quantum Photonic Imager device 200.

Figure 14B:
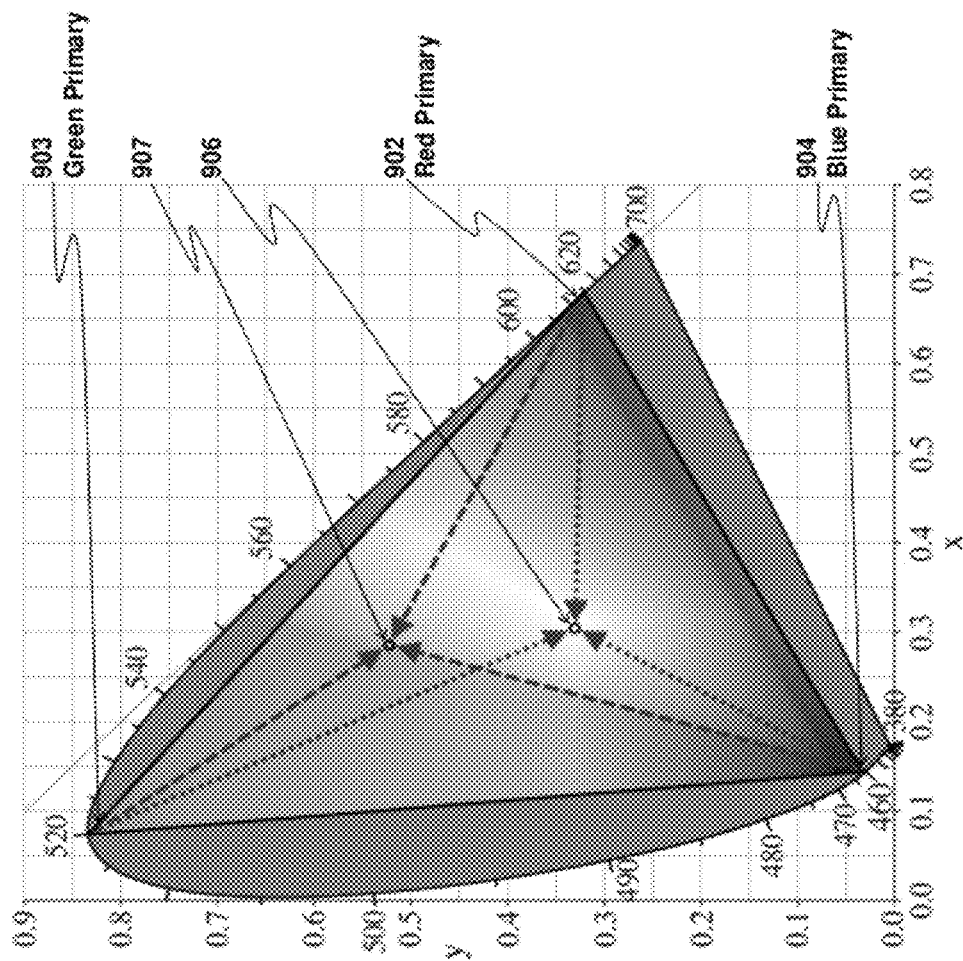
FIG. 14B illustrates the synthesize of exemplary pixels using the Quantum Photonic imager device of this invention.

FIG. 14B illustrates the result of the matrix transformation defined by Equation (6) to define the components of the source image pixel $[R_{QPI}, G_{QPI}, B_{QPI}]$ of two exemplary pixels 906 and 907 with respect to the Quantum Photonic Imager device 200 native color gamut 305 defined by the vertices 902, 903 and 904. As illustrated in FIG. 14B, the values $[R_{QPI}, G_{QPI}, B_{QPI}]$ could span the entire color gamut 305, enabling the Quantum Photonic Imager device 200 to synthesize the pixels [R,G,B] values of a source image that have a much wider color gamut than that offered by the NTSC 308 and the HDTV 309 color gamut (FIG. 14A). As wider color gamut standards and wide-gamut digital image and video input content becomes available, digital projectors 800 that use the Quantum Photonic Imager 200 of this invention would be poised to project source images and video content in such wide-gamut format. In the interim, the wide-gamut capabilities of the Quantum Photonic Imager 200 would allow it to synthesize digital image and video inputs with the existing color gamut (such as NTSC 308 and the HDTV 309 color gamut) at an even lower power consumption than the exemplary values cited in an earlier paragraph.

The [R, G, B] values of every pixel in the source image would be mapped (converted) to the native color gamut 305 (color space) of the Quantum Photonic Imager device 200 using the transformation defined by Equation (6). Without loss of generality, in assuming that the white point of the source image has an [R,G,B]=[1, 1, 1], a condition which can always be met by dividing [R,G,B] values of every pixel in the source image by the white point's [R,G,B] value, the result of the transformation defined by Equation (6) for each of the source image pixels would be a vector $[R_{QPI}, G_{QPI}, B_{QPI}]$ with values ranging between [0, 0, 0] for black and [1, 1, 1] for white. The above representation has the benefit that the distances within the reference color space, such as CIE XYZ color space for example, between the pixel's and the color primaries 902, 903 and 904 of the native gamut 305 of the Quantum Photonic Imager device 200 defined by the values $[R_{QPI}, G_{QPI}, B_{QPI}]$ would also define the on/off duty cycles values for its respective red, green, and blue laser diodes 231, 232, and 233:

$$\lambda_R = R_{QPI}$$

$$\lambda_G = G_{QPI}$$

$$\lambda_B = B_{QPI} \quad (7)$$

Where $\lambda_R$, $\lambda_G$, and $\lambda_B$ denote the on/off duty cycles of the respective pixel 230 of the Quantum Photonic Imager device 200 red, green, and blue laser diodes 231, 232, and 233; respectively, required to synthesize [R,G,B] values of each of the pixels comprising the source image.

Typical source image data input, whether static images or dynamic video images, would be comprised of image frames which are inputted at a frame rate, for example either 60 Hz or 120 Hz. For a given source image frame rate, the on-time of the respective pixel 230 of the Quantum Photonic Imager device 200 red, green, and blue laser diodes 231, 232, and 233; respectively, required to synthesize the [R,G,B] values of source image pixel would be the fraction of the frame duration defined by the values $\lambda_R$, $\lambda_G$, and $\lambda_B$.

In order to account for possible pixel-to-pixel brightness variations that could result from possible variations in the semiconductor material characteristics comprising the photonic semiconductor structure 210, during testing of the Quantum Photonic Imager device 200 which would typically occur at the completion of the device fabrication steps described earlier, the device luminance profile would be measured and a brightness uniformity weighting factor would be calculated for each pixel. The brightness uniformity weighting factors would be stored as a look-up-table (LUT) and applied by the Quantum Photonic Imager device 200 companion image data processor 850. When these brightness uniformity weighting factors are taken into account, the on-time for each of the pixel 230 of the Quantum Photonic Imager device 200 would be given by:

$$\Lambda_R = K_R \lambda_R$$

$$\Lambda_G = K_G \lambda_G$$

$$\Lambda_B = K_B \lambda_B \qquad (8)$$

Where $K_R$, $K_G$ and $K_B$ are the brightness uniformity weighting factors for each of the Quantum Photonic Imager device 200 pixel's red, green, and blue laser diodes 231, 232, and 233; respectively.

The on-time values of the red, green, and blue laser diodes 231, 232, and 233 of each of the pixels 230 comprising the Quantum Photonic Imager device 200 expressed by Equation (8) would be converted into serial bit streams using conventional pulse width modulation (PWM) techniques and inputted to the Quantum Photonic Imager device 200 at the frame rate of the source image together with the pixel address (row and column address of the respective pixel within the array of pixels comprising the Quantum Photonic Imager device 200) and the appropriate synchronization clock signals.

Figure 15A:
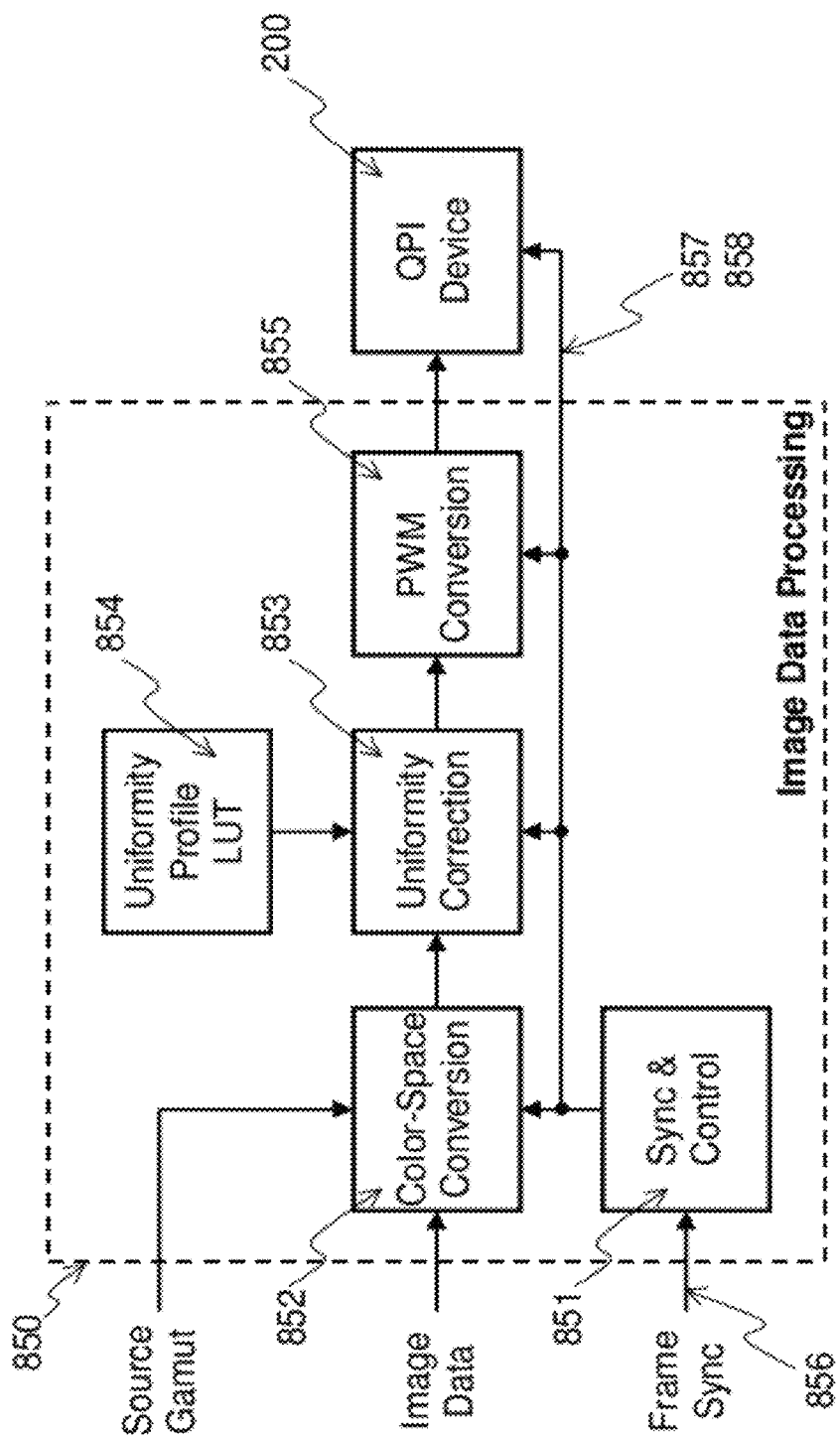
FIG. 15A illustrates a block diagram of the image data processor companion device of the Quantum Photonic Imager device of this invention.
Figure 15B:
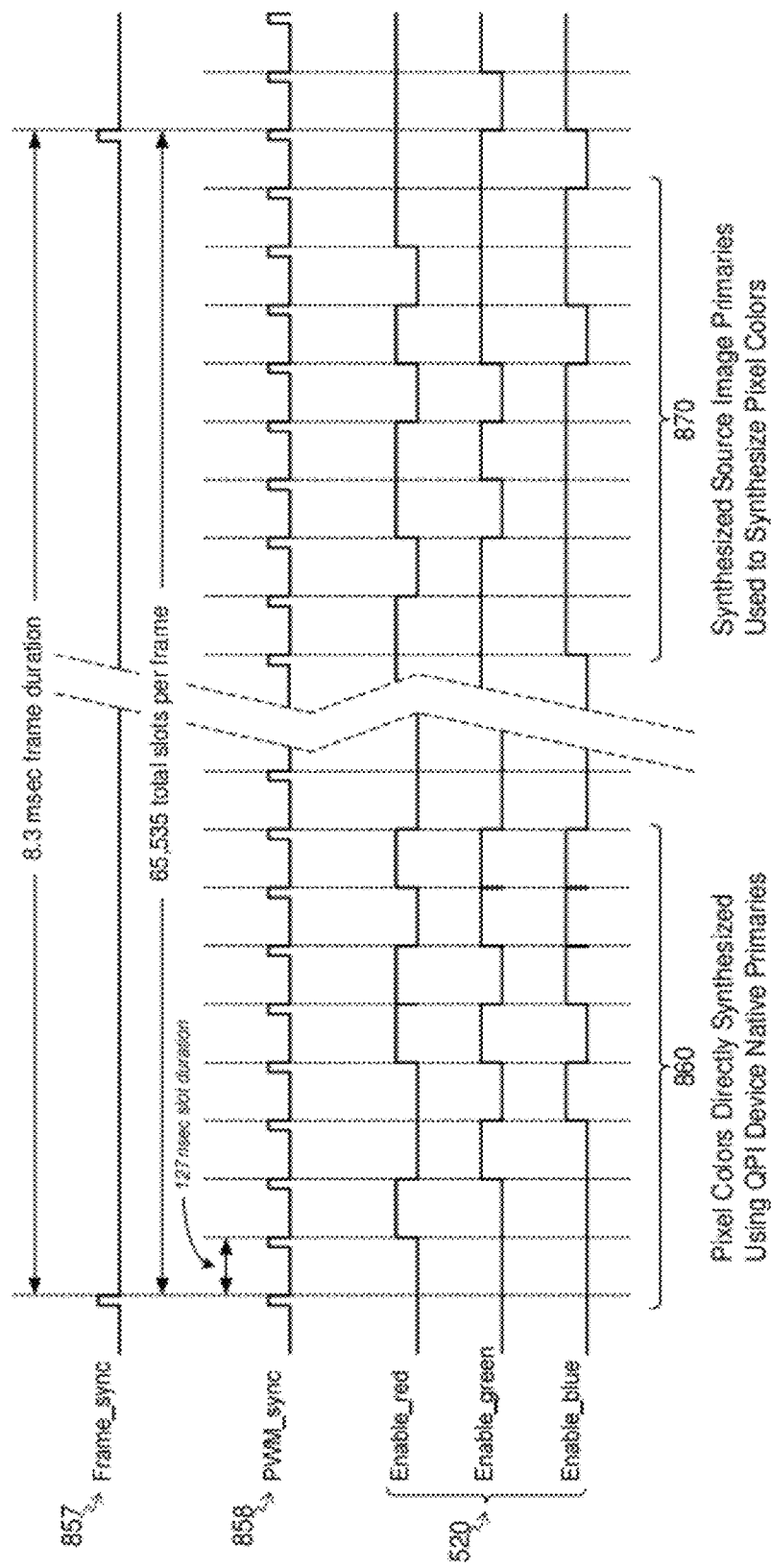
FIG. 15B illustrates the Quantum Photonic Imager device timing diagram.

The conversion of the image source data into the input signals required by the Quantum Photonic Imager device 200 would be performed by the companion image data processor 850 in accordance with Equations (6) through (8). FIG. 15A and FIG. 15B illustrate a block diagram of the Quantum Photonic image data processor 850 and the timing diagram associated with its interface with the Quantum Photonic Imager device 200; respectively. Referring to FIG. 15A and FIG. 15B, the SYNC & Control block 851 would accept the frame synchronization input signal 856 associated with the source image or video input and generate the frame processing clock signal 857 and the PWM clock 858. The PWM clock 858 rate would be dictated by the frame rate and word length of the source image or video input. The PWM clock 858 rate illustrated in FIG. 15B reflects an exemplary embodiment of the Quantum Photonic Imager 200 and companion Image Data Processor 850 operating at a frame rate of 120 Hz and word length of 16-bit. A person skilled in the art would know how to use the teachings of this invention to make the Quantum Photonic Imager 200 and its companion Image data Processor 850 support source image or video inputs having frame rates and word lengths that differ from those reflected in FIG. 15B.

In synchronism with the frame clock signal 857, the Color-Space Conversion block 852 would receive each frame of the source image or video data, and using the source input gamut coordinates, would perform the digital processing defined by Equations (6) to map each of the source input pixel [R,G,B] values to the pixel coordinate values [$R_{QPI}$, $G_{QPI}$, $B_{QPI}$]. Using the white-point coordinates of the source image or video data input, the Color-Space Conversion block 852 would then convert each of the pixel values [$R_{QPI}$, $G_{QPI}$, $B_{QPI}$] using Equation (7) to the on/off duty cycle values $\lambda_R$, $\lambda_G$, and $\lambda_B$ of the red, green, and blue laser diodes 231, 232, and 233, respectively, of the corresponding pixel 230 of Quantum Photonic Imager 200.

The values $\lambda_R$, $\lambda_G$, and $\lambda_B$ would then be used by the Uniformity Correction block 853 in conjunction with the pixel brightness weighting factor $K_R$, $K_G$ and $K_B$ stored in the Uniformity Profile LUT 854 to generate the uniformity corrected on-time values [$\Lambda_R$, $\Lambda_G$, $\Lambda_B$] for each of the pixels 230 of the Quantum Photonic Imager 200 using equation (8).

The values [$\Lambda_R$, $\Lambda_G$, $\Lambda_s$] generated by the Uniformity Correction block 853, which would typically be expressed in three 16-bit words for each pixel, are then converted by the PWM Conversion block 855 into a three serial bit streams that would be provided to the Quantum Photonic Imager 200 in synchronism with the PWM clock. The three PWM serial bit streams generated by the PWM Conversion block 855 for each of the pixels 230 would provide the Quantum Photonic Imager device 200 with 3-bit words, each of which define the on-off state of the pixel's light generating red, green and blue laser diodes 231, 232, and 233 within the duration of the PWM clock signal 858. The 3-bit word generated by the PWM Conversion block 855 would be loaded into the appropriate pixel address of the digital semiconductor structure 220 of the Quantum Photonic Imager device 200 and would be used, as explained earlier, to turn on or off the respective pixel's red, green and blue laser diodes 231, 232, and 233 within the duration defined by the PWM clock signal 858.

In the preceding exemplary embodiment of the operation of the Quantum Photonic Imager device 200 of this invention, the source image pixels color and brightness specified by the pixel [R, G, B] values would be directly synthesized for each individual pixel in the source image using the color primaries 902, 903 and 904 of the native gamut 305 of the Quantum Photonic Imager device 200. Because the individual pixel brightness and color are directly synthesized, this operational mode of the Quantum Photonic Imager device 200 is referred to as Direct-Color Synthesize Mode. In an alternative exemplary embodiment of the operation of the Quantum Photonic Imager device 200 the color primaries of the source image color gamut are first synthesized using the color primaries 902, 903 and 904 of the native gamut 305 of the Quantum Photonic Imager device 200 and the pixel color and brightness are then synthesized using the synthesized color primaries of the source image color gamut. In this operational mode of the Quantum Photonic Imager device 200, the pixel's red, green and blue laser diodes 231, 232, and 233 collectively would sequentially synthesize the RGB color primaries of the source image. This would be accomplished by dividing the frame duration into three segments whereby each segment would be dedicated for generating one of the color primaries of the source image and having the default values (white-point) of each of the pixel's red, green and blue laser diodes 231, 232, and 233 reflect the coordinates of one of the source image color primaries in each of the frame segments sequentially. The duration of the frame dedicated to each color primary segment and the relative on-time values of the pixel's red, green and blue laser diodes 231, 232, and 233 during that segment would be selected based on the required white-point color temperature. Because the individual pixel brightness and color are sequentially synthesized, this operational mode of the Quantum Photonic Imager device 200 is referred to as Sequential-Color Synthesize Mode.

In the Sequential-Color Synthesize Mode of the Quantum Photonic Imager device 200, the total number of PWM clock cycles within the frame would be apportioned into three color primaries sub-frames, with one sub-frame dedicated to the R-primary, the second dedicated for the G-primary and the third dedicated for the B-primary of the source image gamut. The on-time of each the Quantum Photonic Imager device 200 pixel's red, green and blue laser diodes 231, 232, and 233 during the R-primary sub-frame, G-primary sub-frame and the B-primary sub-frame would be determined based on the distances within the reference color space between the source image color primaries and the color primaries of the Quantum Photonic Imager device 200 native color gamut. These on-time values would then be modulated sequentially with [R, G, and B] values of the respective pixel of the source image.

The difference between Direct-Color Synthesize mode and Sequential-Color Synthesize mode of the Quantum Photonic Imager device 200 is illustrated in FIG. 15B which shows the enable signal that would be provided to the pixel's red, green and blue laser diodes 231, 232, and 233 in each case. The sequence of enable signals 860 illustrate the operation of the pixel's red, green and blue laser diodes 231, 232, and 233 in the Direct-Color Synthesize mode where the pixel's luma and chroma components of the source image pixels would be directly synthesized by controlling the on/off duty cycle and simultaneity of the corresponding pixel's red, green and blue laser diodes 231, 232, and 233. The sequence of enable signals 870 illustrate the operation of the pixel's red, green and blue laser diodes 231, 232, and 233 in the Sequential-Color Synthesize mode where the primaries of the source image gamut would be synthesized using the color primaries 902, 903 and 904 of the native gamut 305 and luma and chroma components of the source image pixels would be synthesized sequentially using the synthesized primaries of the source image gamut.

The Direct-Color Synthesize mode and Sequential-Color Synthesize mode of the Quantum Photonic Imager device 200 would differ in terms of the achieved operating efficiency of the device as they would tend to require different peak-to-average power driving conditions to achieve comparable level image brightness. However in both operational modes the Quantum Photonic Imager device 200 of this invention would be able to support comparable source image frame rate and [R, G, B] word length.

QPI Dynamic Range, Response Time, Contrast and Black Level

The dynamic range capability of the Quantum Photonic Imager device 200 (defined as the total number of grayscale levels that can be generated in the synthesize for each of the source image pixels) would be determined by the smallest value of PWM clock duration that can be supported, which in turn would be determined by the on-off switching time of the pixel's red, green and blue laser diodes 231, 232, and 233. The exemplary embodiment of the photonic semiconductor structure 210 (FIG. 2A) described in the preceding paragraphs would achieve on-off switching time that is a fraction of a nanosecond in duration, making the Quantum Photonic Imager device 200 able to readily achieve a dynamic range of 16-bit. For comparison, most currently available display systems operate at 8-bit dynamic. Furthermore, the on-off switching time of a fraction of a nanosecond in duration that can be achieved by the photonic semiconductor structure 210 would also enable of the Quantum Photonic Imager device 200 to achieve a response time that is a fraction of a nanosecond in duration. For comparison, the response time that can be achieved by LCoS and HTPS type imagers is typically in the order of 4 to 6 milliseconds and that of the micro mirror type imager is typically in the order of one microsecond. The imager response time plays a critical role in the quality of the image that can be generated by the display system, in particular for generating video images. The relatively slow response time of the LCoS and HTPS type imagers would tend to create undesirable artifacts in the generated video image.

The quality of a digital display is also measured by the contrast and black level it can generate, with the contrast being a measure of the relative levels of white and black regions within the image and black level being the maximum black that can be achieved in response to a black filed input. Both the contrast and the black level of a display are significantly degraded in existing projection displays that use imagers such as micro mirror, LCoS or HTPS imager because of the significant levels of photonic leakage associated with such imagers. The high photonic leakage typical to these types of imager is caused by light leaking from the on-state of the imager pixel onto its off-state, thus causing the contrast and black levels to degrade. This effect is more pronounced when such imagers are operated in a color sequential mode. In comparison the Quantum Photonic Imager device 200 would have no photonic leakage since its pixel's red, green and blue laser diodes 231, 232, and 233 on-state and off-states are substantially mutually exclusive making, the contrast and black levels that can be achieved by the Quantum Photonic Imager device 200 orders of magnitude superior to what can be achieved by micro mirror, LCoS or HTPS imagers.

In summary, the Quantum Photonic Imager device 200 of the present invention overcomes the weaknesses of other imagers plus exhibits the following several advantages:

1. It requires low power consumption because of its high efficiency;

2. It reduces the overall size and substantially reduces the cost of the projection system because it requires simpler projection optics and does not require complex illumination optics;

3. It offers extended color gamut making it is able to support the wide-gamut requirements of the next generation display systems; and 4. It offers fast response time, extended dynamic range, plus high contrast and black levels, which collectively would substantially improve the quality of the displayed image.

In the forgoing detailed description, the present invention has been described with reference to specific embodiments thereof. It will, however, be evident that various modifications and changes can be made thereto without departing from the broader spirit and scope of the invention. The design details and drawings are, accordingly, to be regarded in an illustrative rather than a restrictive sense. Skilled persons will recognize that portions of this invention may be implemented differently than the implementation described above for the preferred embodiment. For example, skilled persons will appreciate that the Quantum Photonic Imager device 200 of this invention can be implemented with numerous variations to the number of multilayer laser diodes comprising the photonic semiconductor structure 210, the specific design details of the multilayer laser diodes 250, 260 and 270, the specific design details of the vertical waveguides 290, specific design details associated with the selection of the specific pattern of the pixel's vertical waveguides 290, the specific details of the semiconductor fabrication procedure, the specific design details of the projector 800, the specific design details of the companion Image Data Processor device 850, the specific design details of the digital control and processing required for coupling the image data input to the Quantum Photonic device 200, and the specific design details associated with the selected operational mode of the chip-set comprising the Quantum Photonic Imager 200 and its companion Image Data Processor 850. Skilled persons will further recognize that many changes may be made to the details of the aforementioned embodiments of this invention without departing from the underlying principles and teachings thereof. The scope of the present invention should, therefore, be determined only by the following claims.

What is claimed is:

1. An emissive multicolor digital image forming (imager) device comprising;

a two dimensional array of multicolor light emitting pixels whereby each multicolor light emitting pixel comprises:

a plurality of light emitting diode semiconductor structures, each for emitting a different color, stacked vertically with a grid of vertical sidewalls electrically and optically separating each multicolor pixel from adjacent multicolor pixels within the array of multicolor pixels; and a plurality of vertical waveguides optically coupled to the light emitting diode semiconductor structures to vertically emit light generated by the light emitting diode semiconductor structures from a first surface of the stack of diode semiconductor structures;

the stack of light emitting diode semiconductor structures being stacked onto a digital semiconductor structure by a second surface opposite the first surface of the stack of light emitting diode semiconductor structures; and a plurality of digital semiconductor circuits in the digital semiconductor structure, each electrically coupled to receive control signals from the periphery of the digital semiconductor structure and electrically coupled to the multicolor light emitting diode semiconductor structures by vertical interconnects to separately control the on/off states of each of the multicolor light emitting diode semiconductor structures.

2. The device of claim 1 wherein each light emitting diode semiconductor structure has a metal layer on the top and bottom thereof, the metal layers on adjacent light emitting diode semiconductor structures being separated by an insulation layer between the respective metal layers.

3. The device of claim 2 wherein the metal layers provide positive and negative contacts with each of the stacked light emitting diode semiconductor structures.

4. The device of claim 3 further comprising a patterned interconnect layer of metal isolated from the metal layers with a patterned insulation layer and connected to the vertical interconnects to provide contact pads for interconnecting the digital semiconductor structure with each of the light emitting diode semiconductor structures in the two dimensional array of multicolor light emitting pixels.

5. The device of claim 4 wherein each light emitting diode semiconductor structure is separately addressable through the contact pads.

6. The device of claim 1 wherein each light emitting diode semiconductor structure comprises an active region and an optical confinement region, the active region of each light emitting diode semiconductor structure being comprised of multiple semiconductor layers of $Al_xIn_{1-x}P$, $Ga_xIn_{1-x}P$ or $In_xGa_{1-x}N$, and forming multiple quantum wells, multiple quantum wires or multiple quantum dots.

7. The device of claim 6 wherein the composition of the semiconductor layers enable each of the light emitting diode semiconductor structures to generate light with a wavelength within the range of visible light including 430-nm to 650-nm.

8. The device of claim 6 wherein the composition of the semiconductor layers enable each multicolor light emitting pixel to emit multiple color primaries of a native color gamut, including red, yellow, green, cyan and blue wavelengths.

9. The device of claim 6 wherein the vertical waveguides are optically coupled to each of the optical confinement regions of the light emitting diode semiconductor structures.

10. The device of claim 1 wherein the vertical waveguides are comprised of a core and a multilayer cladding, the core being either filled with dielectric material or is air-filled.

11. The device of claim 10 wherein each light emitting diode semiconductor structure comprises an active region and an optical confinement region, the multilayer cladding being comprised of an outer cladding layer of dielectric material and an inner thin cladding layer of reflective metallic material, the thickness of the inner thin cladding material being selected to allow a portion of the light generated by the active regions of the light emitting diode semiconductor structures and confined within the confinement regions to be evanescence field coupled into the cores of the vertical waveguides and emitted vertically from the surface of the two dimensional array.

12. The device of claim 10 wherein each light emitting diode semiconductor structure comprises an active region and an optical confinement region, the multilayer cladding being comprised of multiple thin layers of dielectric material, the refractive indices of the core and the multiple thin cladding layers and the thickness of the multiple cladding layers being selected to allow a portion the light generated by the active regions and confined within the confinement regions to be coupled into the cores of the vertical waveguides and be index guided and emitted vertically from the surface of the two dimensional array.

13. The device of claim 10 wherein each light emitting diode semiconductor structure comprises an active region and an optical confinement region, the multilayer cladding comprising a thin layer of nonlinear optical material having its thickness and linear and nonlinear refractive indices selected to cause the coupling of the light generated by the active regions and confined within the confinement regions to be either inhibited or enabled as the refractive index of the thin nonlinear cladding layer changes in response to the changes in the intensity of the light being confined within the confinement regions, thereby causing the light being coupled into and index guided by the vertical waveguides and emitted vertically from the surface of the two dimensional array to occur in short pluses separated by short intervals.

14. The device of claim 1 wherein each light emitting diode semiconductor structure comprises an active region and an optical confinement region, each vertical waveguide having a circular cross section with an index guiding diameter at the center of the coupling region within each of the confinement regions of the light emitting diode semiconductor structures equal to the wavelength of the light generated by the respective active region.

15. The device of claim 1 wherein each light emitting diode semiconductor structure comprises an active region and an optical confinement region, and wherein for each light emitting diode semiconductor structure, at least one vertical waveguide extends from the first surface of the stack of light emitting diode semiconductor structures and terminates at the end of the optical confinement region of that light emitting diode semiconductor structure.

16. The device of claim 1 wherein the vertical waveguides are arranged in a pattern selected to reduce the maximum divergence angle of the light emitted from the surface of the two dimensional array.

17. The device of claim 1 wherein the vertical waveguides are spaced within the pixel surface area to provide uniform brightness across each pixel area and provided in number to maximize pixel brightness.

18. The device of claim 1 wherein the light emitting diode semiconductor structures comprise:
multiple semiconductor layers of one or more of the following semiconductors alloy materials:
$Al_xIn_{1-x}P$, $(Al_xGa_{1-x})_yIn_{1-y}P$, $Ga_xIn_{1-x}P$, $Al_xGa_{1-x}N$, $Al_xGa_{1-x}N/GaN$, $In_xGa_{1-x}N$, GaN;
each formed on a separate wafer over a thick substrate layer of either GaAs, GaN or InGaN;
each including an n-type etch-stop layer and a p-type contact layer of the same respective semiconductor substrate layer material type;

each comprising n-type and p-type waveguide layers and cladding layers that define their respective optical confinement regions;

each having at least one quantum well surrounded by two barrier layers that define their respective active regions; and each comprising an electron blocker layer embedded either within their respective p-type waveguide layers or between their respective p-type waveguide and cladding layers.

19. The device of claim 1 wherein the digital semiconductor structure is responsive to serial bit streams that are serial representations of multiple bit words that each define a color component and brightness of respective pixels to convert a source digital image data input into an optical image whereby each of the multicolor pixels emits light having color and brightness that reflects the color and brightness values represented by source digital image input data of the respective pixel.

20. The device of claim 1 further comprising a companion device to receive image source data and convert the image source data into the on-off duty cycle values of light emitting diodes comprising each of the pixels of the emissive multicolor digital image forming device, the companion device including:
a color-space conversion block;
a uniformity correction block, including a weighting factor look-up table;
a pulse-width modulation conversion block; and
a synchronization and control block;
the weighting factor look-up table storing brightness uniformity weighting factors for each color of each pixel determined by a device-level test in which brightness of the pixel array comprising an emissive aperture is measured and a brightness uniformity weighting factor is calculated for each light color for each pixel.

21. The device of claim 20 wherein the device is configured to receive serial data streams for each color light emitting diode and control signals for on-off duty cycle control of each light emitting diode in the array of stacked light emitting diode semiconductor structures, the companion device being configured to provide serial data streams for each color light emitting diode and control signals for on-off duty cycle control of each light emitting diode in the array of stacked light emitting diode semiconductor structures.

22. The device of claim 1 wherein each two dimensional array of multicolor light emitting pixels is cut from a wafer of multiple two dimensional arrays of multicolor light emitting pixels, and each digital semiconductor structure is cut from a wafer of multiple digital semiconductor structures, each two dimensional array of multicolor light emitting pixels being die-level bonded to a respective digital semiconductor structure.

23. An emissive digital image forming (imager) device comprising;
a two dimensional array of light emitting pixels on a first semiconductor substrate, the light emitting pixels being separated by a grid of vertical sidewalls electrically and optically separating the light emitting pixels:
the first semiconductor substrate being stacked onto a digital semiconductor structure by a second surface opposite the first surface of the first semiconductor substrate; and
a plurality of digital semiconductor circuits in the digital semiconductor structure, each electrically coupled to receive control signals and electrically coupled to the light emitting pixels on the first semiconductor substrate to separately control the on/off states of each of the light emitting pixels.

24. The device of claim 23 wherein each light emitting pixel comprises a diode that emits light.

* * * * *